(12) United States Patent  (10) Patent No.: US 7,126,419 B2
Miyasita  (45) Date of Patent: Oct. 24, 2006

(54) ANALOG SUMMING AND DIFFERENCING CIRCUIT, OPTICAL RECEIVING CIRCUIT, OPTICAL TRANSMITTING CIRCUIT, AUTOMATIC GAIN CONTROL AMPLIFIER, AUTOMATIC FREQUENCY COMPENSATION AMPLIFIER, AND LIMITING AMPLIFIER

(75) Inventor: Tokio Miyasita, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 448 days.

(21) Appl. No.: 10/339,457

(22) Filed: Jan. 10, 2003

(65) Prior Publication Data

US 2003/0174023 A1  Sep. 18, 2003

(30) Foreign Application Priority Data

Mar. 12, 2002 (JP) ............................. 2002-066536

(51) Int. Cl.
*H03F 3/45* (2006.01)
(52) U.S. Cl. .......................................... 330/69; 330/9
(58) Field of Classification Search ................ 330/69, 330/9
See application file for complete search history.

(56) References Cited

U.S. PATENT DOCUMENTS

| | | | |
|---|---|---|---|
| 4,506,149 A * | 3/1985 | Utsumi | ....................... 250/202 |
| 5,612,810 A | 3/1997 | Inami et al. | |
| 5,875,049 A | 2/1999 | Asano et al. | |
| 5,892,609 A | 4/1999 | Saruwatari | |
| 5,963,516 A * | 10/1999 | Hashimoto et al. | ...... 369/44.29 |
| 6,134,198 A * | 10/2000 | Yamamoto et al. | ...... 369/44.35 |
| 6,151,150 A | 11/2000 | Kikuchi | |
| 6,335,948 B1 * | 1/2002 | Kikuchi | ....................... 375/229 |
| 6,545,958 B1 * | 4/2003 | Hirai et al. | .............. 369/44.32 |

FOREIGN PATENT DOCUMENTS

| | | |
|---|---|---|
| JP | 61263305 A | 11/1986 |
| JP | 01051711 A | 2/1989 |
| JP | 08-084160 | 3/1996 |
| JP | 09-289495 | 11/1997 |
| JP | 10-084231 | 3/1998 |
| JP | 2000188573 A | 7/2000 |
| JP | 2000332558 A | 11/2000 |

* cited by examiner

*Primary Examiner*—Patricia Nguyen
(74) *Attorney, Agent, or Firm*—Volentine Francos & Whitt, PLLC

(57) ABSTRACT

An analog circuit includes a pair of peak-hold circuits that generate peak signals indicating the peak values of a differential pair of input signals, a first differencing circuit such as a transconductance amplifier that takes the difference between the input signal values, a second differencing circuit such as a transconductance amplifier that takes the difference between the two peak signal values, and a combining circuit such as a resistor circuit that additively combines the outputs of the differencing circuits in such a way as to compensate for direct-current offset in the input signals. Advantages of this circuit structure include reduced power consumption and simplified implementation in an integrated circuit. Low pass filters, capacitor discharging circuits, and unbalanced circuit elements can be used to obtain further advantages.

21 Claims, 56 Drawing Sheets

AMI CODE

CMI CODE

MANCHESTER CODE

C-Amp

RESIDUAL OFFSET

ANALOG SUMMING AND DIFFERENCING CIRCUIT, OPTICAL RECEIVING CIRCUIT, OPTICAL TRANSMITTING CIRCUIT, AUTOMATIC GAIN CONTROL AMPLIFIER, AUTOMATIC FREQUENCY COMPENSATION AMPLIFIER, AND LIMITING AMPLIFIER

BACKGROUND OF THE INVENTION

1. Field of the Invention

The present invention relates to circuits used in communication equipment such as optical communication equipment and mobile communication equipment. These circuits include an optical receiving circuit, an optical transmitting circuit, an automatic gain control amplifier circuit, an automatic frequency compensation amplifier circuit, and a limiting amplifier circuit used for clock recovery. The invention relates in particular to an analog summing and differencing circuit used in a main amplifier and level discrimination circuit in the optical receiving circuit, in the part of the optical transmitting circuit that detects light emitted for monitoring purposes, in the amplitude-detecting part of the automatic gain control amplifier circuit and automatic frequency compensation amplifier circuit, and in a limiting amplifier, limit comparator, and offset compensator in the limiting amplifier circuit.

2. Description of the Related Art

As shown in FIG. 1, an optical receiving circuit includes a photodetector (PD), a preamplifier (P-Amp), n main amplifiers (M-Amp), where n is an integer equal to or greater than one, and a level discrimination circuit (L-Dis). The photodetector PD is reverse-biased by a voltage Vbias, and converts a received optical signal to a current signal Ip. The preamplifier converts the current signal Ip to a pair of differential voltages VAp, VAn. VAp is sometimes referred to as the non-inverting phase or positive phase, and VAn as the inverting phase, opposite phase, or negative phase, but the simpler terms positive voltage and negative voltage will be used for brevity below, with the understanding that they are merely convenient names and do not imply positive or negative algebraic values.

The n main amplifiers compensate for the direct-current (dc) offset of the differential voltages VAp, VAn, and amplify these voltages in n stages to a differential voltage level sufficient to drive the level discrimination circuit. The level discrimination circuit converts the final amplified differential voltages VCp(n), VCn(n) to a positive logic signal Qp and a negative logic signal Qn. The main amplifiers are described in, for example, U.S. Pat. Nos. 5,612,810, 5,875,049, and 5,892,609 (and corresponding Japanese Unexamined Patent Application Publications No. 08-84160, 09-289495, and 10-84231).

FIG. 49 shows the general structure of the main amplifier described in U.S. Pat. No. 5,612,810. This main amplifier includes an offset compensator 101a comprising an analog summing and differencing circuit (SUM/DIF CKT), and a differential amplifier Amp1. The offset compensator 101a includes a pair of peak-hold circuits PH1, PH2 and a pair of adders ADD1, ADD2. The adders ADD1, ADD2 constitute the summing and differencing part of the circuit. FIGS. 50 and 51 shows specific examples of the circuit configuration of the offset compensator 101a in FIG. 49.

In FIG. 49, peak-hold circuit PH1 senses the peak of the negative differential output voltage VAn of the preamplifier (cf. FIG. 1) and outputs a negative peak value VAnp; peak-hold circuit PH2 senses the peak of the positive differential output voltage VAp of the preamplifier and outputs a positive peak value VApp. Adder ADD1 outputs an offset-compensated positive differential voltage VBp by adding the positive differential voltage VAp and negative peak value VAnp; adder ADD2 outputs an offset-compensated negative differential voltage VBn by adding the negative differential voltage VAn and positive peak value VApp. The differential amplifier Amp1 amplifies the offset-compensated differential voltages VBp, VBn, and outputs a positive differential voltage VCp and a negative differential voltage VCn.

In the analog summing and differencing circuit in FIG. 50, adder ADD1 adds differential voltage VAp and peak value VAnp through a pair of summing resistors R2, R1 and outputs an offset-compensated positive differential voltage VBp; adder ADD2 adds differential voltage VAn and peak value VApp through a pair of summing resistors R3, R4 and outputs an offset-compensated negative differential voltage VBn.

If the resistance values of the summing resistors R1–R4 in FIG. 50 are related so that R1=R2 and R3=R4, the differential voltages VBp, VBn are given by the equations below.

$$VBp=(VAnp+VAp)/2,\ VBn=(VAn+VApp)/2 \qquad (1)$$

Accordingly, the adders ADD1, ADD2 can also be regarded as averaging circuits. Differencing is performed by supplying the outputs of adders ADD1, ADD2 to the differential inputs of the next-stage differential amplifier Amp1.

The analog summing and differencing circuit in FIG. 51 includes a balanced negative feedback amplifier Amp2 with a feedback resistor R5 connected between its inverting output and non-inverting input, and another feedback resistor R6 connected between its non-inverting output and inverting input. The positive differential voltage VAp and negative peak value VAnp are added through summing resistors R2, R1, and their sum becomes the non-inverting input of amplifier Amp2; the negative differential voltage VAn and positive peak value VApp are added through summing resistors R3, R4, and their sum becomes the inverting input of amplifier Amp2. The inverting output and non-inverting output of amplifier Amp2 are output as an offset-compensated positive differential voltage VBp and negative differential voltage VBn. The analog summing and differencing circuit in FIG. 51 replaces the adders ADD1, ADD2 in FIG. 49. Subtraction is performed by input to the differential input terminals of differential amplifier Amp1.

The main amplifier in FIG. 49 does not use negative feedback to compensate for offset, and is not affected by the relative rate of occurrence of '1' and '0' values, but can compensate for the differential dc offset voltage generated in the preamplifier, so stable operation and high gain can be obtained, even in a multistage configuration in which the last stage or stages perform a limiting operation.

In the main amplifier in FIG. 49, differential voltages VBp, VBn are related as indicated in the equation below.

$$VBp-VBn=K((VAp+VAnp)-(VAn+VApp)) \qquad (2)$$

K in equation (2) is the gain (or attenuation ratio) in the analog summing and differencing circuit. The first term on the right indicates the value of VBp, the peak of which is the sum of the peak of pulse signal VAp and the peak-hold value VAnp (the peak value of pulse signal VAn). The second term on the right indicates the value of VBn, the peak of which is the sum of the peak of pulse signal VAn and the peak-hold value VApp (the peak value of pulse signal VAp). Subtraction of VBn from VBp means that these signals become differential inputs. The respective peak values of VBp and VBn are both equal to the sum of the peak values of the pulse signals VAp, VAn. Furthermore, since VAp and VAn are differential signals with identical amplitude, the amplitude values of VBp and VBn are identical. VBp and VBn therefore have the same peak value and amplitude, but are reversed in phase. Accordingly, VBp and VBn are offset-compensated differential signals.

FIG. 52 shows the general structure of the main amplifier described in U.S. Pat. No. 5,892,609. The reference voltage generator (REF-VOLTAGE-GEN) in this main amplifier has the same output dc voltage bias as the preamplifier (cf. FIG. 1). Input of the pair of peak-hold outputs VApp, VAnp to a differential input amplifier Amp2 with gain 0.5 produces a voltage VM in which one-half of the voltage offset of the differential voltages VAp, VAn is added to the output dc voltage bias, (corresponding to the median amplitude of the positive differential output VAp). This voltage VM then becomes a reference voltage VBn for the positive differential voltage VAp.

FIGS. 53 and 55 show the general structure of two main amplifiers described in U.S. Pat. No. 5,892,609, using like reference characters to indicate like elements. FIG. 54 shows a specific example of the circuit configuration of the offset compensator 101b in FIG. 53, comprising resistors R1–R6, bipolar transistors Q1–Q4, and constant-current sources Is1, Is2.

The main amplifiers in FIGS. 53 and 55 input an appropriate combination of the differential voltages VAp, VAn and peak-hold voltages VApp, VAnp to an amplifier with differential inputs and a wide input range (where widening the input range lowers the gain).

The main amplifier in FIG. 53 includes an offset compensator 101b comprising an analog summing and differencing circuit, and a differential amplifier Amp1. The offset compensator 101b includes a pair of peak-hold circuits PH1, PH2, a pair of amplifiers Gm1, Gm2 with differential voltage input and differential current output, and a pair of resistors R1, R2. The amplifiers Gm1, Gm2 and resistors R1, R2 constitute the summing and differencing part of the circuit.

Peak-hold circuit PH1 senses the peak of the negative differential voltage VAn from a preamplifier (cf. FIG. 1) and outputs a negative peak value VAnp; peak-hold circuit PH2 senses the peak of the positive differential voltage VAp from the preamplifier and outputs a positive peak value VApp. Amplifier Gm1 receives the positive differential voltage VAp from the preamplifier as its non-inverting input and the output VApp of peak-hold circuit PH2 as its inverting input, and outputs a positive differential current Io1p and negative differential current Io1n according to the differential input voltages VAp, VApp. Amplifier Gm2 receives the output VAnp of peak-hold circuit PH1 as its non-inverting input and the negative differential voltage VAn from the preamplifier as its inverting input, and outputs a positive differential current Io2p and negative differential current Io2n according to the differential input voltages VAnp, VAn. Resistor R1 converts the sum of the positive differential currents Io1p and Io2p to a positive output voltage VBp. Resistor R2 converts the sum of the negative differential currents Io1n and Io2n to a negative output voltage VBn. The differential amplifier Amp1 amplifies the offset-compensated positive output voltage VBp and negative output voltage VBn, and outputs a positive differential voltage VCp and a negative differential voltage VCn.

The main amplifier in FIG. 55 includes an offset compensator 101c comprising an analog summing and differencing circuit, and a differential amplifier Amp1. The offset compensator. 101c includes a pair of peak-hold circuits PH1, PH2, and a pair of amplifiers Din1, Din2 with differential voltage input and single-ended voltage output. The amplifiers Din1, Din2 constitute the summing and differencing part of the circuit.

Amplifier Din1 receives the positive differential voltage VAp from the preamplifier (cf. FIG. 1) as its non-inverting input and the output VApp of peak-hold circuit PH2 as its inverting input, and outputs a voltage VBp according to the differential input voltage. Amplifier Din2 receives the negative differential voltage VAn from the preamplifier as its non-inverting input and the output VAnp of peak-hold circuit PH1 as its inverting input, and outputs a voltage VBn according to the differential input voltage.

If differential input is regarded as subtraction and a T-network current sum is regarded as addition in FIGS. 53 and 55, then in FIG. 53, differential voltages VBp, VBn are related as indicated in the equation below.

$$VBp - VBn = K((VAp - VApp) + (VAnp - VAn)) \quad (3)$$
$$= K((VAp + VAnp) - (VAn + VApp))$$

In FIG. 55, differential voltages VBp, VBn are related as indicated in the equation below.

$$VBp - VBn = K((VAp - VApp) - (VAn - VAnp)) \quad (4)$$
$$= K((VAp + VAnp) - (VAn + VApp))$$

Equations (3) and (4) are the same as equation (2). Accordingly, VBp-VBn includes compensation for the dc offset of differential voltages VAp, VAn.

FIG. 56 shows the general structure of the level discrimination circuit described in U.S. Pat. No. 6,151,150 (and corresponding Japanese Unexamined Patent Application Publication No. 10-163828). This level discrimination circuit includes an offset compensator 104a comprising an analog summing and differencing circuit, and a comparator Comp1. The offset compensator 104a includes a pair of peak-hold circuits PH1, PH2, a pair of adders ADD1, ADD2, and a pair of voltage sources generating a reference voltage Vr and an offset voltage Voff. These circuit elements compensate for the dc offset of the differential voltages VCp, VCn and output differential voltages VEp, VEn. The adders ADD1, ADD2 constitute the summing and differencing part of the circuit. The comparator Comp1 compares the differential voltages VEp, VEn, and outputs a positive logic signal Qp and a negative logic signal Qn (one of the two logic signals, either Qp or Qn, may be omitted).

Photoelectric current flows in the photodetector PD (cf. FIG. 1) when the photodetector PD receives '1' data, and does not flow when the photodetector PD receives '0' data or does not receive any optical signal. A period during which photoelectric current does not flow will be referred to below as an extinction period, and a period during which photoelectric current flows and '1' data is received will be referred to as a light-receiving period.

If the offset compensator of the level discrimination circuit has the same general structure as the offset compensator of the main amplifier, when the same values of the differential voltages VAp, VAn continue over a long extinction period, the differential output voltages VCp, VCn, of the main amplifier and the differential output voltages VEp, VEn of the offset compensator of the level discrimination circuit are output with offset voltage compensation and zero amplitude, and are related as indicated in the equation below (where the tilde '~' indicates approximate equality).

$$VCp-VCn \sim VEp-VEn \sim 0$$

If VEp−VEn~0 as in the above equation, output of the positive logic signal Qp and the negative logic signal Qn becomes indeterminate or unstable.

In the offset compensator 104a in FIG. 56, input of the offset voltage Voff to adder ADD2 enables compensation for the dc offset of the differential voltage signals VCp, VCn to take place without having the logic signals Qp, Qn become indeterminate or unstable during long-period extinction. That is, if VCp−VCn~0 over a long extinction period, then VEn>VEp because of the offset voltage Voff, stabilizing the logic signals at Qp='0', and Qn='1'.

FIG. 57 shows the general structure of an automatic gain control amplifier circuit (AGC amplifier circuit). This AGC amplifier circuit includes a variable gain amplifier 16a, a peak-hold circuit PH, and a gain control amplifier 26a. The variable gain amplifier 16a, the variable gain of which is externally controllable, amplifies an input voltage VF according to the controlled gain and outputs a voltage VG. The peak-hold circuit PH senses the peak value of this voltage and outputs the peak value VGp. The gain control amplifier 26a receives the peak-hold voltage VGp as its inverting input and a reference voltage Vr as its non-inverting input, and controls the gain of the variable gain amplifier according to the peak-hold voltage VGp.

In the AGC amplifier circuit in FIG. 57, when the amplitude level of the input voltage VF increases, the gain control amplifier 26a decreases the gain of the variable gain amplifier 16a, thereby maintaining the output voltage VG of the variable gain amplifier 16a at a constant amplitude level, even if the amplitude level of the input voltage VF varies.

FIG. 58 shows the general structure of an automatic frequency compensation amplifier circuit ($\sqrt{f}$-AGC amplifier circuit), using the same reference characters as in FIG. 57 for similar elements. This $\sqrt{f}$-AGC amplifier circuit includes a variable frequency characteristic amplifier 17a, a peak-hold circuit PH, and an equalization characteristic control amplifier 27a. The variable frequency characteristic amplifier 17a amplifies an input voltage VF according to an externally controllable gain-frequency characteristic, and outputs a voltage VG. The equalization characteristic control amplifier 27a receives the peak-hold voltage VGp as its inverting input and a reference voltage Vr as its non-inverting input, and controls the gain-frequency characteristic of the variable frequency characteristic amplifier 17a according to the peak-hold voltage VGp.

When a pulse signal is transmitted on a (metallic) cable, if the cable is long, high frequency components are attenuated with what is generally termed a $\sqrt{f}$ characteristic, degrading the pulse waveform. It is necessary to compensate by varying the receiving frequency characteristic of the pulse receiving circuit according to the length of the cable (the gain at high frequencies must increase to compensate for the $\sqrt{f}$ characteristic). This compensation process is also referred to as equalization.

In the $\sqrt{f}$-AGC amplifier circuit in FIG. 58, when the amplitude level of the input voltage VF decreases because of pulse waveform degradation, the equalization characteristic control amplifier 27a increases the high-frequency gain of the variable frequency characteristic amplifier 17a, thereby keeping its output voltage VG at a constant amplitude level and maintaining a fixed pulse waveform, even if the input voltage signal VF is degraded.

The $\sqrt{f}$ characteristic compensation method, which controls the peak of the output voltage of a variable frequency characteristic amplifier as is done in the $\sqrt{f}$-AGC amplifier circuit in FIG. 58, is suitable for a signal with relatively few low-frequency components. Such signals are generated by balanced codes such as the alternate mark inversion (AMI) code illustrated in FIG. 41A, the code mark inversion (CMI) code illustrated in FIG. 41B, and the Manchester code illustrated in FIG. 41C.

FIGS. 59A and 59B show the general structure of two optical transmitter circuits. Each optical transmitter circuit includes a light-emitting element (laser diode) LD, a switching circuit CUR-SW, driving current generating circuits IP, IB, and a light emission control circuit 118.

FIG. 60 shows a specific example of the circuit configuration of the light emission control circuit 118. The light emission control circuit 118 includes a monitor photodetector PDM, a preamplifier, a reference voltage circuit, a peak-hold circuit PH, and a light emission control amplifier C-Amp. The preamplifier includes a pair of impedance elements Zp and a differential amplifier (DIFF-AMP). The differential amplifier DIFF-AMP includes a differential amplifying stage (D-AMP) with a pair of resistors R1, R2, a pair of bipolar transistors Q1, Q2, and a current source Is1, and a buffer stage (BUFF) with a bipolar transistor Q3 and a current source Is2. The reference voltage circuit includes a variable resistor R3, a bipolar transistor Q4, and a pair of current sources Is3, Is4. The impedance elements Zp convert current to voltage, as indicated in FIG. 59C

The light-emitting element LD emits light according to a driving pulse current Ip and driving bias current Ib, and transmits an optical signal. The monitor photodetector PDM converts a received monitor light signal from the light-emitting element LD to a monitor current signal. The preamplifier (which, like the preamplifier 16a in FIG. 57, may have externally controllable gain) converts the monitor current signal to a voltage VG. The peak-hold circuit PH senses the peak value of this voltage and outputs the peak value VGp.

In the optical transmitter circuit in FIG. 59A, the driving pulse current generating circuit IP generates a driving pulse current Ip according to a control voltage VC, and the driving bias current generating circuit IB feeds the light-emitting element LD a driving bias current Ib that is independent of the control voltage VC. The switching circuit CUR-SW switches the driving pulse current Ip on and off according to a transmit data signal D, and outputs the switched driving pulse current Ip to the light-emitting element LD. The light emission control amplifier C-Amp compares the peak value VGp with a reference voltage Vr and varies the light emission control voltage VC so as to decrease the driving pulse current Ip if VGp is greater than Vr, or increase the driving pulse current Ip if VGp is less than Vr.

In the optical transmitter circuit in FIG. 59B, the driving pulse current generating circuit IP generates a driving pulse current Ip independent of the control voltage VC, and the driving bias current generating circuit IB feeds the light-emitting element LD a driving bias current Ib according to the control voltage VC. The switching circuit CUR-SW switches the driving pulse current Ip on and off according to the transmission data signal D, and outputs the switched driving pulse current Ip to the light-emitting element LD. The light emission control amplifier compares the peak value VGp with a reference voltage Vr and varies the light emission control voltage VC so as to decrease the driving bias current Ib if VGp is greater than Vr, or increase the driving bias current Ib if VGp is less than Vr.

FIGS. 61 and 62 show the general structure of two limiting amplifier circuits included in a clock recovery circuit. The limiting amplifier circuit 119A in FIG. 61 includes m differential amplifiers Lim(1) to Lim(m) (where m is an integer equal to or greater than one), and a comparator Comp. The limiting amplifier circuit 119B in FIG. 62, which also performs duty cycle compensation, adds a duty compensation circuit to the limiting amplifier circuit 119A. The duty compensation circuit includes a pair of averaging circuits Me1, Me2, a differential amplifier Amp, a resistor Rt, and a capacitor Ct. The clock recovery circuit also includes a tuning tank (TANK) and, in FIG. 61, a capacitively coupled amplifier Dout that converts the single-ended output of the tuning tank to a differential signal.

FIG. 63 shows signal waveforms in the clock recovery circuit in FIG. 61. The tuning tank in the clock recovery circuit outputs a clock component signal (tank output signal T-out) synchronized to a tank driving trigger signal (T-trigger). The clock component signal T-out is a damped oscillation signal and has an approximate sine waveform. The clock component signal T-out has high amplitude when the tank driving trigger signal T-trigger drives the tank frequently, and low amplitude when the tank driving trigger signal T-trigger drives the tank infrequently.

In the clock recovery circuit in FIG. 61, the tank output signal is converted to differential voltages VSp(1), VSn(1) in the differential output amplifier Dout. These differential voltages VSp(1), VSn(1) are amplified and limited in the limiting amplifier circuit 119A, from which recovered clock signals (logic signals) Qp, Qn are produced. The m differential amplifiers Lim(1) to Lim(m) amplify and limit the differential voltages VSp(1), VSn(1) and output differential voltages VUp(m) (also denoted VSp(m+1)) and VUn(m) (also denoted VSn(m+1)). The comparator Comp compares voltage VSp(m+1) with voltage VSn(m+1), and converts VSp(m+1) and VSn(m+1) to the logic signals Qp, Qn.

In the limiting amplifier circuit 119B in FIG. 62, the averaging circuit Me1 senses the mean value Qpm of recovered clock signal Qp, and the averaging circuit Me2 senses the mean value Qnm of recovered clock signal Qn. The differential amplifier Amp receives the mean value Qpm as its non-inverting input and the mean value Qnm as its inverting input, and increases the bias voltage of the inverting input of the first differential amplifier Lim(1) if Qpm is greater than Qnm, or decreases the bias voltage if Qpm is less than Qnm, so as to compensate for variations in the duty cycle of the recovered clock signals Qp, Qn. The time constant of capacitor Ct and resistor Rt stabilizes the duty cycle compensation.

FIGS. 64A, 64B, and 64C show waveforms in a main amplifier. FIG. 64A shows waveforms of the differential voltages VAp, VAn output from the preamplifier. FIG. 64B shows waveforms of the offset-compensated differential voltages VBp, VBn. FIG. 64C shows waveforms in which high frequency components (noise components) have been removed from the waveforms in FIG. 64B by a low pass filter.

Photoelectric current flows in the photodetector PD (cf. FIG. 1) in the optical receiving circuit during light-receiving periods (while receiving '1' data), and does not flow during extinction periods (while receiving '0' data or no optical signal). The thermal current noise generated by the photodetector PD varies according to the current value, so the noise level is higher during the reception of '1' data than during the reception of '0' data. Accordingly, as shown in FIG. 64A, the waveforms of the differential voltages VAp, VAn output from the preamplifier include more output noise during the reception of '1' data, when photoelectric current flows in the photodetector PD, than during the reception of '0' data, when photoelectric current does not flow in the photodetector PD. The peak-hold voltages VApp, VAnp of the differential voltages VAp, VAn therefore appear to be significantly greater than the true peak values when '1' data is received, because a relatively high noise amplitude is added to the true peak values, but VApp, VAnp are close to the true peak values when '0' data is received and the noise amplitude is relatively low.

In the offset compensators in the main amplifiers discussed above, the differential voltages VAp, VAn shown in FIG. 64A and the peak-hold voltages VApp, VAnp of VAp and VAn are added and subtracted to perform offset compensation, producing the waveform shown in FIG. 64B. After the waveform in FIG. 64B is passed through a low pass filter and high frequency noise is removed, the waveform shown in FIG. 64C is obtained.

In the waveform in FIG. 64C, the signal level differs depending on whether '1' or '0' data is being received, because the dc offset corresponding to the apparent increase of the peak value due to noise persists unnecessarily even after the noise itself has been filtered out. As a result, the minimum light receiving performance is greatly degraded. It would be desirable to have an offset compensator that does not leave this unnecessary dc offset.

In particular, practical operation of the main amplifier in FIG. 52 is greatly restricted, because differential amplifier Amp2 must have the same output dc voltage bias as the preamplifier, and a single-stage differential input amplifier such as an npn transistor amplifier does not have a large output dynamic range in the direction in which the output potential is lower than the input bias voltage.

If the main amplifier in FIG. 52 is to be implemented in an integrated circuit (IC), it is easy to achieve ratio accuracy, such as equal gain, but it is difficult to ensure an absolute value such as gain=0.5. For IC implementation, it would also be desirable to reduce the power consumption of the amplifier in the offset compensator. Accordingly, for IC implementation, it would be desirable to have an offset compensator with low power consumption and with a circuit that is easy to fabricate.

Furthermore, in an optical receiving circuit including the main amplifier above, n main amplifiers must be dc-coupled, and in dc coupling a level shift circuit must be included to control the dc level, which varies in the main amplifiers. It would also be desirable to have an offset compensator that does not need this type of level shift circuit but can obtain a balanced differential signal even from a simple preamplifier, such as a capacitively coupled amplifier, in which the bias voltage varies depending on the '1' to '0' ratio.

In the offset compensator in the level discrimination circuit in FIG. 56, the summing and differencing part must receive two mutually offset reference voltages as inputs, and the power supply generating the offset voltage Voff must be floated. Furthermore, the adders ADD1, ADD2 must add and subtract three values, which significantly complicates the circuit configuration. Accordingly, it would be desirable to have a level discrimination circuit that does not need a reference voltage and has a simpler circuit configuration.

In the conventional optical receiving circuits described above, dc offset is compensated in the offset compensators of the main amplifiers, so that the '1' and '0' pulse widths in the outputs Qp, Qn of the comparator in the level discrimination circuit do not differ (pulse intervals of one type are not longer than pulse intervals of the other type), while in the offset compensator of the level discrimination circuit described above, an offset voltage Voff is added to maintain Qp='0', and Qn='1' during extinction periods. Addition of this offset voltage, however, reduces the effect of offset compensation in the offset compensators in the main amplifiers. Accordingly, it would also be desirable to have a level discrimination circuit that does not require the addition of an offset voltage Voff and can thus avoid degradation of the time-slot width ratio of the comparator outputs Qp, Qn.

In general, the output of an amplifier is the combination of a dc bias component with a signal amplitude component, and the dc bias component varies with variations in the temperature and power supply. In the AGC amplifier circuit in FIG. 57, the peak value of the combined sum of the dc bias component and the signal amplitude component is sensed, so control of the signal amplitude is inaccurate and a constant amplitude cannot easily be maintained. Accordingly, it would be desirable to have an AGC amplifier circuit that senses and controls only the magnitude of the amplitude component.

For the same reason, it is difficult to compensate accurately for frequency characteristics in the $\sqrt{f}$-AGC amplifier circuit in FIG. 58. Accordingly, it would be desirable to have a $\sqrt{f}$-AGC amplifier circuit that senses and controls only the magnitude of the amplitude component.

In the light emission control circuits in FIGS. 59A and 59B, the dc level of the preamplifier output varies according to the temperature and the power supply. In the specific example of the circuit configuration of the light emission control circuit 118 in FIG. 60, the preamplifier includes a differential amplifier, and the reference voltage Vr input to the light emission control amplifier is generated by a circuit analogous to the differential amplifier, so variations in the dc level of the preamplifier output are compensated for by similar variations in the reference voltage Vr, both variations being caused by the same temperature and power supply variations. Even this circuit configuration, however, cannot remove the effect of the offset voltage generated in the differential amplifier, so light emission control fails to keep the amplitude of the light emission constant. Accordingly, it would be desirable to have a light emission control circuit that can accurately maintain a constant light emission amplitude in an optical signal.

In the limiting amplifier circuit 119A in FIG. 61, each differential amplifier Lim(1)–Lim(m) is a potential source of dc offset. This has little adverse effect on the '1' and '0' duty cycle of the output if the input to each differential amplifier has a large amplitude and the differential amplifier operates as a switching element, but if the input has a small amplitude and the differential amplifier operates as an active amplifier, the '1' and '0' duty cycle of the output is degraded according to the ratio of the magnitude of the input and the magnitude of the above offset (cf. FIG. 63). That is, the degree of degradation of the '1' and '0' duty cycle of the output varies according to the number of the differential amplifiers Lim(1)–Lim(m) that operate as switching elements.

The limiting amplifier circuit 119B in FIG. 62 attempts to compensate for this offset and thereby mitigate the degradation of the output duty cycle. This circuit 119B functions effectively when all m differential amplifiers Lim(1)–Lim(m) operate as active amplifying elements. When a differential amplifier operates as a switching element due to high input amplitude, however, the difference between its risetime characteristic and falltime characteristic becomes a major factor degrading the '1' and '0' duty cycle of the output. The operation of the circuit 119B in FIG. 62 then becomes unstable, because it attempts to compensate for factors other than the risetime-falltime difference that causes the duty cycle degradation. Unstable operation may also occur if the feedback time constant (the product of capacitance Ct and resistance Rt) is too small. Jitter may occur if this time constant is too large, however, because variations in the tank output level (envelope) cannot be tracked. Accordingly, it would be desirable to have a limiting amplifier circuit that can avoid both unstable operation and jitter.

SUMMARY OF THE INVENTION

Objects of the invention include power reduction, noise reduction, increased noise margins, more stable circuit operation, and the provision of suitable integrated circuit structures.

The invention provides an analog circuit that receives a differential pair of input signals and compensates for a dc offset therein.

According to a first aspect of the invention, the analog circuit includes a pair of peak-hold circuits that generate respective peak signals indicating the peak values of the differential pair of input signals, a first differencing circuit that takes the algebraic difference between the differential pair of input signals, a second differencing circuit that takes the algebraic difference between the two peak signals, and a combining circuit that additively combines the outputs of the first and second differencing circuits. The differencing circuits may be amplifiers with differential voltage input and differential current output, enabling their outputs to be combined by a simple T-network circuit including a resistor.

Taking the difference between the two input signals, and the difference between the two peak signals, instead of taking differences between input and peak signals, leads to advantages including easier fabrication and IC implementation, and reduced power consumption in the differencing circuit that compares the peak signals. A low pass filter or capacitor can be added to this differencing circuit to reduce noise without causing waveform degradation.

The invention further provides a main amplifier, an optical receiving circuit, an AGC amplifier, an automatic frequency compensation circuit, a light emission control circuit, and an optical transmitting circuit incorporating the first-aspect analog circuit.

According to a second aspect of the invention, the analog circuit includes a pair of peak-hold circuits as described above, a low pass filter filtering the input to at least one of the peak-hold circuits, and an analog summing and differencing circuit that additively combines the differential pair of input signals and the two peak signals.

The low pass filter enables a noise-free output waveform with complete offset compensation to be obtained.

The invention also provides a main amplifier and an optical receiving circuit including the second-aspect analog circuit. In the optical receiving circuit, the invention produces a more open eye pattern, provides an improved noise margin, and reduces the minimum signal level that can be received.

According to a third aspect of the invention, the analog circuit includes a pair of peak-hold circuits as described above, and an analog summing and differencing circuit that additively combines the differential pair of input signals and the two peak signals. The peak-hold circuits have respective capacitors for holding the peak values, and respective discharging circuits, such as resistors or constant-current sources, for discharging the capacitors.

The discharging circuits expedite compensation for variations in the dc level of the input signals, as well as for dc offset.

The invention also provides a main amplifier and an optical receiving circuit including the third-aspect analog circuit. In a multi-stage optical receiving circuit with cascaded main amplifiers, the main amplifiers can be capacitively coupled, so their structure can be simplified and power consumption can be reduced.

According to a fourth aspect of the invention, the analog circuit includes a pair of peak-hold circuits as described above, and an analog summing and differencing circuit that additively combines the differential pair of input signals and the two peak signals. The analog summing and differencing circuit has unbalanced circuit elements, such as resistors with different values or unbalanced buffer circuit elements, that produce an offset-compensated differential pair of output signals that differ by a fixed offset when the first and second input signals are substantially identical.

The unbalanced circuit elements avoid the need for extra reference voltage circuitry, and enable the structure of the analog summing and differencing circuit to be simplified.

The invention also provides a level discrimination circuit and an optical receiving circuit including the fourth-aspect analog circuit.

According to a fifth aspect of the invention, the analog circuit includes a pair of peak-hold circuits as described above, and an analog summing and differencing circuit that additively combines the two peak signals and a reference signal, or a pair of reference signals.

The invention also provides an AGC amplifier, an automatic frequency compensation circuit, a light emission control circuit, and an optical transmitting circuit including the fifth-aspect analog circuit. The AGC amplifier, for example, benefits from the ability of the analog circuit to correct for dc offset so that the signal amplitude can be detected accurately.

According to a sixth aspect of the invention, the analog circuit includes a pair of averaging circuits that generate respective mean signals indicating the mean values of the differential pair of input signals, and an analog summing and differencing circuit that additively combines the differential pair of input signals and the two mean signals.

The invention also provides a limiting amplifier and a limiting comparator including the sixth-aspect analog circuit. A resulting advantage is the ability to maintain a constant 1:1 ratio between '1' and '0' pulse widths over a wide range of input amplitude levels.

A seventh aspect of the invention provides a level discrimination circuit including an offset compensator that compensates for dc offset in a pair of input signals, and a comparator with a hysteresis characteristic. The hysteresis characteristic is useful in reducing differential mode noise, and in maintaining correct output over long runs of identical input values without the need for a reference voltage. These properties make the level discrimination circuit of the seventh aspect useful in low-voltage differential signaling (LVDS), for example.

The invention also provides an optical receiving circuit including the seventh-aspect level discrimination circuit.

A more detailed summary will now be given of several aspects of the invention.

The main amplifier including the third-aspect analog circuit also includes a differential amplifier, the differential amplifier receiving the first and second voltage output signals from said analog circuit and generating a differential pair of amplified voltage output signals.

The invention provides an optical signal receiving circuit having a cascaded series of n main amplifiers, n being a positive integer, at least one of the n main amplifiers including the third-aspect analog circuit, comprising: a receiving element for receiving an optical signal and converting the optical signal to a current signal; a preamplifier for converting the current signal from the receiving element to a differential pair of input signals for input to the cascaded series of n main amplifiers; and a level discrimination circuit for comparing a final differential pair of amplified voltage output signals output from the cascaded series of n main amplifiers and generating a logic signal.

The fourth-aspect analog circuit is an analog circuit for receiving a differential pair of input signals and compensating for a direct-current offset therein, the differential pair of input signals including a first input signal and a second input signal with mutually opposite phases, the analog circuit comprising: a first peak-hold circuit receiving the first input signal and generating a first peak signal indicating a peak value of the first input signal; a second peak-hold circuit receiving the second input signal and generating a second peak signal indicating a peak value of the second input signal; and an analog summing and differencing circuit with unbalanced circuit elements for additively combining the first input signal, the second input signal,-the first peak signal, and the second peak signal to generate an offset-compensated differential pair of voltage output signals, the unbalanced circuit elements causing the offset-compensated differential pair of voltage output signals to differ by a fixed offset when the first and second input signals are substantially identical.

In one version of the fourth-aspect analog circuit, the analog summing and differencing circuit comprises: a first amplifier receiving the first and second input signals as differential voltage inputs and having a first output terminal and a second output terminal for differential current output; a second amplifier receiving the first and second peak signals as differential voltage inputs and having a first output terminal and a second output terminal for differential current output; a first resistor having one terminal coupled to the first output terminals of the first and second amplifiers, for generating a first voltage output signal; a second resistor having one terminal coupled to the second output terminals of the first and second amplifiers, for generating a second voltage output signal opposite in phase to the first voltage output signal; and a buffer circuit receiving the first and second voltage output signals and generating the offset-compensated differential pair of voltage output signals.

In another version of the fourth-aspect analog circuit, the analog summing and differencing circuit comprises: a first amplifier receiving the first input signal and the first peak signal as differential voltage inputs and having a first output terminal and a second output terminal for differential current output; a second amplifier receiving the second input signal and the second peak signal as differential voltage inputs and having a first output terminal and a second output terminal for differential current output; a first resistor having one terminal coupled to the first output terminals of the first and second amplifiers, for generating a first voltage output signal; a second resistor having one terminal coupled to the second output terminals of the first and second amplifiers, for generating a second voltage output signal opposite in phase to the first voltage output signal; and a buffer circuit receiving the first and second voltage output signals and generating the offset-compensated differential pair of voltage output signals.

In yet another version of the fourth-aspect analog circuit, the analog summing and differencing circuit comprises: a first amplifier receiving the first and second input signals as differential voltage inputs and having a first output terminal and a second output terminal for differential current output, the second output terminal of the first amplifier and being coupled to a power supply; a second amplifier receiving the first and second peak signals as differential voltage inputs and having a first output terminal and a second output terminal for differential current output, the first output terminal of the second amplifier being coupled to said power supply; a first resistor having one terminal coupled to the first output terminal of the first amplifier and another terminal coupled to said power supply, for generating a first voltage output signal; a second resistor having one terminal coupled to the second output terminal of the second amplifier and another terminal coupled to said power supply, for generating a second voltage output signal opposite in phase to the first voltage output signal; and a buffer circuit receiving the first and second voltage output signals and generating the offset-compensated differential pair of voltage output signals.

In still another version of the fourth-version analog circuit, the analog summing and differencing circuit comprises: a first amplifier receiving the first input signal and the first peak signal as differential voltage inputs and having a first output terminal and a second output terminal for differential current output, the second output terminal of the first amplifier and being coupled to a power supply; a second amplifier receiving the second input signal and the second peak signal as differential voltage inputs and having a first output terminal and a second output terminal for differential current output, the first output terminal of the second amplifier being coupled to said power supply; a first resistor having one terminal coupled to the first output terminal of the first amplifier and another terminal coupled to said power supply, for generating a first voltage output signal; a second resistor having one terminal coupled to the second output terminal of the second amplifier and another terminal coupled to said power supply, for generating a second voltage output signal opposite in phase to the first voltage output signal; and a buffer circuit receiving the first and second voltage output signals and generating the offset-compensated differential pair of voltage output signals.

The unbalanced circuit elements in any of these versions of the fourth-aspect analog circuit may include the first and second resistors, the first and second resistors having unequal resistance values.

Alternatively, the unbalanced circuit elements may include differentially paired circuit elements in the buffer circuit.

The level discrimination circuit including the fourth-aspect analog circuit also includes a comparator for comparing the offset-compensated differential pair of voltage output signals and generating a logic signal.

The invention also provides an optical signal receiving circuit including this level discrimination circuit, comprising: a receiving element for receiving an optical signal and converting the optical signal to a current signal; a preamplifier for converting the current signal from the receiving element to a differential pair of input signals; and a cascaded series of n main amplifiers, n being a positive integer, for receiving the differential pair of input signals from the preamplifier and supplying the first input signal and the second input signal to the level discrimination circuit.

The fifth-aspect analog circuit is an analog circuit for receiving a differential pair of input signals and compensating for a direct-current offset therein, the differential pair of input signals including a first input signal and a second input signal with mutually opposite phases, the analog circuit comprising: a first peak-hold circuit receiving the first input signal and generating a first peak signal indicating a peak value of the first input signal; a second peak-hold circuit receiving the second input signal and generating a second peak signal indicating a peak value of the second input signal; a first amplifier receiving the first peak signal and a first reference signal as differential voltage inputs and having a first output terminal and a second output terminal for differential current output; a second amplifier receiving the second peak signal and a second reference signal as differential voltage inputs and having a first output terminal and a second output terminal for differential current output; a first resistor having one terminal coupled to the first output terminals of the first and second amplifiers, for generating a first voltage output signal; and a second resistor having one terminal coupled to the second output terminals of the first and second amplifiers, for generating a second voltage output signal opposite in phase to the first voltage output signal.

In the fifth-aspect analog circuit, the first peak-hold circuit may include a first capacitor for holding the peak value of the first input signal and a first discharging circuit for discharging the first capacitor, and the second peak-hold circuit may include a second capacitor for holding the peak value of the second input signal and a second discharging circuit for discharging the second capacitor.

The first discharging circuit and the second discharging circuit may comprise respective discharge paths with respective resistors inserted therein.

Alternatively, the first discharging circuit and the second discharging circuit may comprise respective constant-current sources.

If the first and second input signals in the fifth aspect have a maximum run duration of identical information, the first and second input signals may have a first time constant of direct-current level variation, and the first and second discharging circuits may have a second time constant for discharging the first and second capacitors, the second time constant being greater than the maximum run duration and less than the first time constant.

The AGC amplifier including the fifth-aspect analog circuit also includes: a variable gain amplifier for amplifying an input voltage with a gain determined by a control signal, thereby generating the first and second input signals received by said analog circuit; and a gain control amplifier receiving the first and second voltage output signals from said analog circuit and generating the control signal.

This AGC amplifier may further include a low pass filter for filtering the first and second input signals received by said analog circuit.

The automatic frequency compensation amplifier including the fifth-aspect analog also includes a variable frequency characteristic amplifier for amplifying an input voltage with a frequency-dependent gain characteristic determined by a control signal, thereby generating the first and second input signals received by said analog circuit; and an equalization characteristic control amplifier receiving the third and fourth voltage output signals from said analog circuit and generating the control signal.

The light emission control circuit including the fifth-aspect analog circuit also includes: a receiving element for receiving a monitor light signal and converting the monitor light signal to a current signal; a preamplifier for converting the current signal from the receiving element to the first and second input signals received by said analog circuit; and a light emission control amplifier receiving the first and second voltage output signals from said analog circuit and generating a control signal.

An optical transmitter including this light emission control circuit also includes: a driving current generating circuit generating a driving current according to the control signal output from said light emission control circuit; and a light-emitting element emitting the monitor light signal according to the driving current.

The sixth-aspect analog circuit is an analog circuit for receiving a differential pair of input signals and compensating for a direct-current offset therein, the differential pair of input signals including a first input signal and a second input signal with mutually opposite phases, the analog circuit comprising: a first averaging circuit receiving the first input signal and generating a first mean signal indicating a mean value of the first input signal; a second averaging circuit receiving the second input signal and generating a second mean signal indicating a mean value of the second input signal; and an analog summing and differencing circuit for additively combining the first input signal, the second input signal, the first mean signal, and the second mean signal to generate an offset-compensated differential pair of voltage output signals.

In the sixth-aspect analog circuit, the analog summing and differencing circuit may comprise: a first amplifier receiving the first and second input signals as differential voltage inputs and having a first output terminal and a second output terminal for differential current output; a second amplifier receiving the first and second mean signals as differential voltage inputs and having a first output terminal and a second output terminal for differential current output; a first resistor having one terminal coupled to the first output terminals of the first and second amplifiers, for generating a first voltage output signal; and a second resistor having one terminal coupled to the second output terminals of the first and second amplifiers, for generating a second voltage output signal opposite in phase to the first voltage output signal, the first voltage output signal and the second voltage output signal constituting said offset-compensated differential pair of voltage output signals.

The limiting amplifier including the sixth-aspect analog circuit also includes a differential amplifier, the differential amplifier receiving, amplifying, and limiting the offset-compensated differential pair of voltage output signals from said analog circuit and generating a differential pair of limited voltage output signals.

The invention also provides a limiting amplifier circuit having a cascaded series of m limiting amplifiers, m being a positive integer, at least one of the m limiting amplifiers being the limiting amplifier of the preceding paragraph, the limiting amplifier circuit also comprising a limiting comparator for comparing a final differential pair of amplified voltage output signals output from the cascaded series of m limiting amplifiers and generating a complementary pair of logic signals.

The limiting comparator including the sixth-aspect analog circuit also includes a comparator, the comparator receiving and comparing the offset-compensated differential pair of voltage output signals from said analog circuit and generating a complementary pair of logic signals.

The invention also provides a limiting amplifier circuit including this limiting comparator, also including a cascaded series of m limiting amplifiers, m being a positive integer, generating as final output signals the first and second input signals received by said analog circuit in said limiting comparator.

The level discrimination circuit in the seventh aspect of the invention comprises: an offset compensator receiving a first input signal and a second input signal and compensating for direct-current offset therein to generate an offset-compensated differential pair of voltage signals; and a comparator comparing the offset-compensated differential pair of voltage signals and generating a logic signal, the comparator having an input-output characteristic with hysteresis.

In one version of this level discrimination circuit, the comparator includes a positive feedback latching circuit that holds a differential pair of output signals and, after the offset-compensated differential pair of voltage signals have inverted, inverts the differential pair of output signals when the offset-compensated differential pair of voltage signals have reached a predetermined level difference.

In another version of this level discrimination circuit, the comparator further includes a differential input circuit for causing the differential pair of output signals held by the positive feedback latching circuit to invert.

The optical signal receiving circuit including the seventh-aspect level discrimination circuit also includes: a receiving element for receiving an optical signal and converting the optical signal to a current signal; a preamplifier for converting the current signal from the receiving element to a differential pair of input signals; and a cascaded series of n main amplifiers, n being a positive integer, for receiving the differential pair of input signals from the preamplifier and supplying the first input signal and the second input signal to the level discrimination circuit.

The overall effect of the invention is that desired differential outputs can be obtained from a circuit configuration suited for IC implementation.

DETAILED DESCRIPTION OF THE INVENTION

Figure 1:
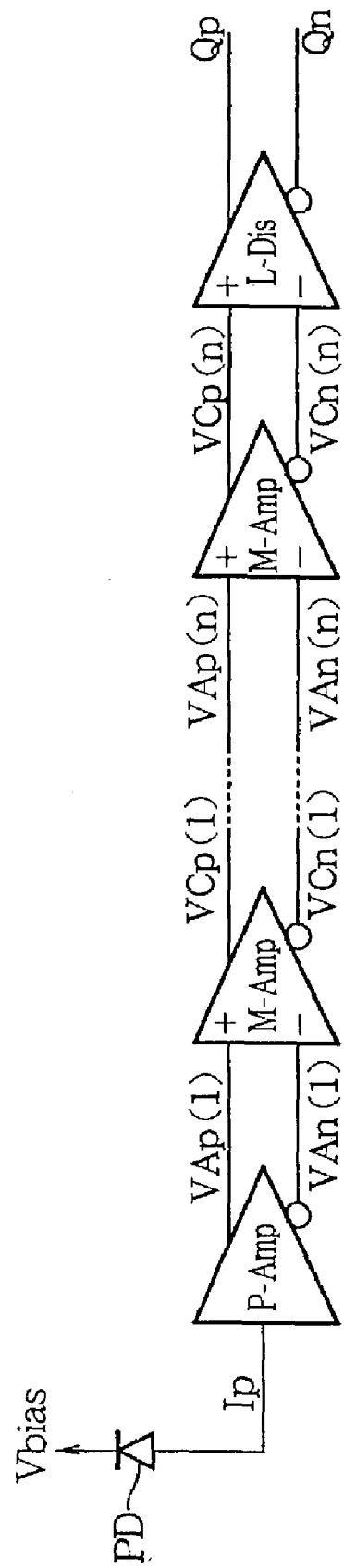
FIG. 1 shows the structure of an optical receiving circuit.

Embodiments of the invention will now be described with reference to the attached drawings, in which like elements are indicated by like reference characters. For convenience, circuit elements in circuit diagrams will generally be numbered consecutively from number one in each diagram. Resistors will be denoted R1, R2, . . . ; capacitors will be denoted C1, C2, . . . ; bipolar transistors will be denoted Q1, Q2, . . . ; constant-current sources will be denoted Is1, Is2 . . . . Different circuit elements may thus be indicated by the same reference characters in different drawings. Detailed descriptions of circuit configurations readily comprehensible to those skilled in the art will be omitted. The terms 'positive' and 'negative' will continue to be used in place of more exact but lengthier terms such as 'positive-phase' or 'non-inverting-phase', and 'negative-phase', opposite-phase', or 'inverting-phase'.

The invention is embodied in a main amplifier (embodiments 1A, 1B, 1C, 2A, 2B, 2C, 3A, 3B), a level discrimination circuit in an optical receiving circuit (embodiments 4A, 4B, 4C, 4D, 5A, 5B, 5C), an automatic gain control amplifier circuit (embodiments 6A, 6B, 6C, 6D), an automatic frequency compensation amplifier circuit (embodiments 7A, 7B), a light emission control circuit in an optical transmitting circuit (embodiment 8), and a limiting amplifier circuit (embodiments 9A, 9B).

FIG. 1 shows the structure of a light-receiving circuit employing the invented main amplifier (embodiments 1A–1C, 2A–2C, and 3A–3B) and level discrimination circuit (embodiments 4A–4D and 5A–5C). The optical receiving circuit comprises a photodetector (PD), a preamplifier (P-Amp), n main amplifiers (M-Amp(1) to M-Amp(n), where n is an integer equal to or greater than one), and a level discrimination circuit (L-Dscr). The photodetector PD is reverse-biased at a voltage Vbias, and converts a received optical signal to a current signal Ip. The preamplifier converts the current signal Ip to a pair of differential voltages VAp, VAn. The n main amplifiers amplify the differential voltages VAp, VAn to a differential voltage level sufficient to drive the level discrimination circuit, while compensating for dc offset. The successive differential inputs to the main amplifiers are denoted VAp(1)–VAp(n) and VAn(1)–VAn(n); their differential outputs are denoted VCp(1)–VCp(n) and VCn(1)–VCn(n). The level discrimination circuit converts the final pair of differential outputs VCp(n), VCn(n) to a positive logic signal Qp and a negative logic signal Qn. This circuit configuration enables a weak optical logic signal to generate an electrical logic signal on which logic operations can be carried out.

Figure 2A:
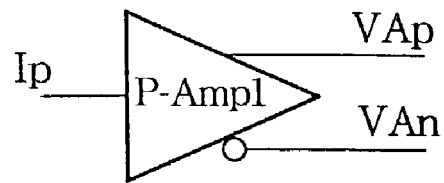
FIGS. 2A, 2B, and 2C show examples of the preamplifier in FIG. 1.
Figure 2B:
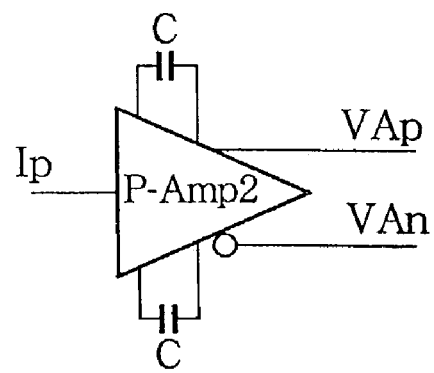
Figure 2C:
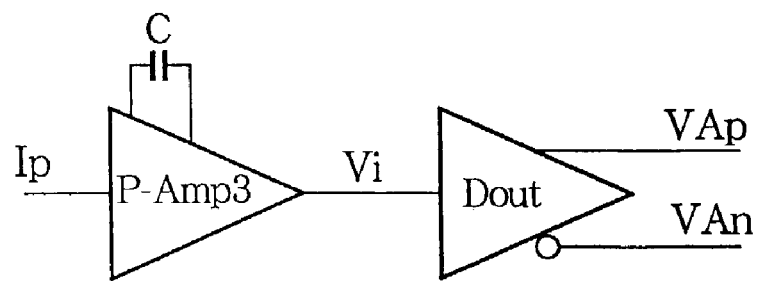
Figure 3:
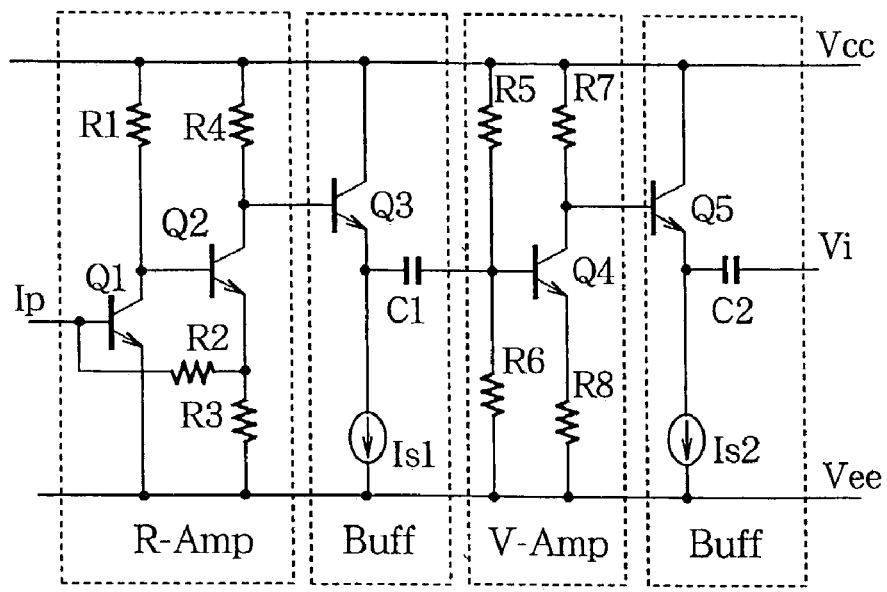
FIG. 3 is a circuit diagram of the preamplifier P-Amp3 in FIG. 2C.
Figure 4:
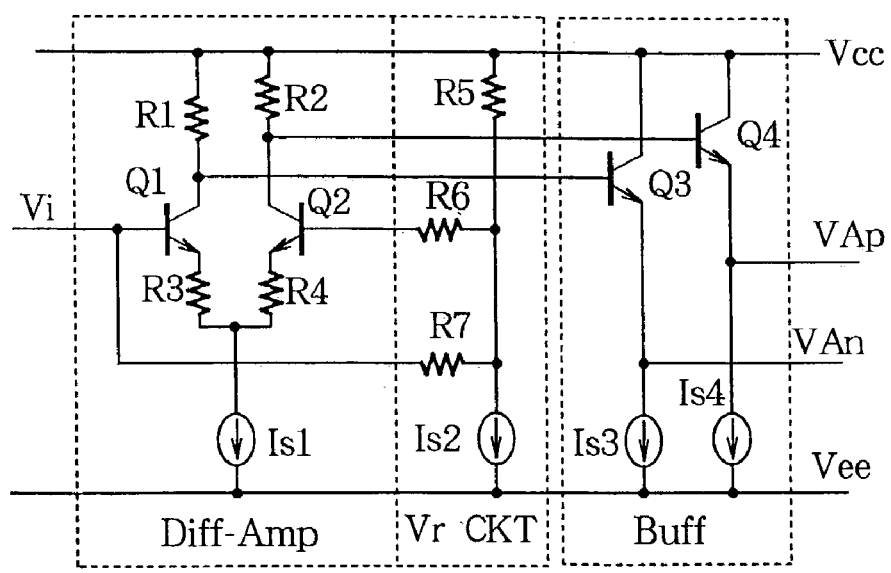
FIG. 4 is a circuit diagram of the differential output amplifier Dout in FIG. 2C.

FIGS. 2A, 2B, and 2C show specific examples of the general structure of the preamplifier in FIG. 1. The preamplifier in FIG. 2A includes a receiving preamplifier P-Amp1 with single-ended input and differential output. The preamplifier in FIG. 2B includes a receiving preamplifier P-Amp2 with single-ended input and differential output, and with capacitive coupling in the signal amplification system. The preamplifier in FIG. 2C includes a receiving preamplifier P-Amp3 with single-ended input, differential output, and capacitive coupling in the signal amplification system, and a differential output amplifier Dout. FIG. 3 shows a specific example of the circuit configuration of the receiving preamplifier P-Amp3 in FIG. 2C, which includes a receiving amplifier (R-Amp), a voltage amplifier (V-Amp), and a pair of buffer circuits (Buff). FIG. 4 shows a specific example of the circuit configuration of the differential output amplifier Dout in FIG. 2C, which includes a differential amplifier (Diff-Amp), a reference voltage circuit (Vr CKT), and a buffer circuit (Buff).

Embodiments 1A–1C

The main amplifier in embodiments 1A–1C includes an offset compensator with an analog summing and differencing circuit having a first amplifier and a second amplifier. The first amplifier receives differential voltages as its inverting and non-inverting inputs. The second amplifier receives two peak voltages derived from the differential voltages as its inverting and non-inverting inputs.

Embodiment 1A

Figure 5:
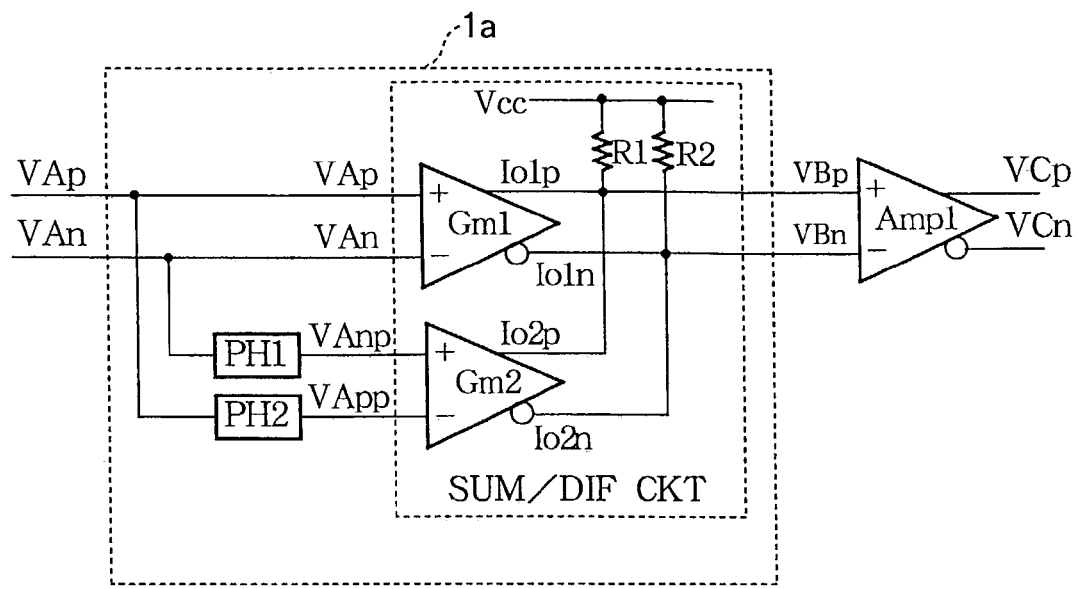
FIG. 5 shows the structure of a main amplifier in embodiment 1A of the present invention.
Figure 6:
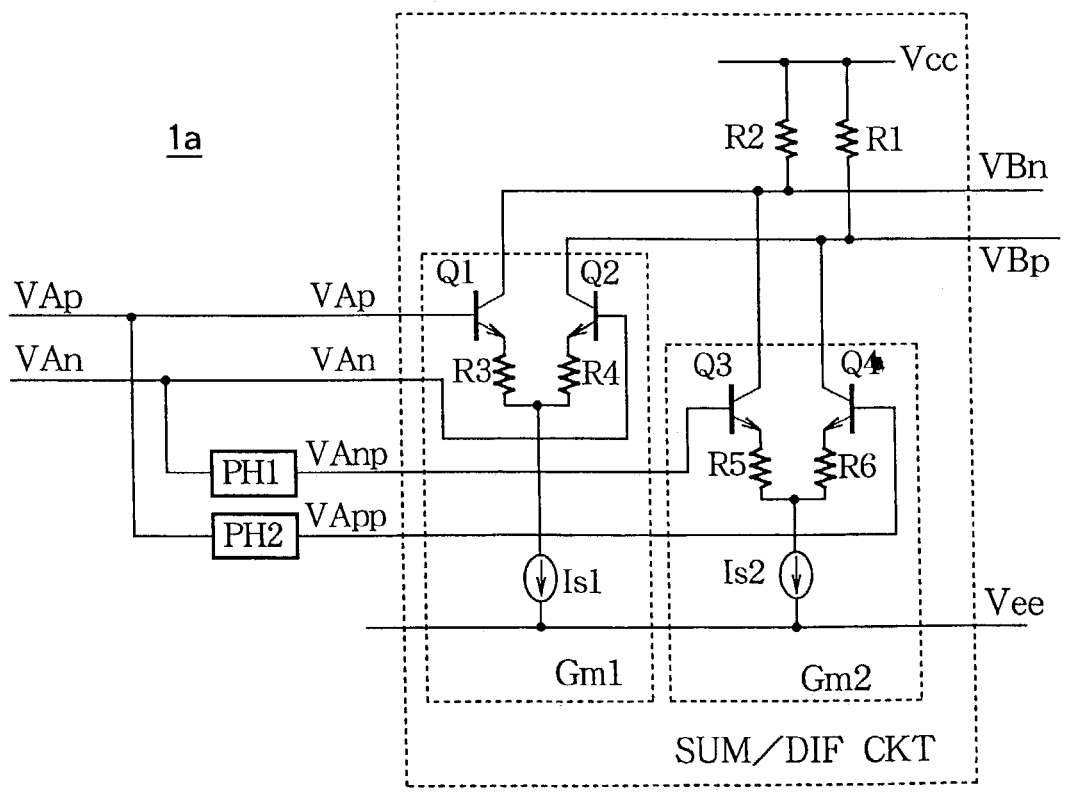
FIG. 6 is a circuit diagram of the offset compensator in FIG. 5.
Figure 53:
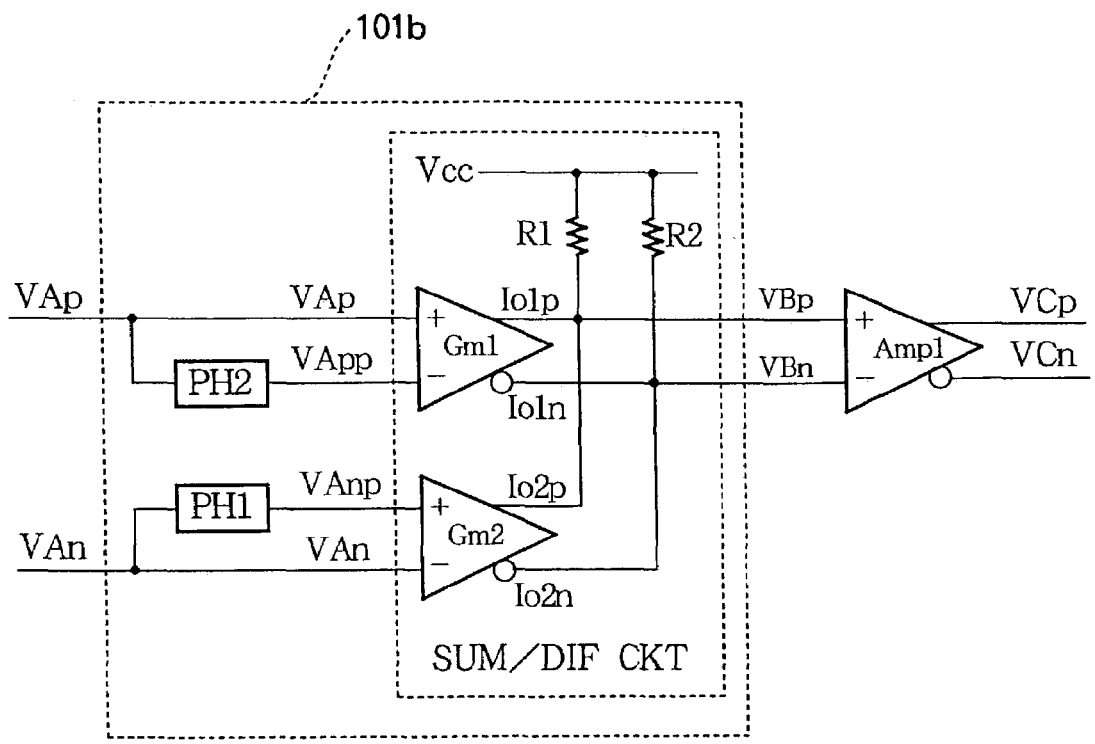
FIG. 53 shows the structure of another conventional main amplifier described in U.S. Pat. No. 5,892,609.

FIG. 5 shows the structure of the main amplifier in embodiment 1A, using the same reference characters as in FIG. 53 for similar elements. This main amplifier comprises an offset compensator 1a and a differential amplifier Amp1. The offset compensator 1a includes a pair of peak-hold circuits PH1, PH2 and an analog summing and differencing circuit (SUM/DIF CKT). The analog summing and differencing circuit includes a pair of amplifiers Gm1, Gm2 with differential voltage input and differential current output, and a pair of resistors R1, R2. FIG. 6 shows an example of the circuit configuration of the offset compensator 1a. The main amplifier in embodiment 1A receives, for example, the differential voltages VAp, VAn output from the preamplifier in FIG. 2A.

Figure 7:
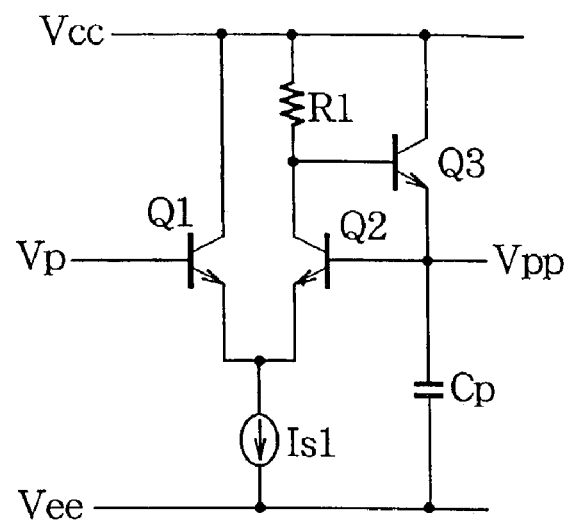
FIG. 7 is a circuit diagram of the peak-hold circuits in FIG. 5.

FIG. 7 shows an example of the circuit configuration of the peak-hold circuits PH1, PH2. Peak-hold circuit PH1 senses the peak of the negative differential voltage VAn from, for example, the preamplifier P-Amp in FIG. 1, and outputs a peak value VAnp; peak-hold circuit PH2 senses the peak of the positive differential output VAp from the preamplifier and outputs a peak value VApp.

Amplifier Gm1 in FIGS. 5 and 6 receives the positive differential voltage VAp from the preamplifier as its non-inverting input and the negative differential voltage VAn from the preamplifier as its inverting input, and outputs a positive differential current Io1p and negative differential current Io1n according to the differential input voltages VAp, VAn. Amplifier Gm2 receives the output VAnp of peak-hold circuit PH1 as its non-inverting input and the output VApp of peak-hold circuit PH2 as its inverting input, and outputs a positive differential current Io2p and negative differential current Io2n according to the differential input voltages VAnp, VApp. Resistor R1 converts the sum of the positive differential currents Io1p and Io2p to a positive output voltage VBp. Resistor R2 converts the sum of the negative differential currents Io1n and Io2n to a negative output voltage VBn.

Figure 8:
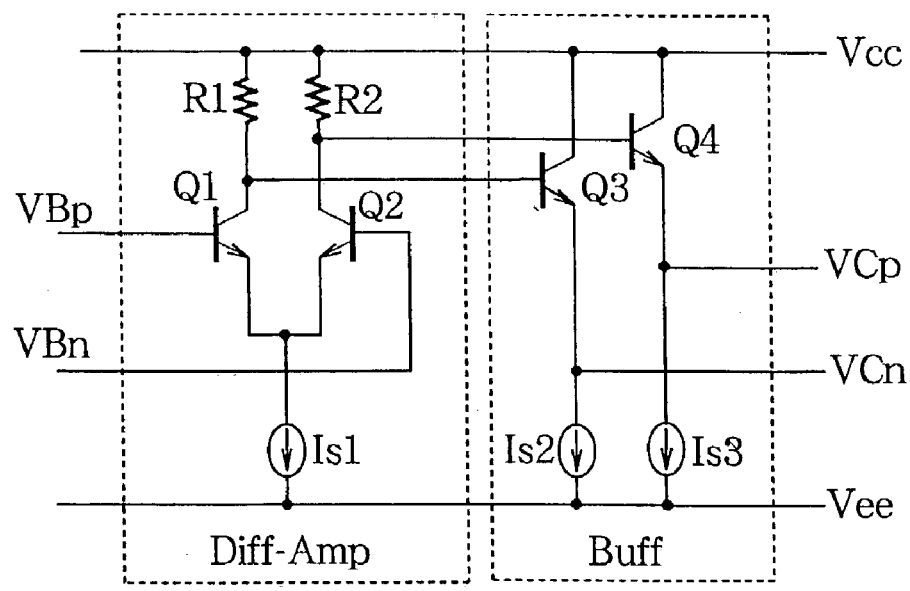
FIG. 8 is a circuit diagram of the differential amplifier in FIG. 5.

FIG. 8 shows a specific example of the circuit configuration of the differential amplifier Amp1. The differential amplifier Amp1 amplifies the offset-compensated positive output voltage VBp and negative output voltage VBn, and outputs a positive differential voltage VCp and a negative differential voltage VCn.

In the offset compensator 1a, differential voltages VBp, VBn are related as indicated in the equation below.

$$VBp - VBn = K((VAp - VAn) + (VAnp - VApp)) \quad (5)$$
$$= K((VAp + VAnp) - (VAn + VApp))$$

Equation (5) is the same as equation (2). Accordingly, VBp–VBn includes compensation for the dc offset of differential voltages VAp, VAn.

In the amplifiers Gm1, Gm2 in FIG. 6, if the resistance of resistors R3–R6 is adequately large, compared with the emitter resistance of transistors Q1–Q4, the voltage-to-current conversion gain gm1 in amplifier Gm1 is given by the equations below, in which $\Delta Vi1$ denotes the differential input voltage (in this case, VAp–VAn) and $\Delta Io1$ denotes the differential output current (Io1p–Io1n).

$gm1=1/(R3+R4)$, $\Delta Io1=\Delta Vi1*gm1$, $gm1=\Delta Io1/\Delta Vi1$ \quad (7)

The voltage-to-current conversion gain gm2 in amplifier Gm2 is similarly described by the equations below.

$gm2=1/(R5+R6)$, $\Delta Io2=\Delta Vi2*gm2$, $gm2=\Delta Io2/\Delta Vi2$ \quad (8)

Accordingly, the voltage-to-current conversion gains gm1, gm2 do not depend on the values of the emitter sink currents Is1, Is2.

The values of emitter sink currents Is1, Is2 determine the value of the maximum linear differential input voltage, that is, the maximum differential input voltage in the linear operating range of amplifiers Gm1 and Gm2. The maximum linear differential input voltage Vi1 (max) of amplifier Gm1 is given by the equation below.

$$Vi1(max)=Is1(R3+R4)/2 \qquad (9)$$

The maximum linear differential input voltage Vi2(max) of amplifier Gm2 is given by the equation below.

$$Vi2(max)=Is2(R5+R6)/2 \qquad (10)$$

Figure 54:
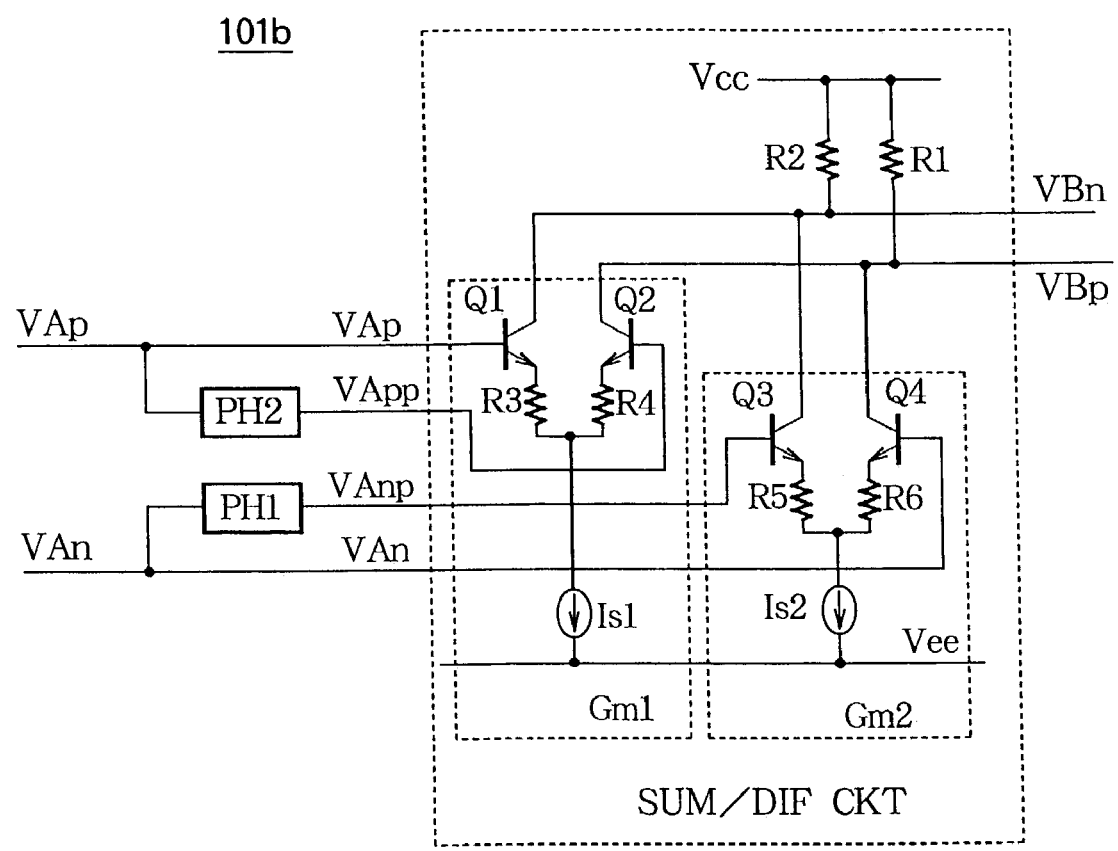
FIG. 54 is a circuit diagram of the offset compensator in FIG. 53.

In the conventional offset compensator 101b in FIGS. 53 and 54, amplifiers Gm1, Gm2 must have the same circuit configuration, but in the offset compensator 1a, amplifiers Gm1, Gm2 only need to have equal voltage-to-current conversion gains. In the offset compensator 1a, amplifier Gm2 receives substantially direct-current inputs and generates substantially direct-current outputs, so high-speed operation is not required.

Accordingly, in the offset compensator 1a, if the offset voltage to be compensated for is not very large, the maximum linear differential input voltage of amplifier Gm2 can be reduced, and since high-speed operation is not required, the emitter sink current Is2 can be decreased. Power consumption can be lowered accordingly.

As described above, in embodiment 1A, if the dc offset of the signal voltages input to the main amplifiers is not very large, the emitter sink current Is2 in amplifier Gm2 can be decreased, thereby reducing the power consumption.

Embodiment 1B

Figure 9:
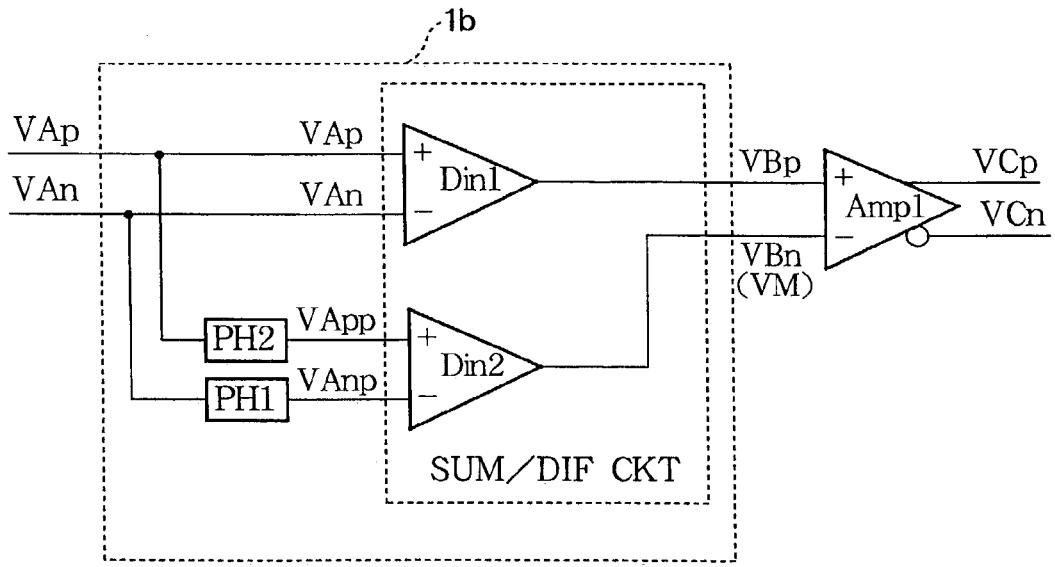
FIG. 9 shows the structure of a main amplifier in embodiment 1B of the present invention.
Figure 10:
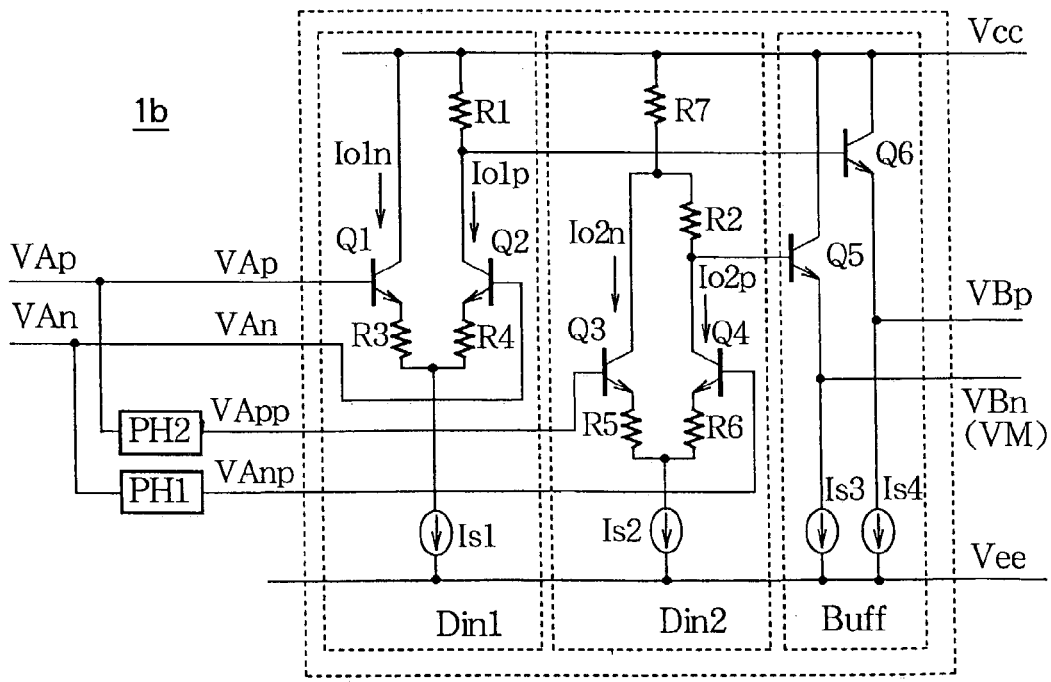
FIG. 10 is a circuit diagram of the offset compensator in FIG. 9.
Figure 55:
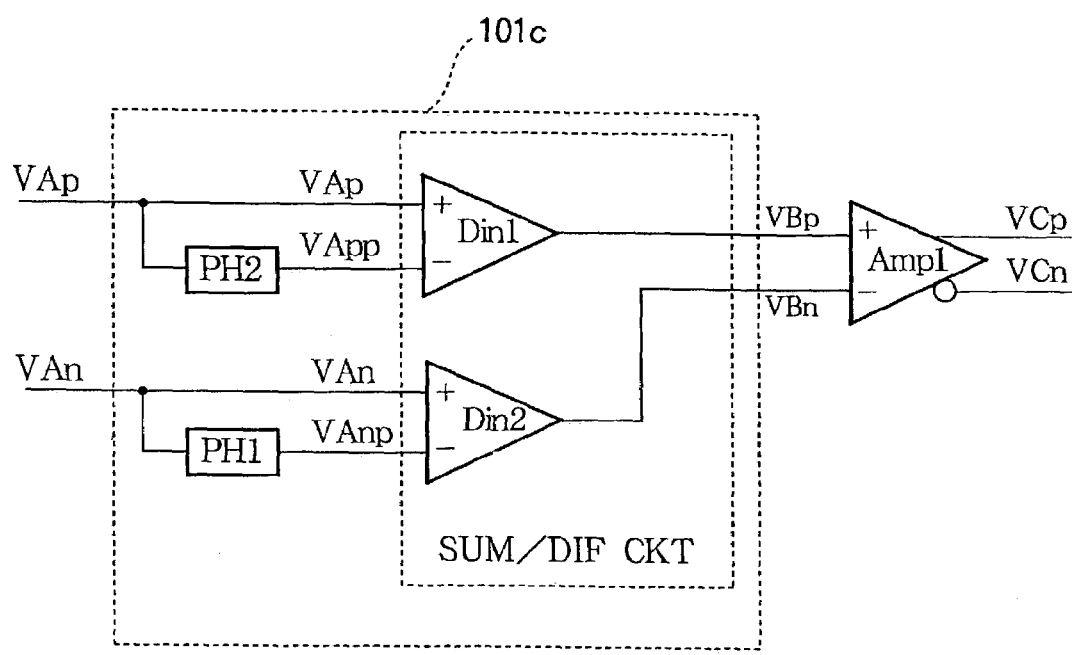
FIG. 55 shows the structure of another conventional main amplifier described in U.S. Pat. No. 5,892,609.

FIG. 9 shows the structure of the main amplifier in embodiment 1B, using the same reference characters as in FIG. 5 or FIG. 55 for similar elements. This main amplifier comprises an offset compensator 1b and a differential amplifier Amp1. The offset compensator 1b includes a pair of peak-hold circuits PH1, PH2 and an analog summing and differencing circuit. The analog summing and differencing circuit includes a pair of amplifiers Din1, Din2 with differential voltage input and single-ended voltage output. FIG. 10 shows an example of the circuit configuration of the offset compensator 1b.

Amplifier Din1 receives the positive differential voltage VAp from the preamplifier (cf. FIG. 1) as its non-inverting input and the negative differential voltage VAn from the preamplifier as its inverting input, and outputs a voltage VBp according to the differential input voltages VAp, VAn. Amplifier Din2 receives the output VApp of peak-hold circuit PH2 as its non-inverting input and the output VAnp of peak-hold circuit PH1 as its inverting input, and outputs a voltage VBn according to the differential input voltages VApp, VAnp.

In the offset compensator 1b, amplifier Din2 generates a substantially dc voltage output VBn, but if the differential voltage VBp–VBn is considered, it has the value indicated in the equation below.

$$VBp - VBn = K((VAp - VAn) - (VApp - VAnp)) \qquad (6)$$
$$= K((VAp + VAnp) - (VAn + VApp))$$

Equation (6) is the same as equation (2). Accordingly, VBp–VBn includes compensation for the dc offset of the differential voltages VAp, VAn.

In the conventional offset compensator 101c in FIG. 55, amplifiers Din1, Din2 must have the same circuit configuration, but in the offset compensator 1b, amplifiers Din1, Din2 only need to have equal voltage gains, and equal output bias voltages for zero differential input.

Accordingly, in the offset compensator 1b, as in the offset compensator 1a, if the offset voltage to be compensated for is not very large, the maximum linear differential input voltage of amplifier Din2 can be reduced, and since high-speed operation is not required, the emitter sink current Is2 in amplifier Din2 can be decreased. Power consumption can be lowered accordingly.

In FIG. 10, if the resistance of resistors R3–R6 is adequately large compared with the emitter resistance of transistors Q1–Q4, the resistances of resistors R1–R7 may be set as indicated by the equations below. If Is1=Is2, then R1=R2, and R7=0.

$$R1/(R3+R4)=R2/(R5+R6) \qquad (11)$$

$$R1\times Is1/2=R7\times Is2+R2\times Is2/2 \qquad (12)$$

In the offset compensator 1b, since amplifier Din2 generates a substantially direct-current output voltage VBn, a capacitor can be inserted between the output and a power supply (Vcc) that functions as an effective ground, or a low pass filter can be inserted between the output of amplifier Din2 and the differential amplifier Amp1 (as in embodiment 1C described below). Noise can thereby be reduced without causing waveform degradation. If the amplitude level of the VBp component is large and noise reduction is not required, the capacitor and the low pass filter are not needed. In the offset compensator 1b in FIG. 10, the voltages VBp, VBn are output through a buffer circuit (Buff) including a pair of transistors Q5, Q6 and a pair of constant-current sources Is3, Is4, but the buffer circuit can be included in the input of the differential amplifier Amp1 in FIG. 9.

Figure 52:
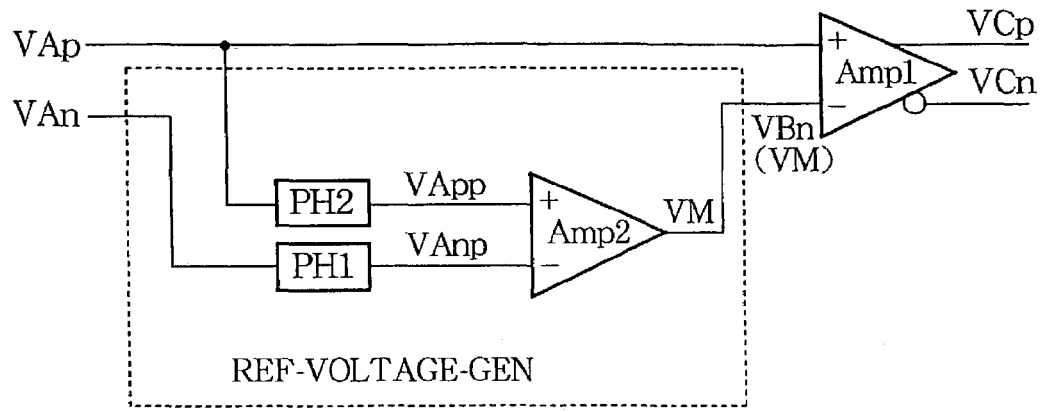
FIG. 52 shows the structure of a conventional main amplifier described in U.S. Pat. No. 5,892,609.

The main amplifier in embodiment 1B is analogous to the conventional main amplifier in FIG. 52 in that the differential amplifier Amp1 receives a substantially dc negative input voltage VBn, but practical operation of the conventional main amplifier is greatly restricted, because differential amplifier Amp2 must have the same output dc voltage bias as the preamplifier, and a single-stage differential input amplifier such as an npn transistor amplifier does not have a large output dynamic range in the direction in which the output potential is lower than the input bias voltage. If the conventional main amplifier is to be implemented in an IC, it is easy to achieve ratio accuracy, such as equal gain, but it is difficult to ensure an absolute value such as gain=0.5.

Compared with the conventional main amplifier, in the offset compensator 1b, since amplifier Din2 does not need to have the same output dc voltage bias as the preamplifier, and an absolute value such as gain=0.5 in amplifier Din2 is not required, practical operation is not greatly restricted even in the direction in which the output potential is lower than the input bias voltage. The offset compensator 1b can therefore be easily implemented in an IC.

As described above, embodiment 1B has the following effects regarding the offset compensator 1b.

(1) If the offset voltage to be compensated for is not very large, the emitter sink current Is2 in amplifier Din2 can be decreased, thereby lowering power consumption.

(2) Since amplifier Din2 generates a substantially direct-current output voltage, a capacitor or a low pass filter can be added on the output side of amplifier Din2 (as in embodiment 1C described below), thereby reducing noise.

(3) Effect (2) can improve the minimum receiving level characteristic of the optical receiving circuit.

(4) Since amplifier Din2 does not need to have the same output dc voltage bias as the preamplifier, and an absolute value such as gain=0.5 is not required in amplifier Din2, practical operation is not greatly restricted even in the direction in which the output potential is lower than the input bias voltage. IC implementation is therefore facilitated.

Embodiment 1C

Figure 11:
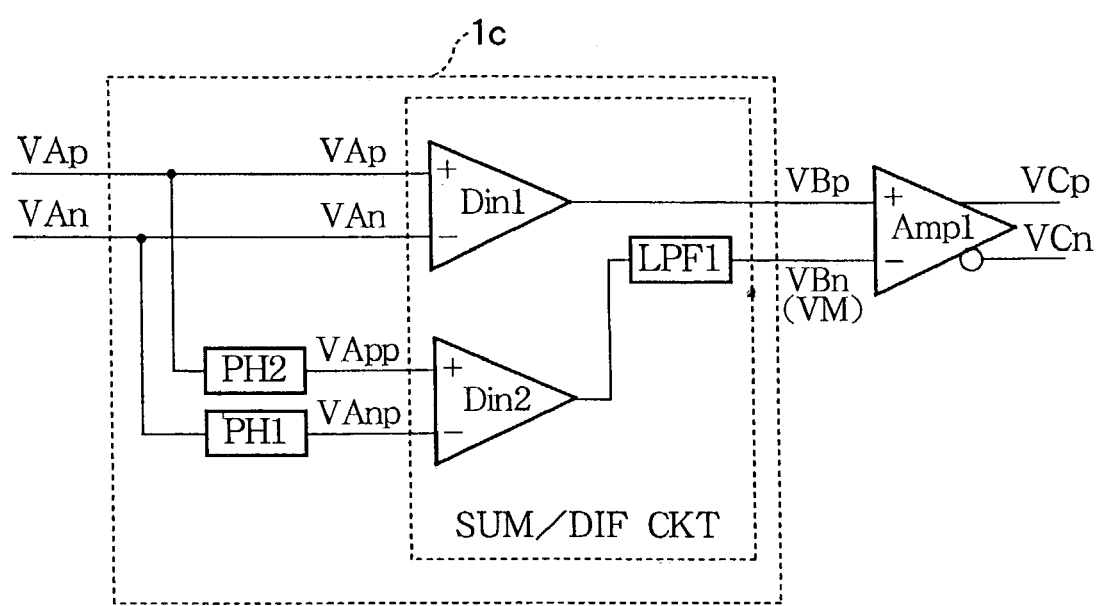
FIG. 11 shows the structure of a main amplifier in embodiment 1C of the present invention.
Figure 12:
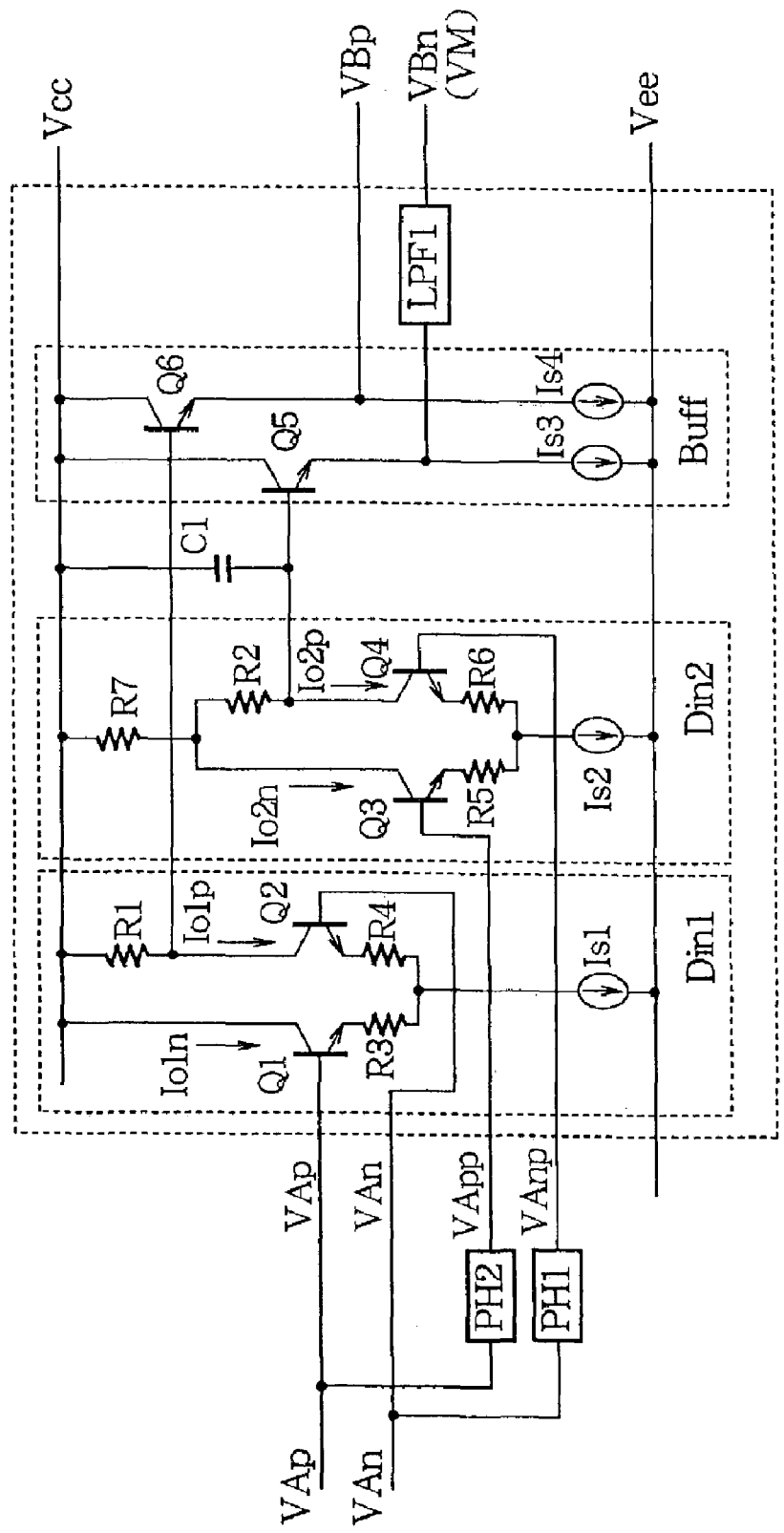
FIG. 12 is a circuit diagram of the offset compensator in FIG. 11.

FIG. 11 shows the main amplifier structure in embodiment 1C, using the same reference characters as in FIG. 9 for similar elements. The main amplifier in embodiment 1C comprises a differential amplifier Amp1 and an offset compensator 1c. The offset compensator 1c includes an analog summing and differencing circuit comprising a pair of amplifiers Din1, Din2 and a low pass filter LPF1. FIG. 12 shows an example of the circuit configuration of the offset compensator 1c, using the same reference characters as in FIG. 10 for similar elements. The offset compensator 1c differs from the offset compensator 1b in embodiment 1B (FIG. 9) by the presence of the low pass filter LPF1 and the presence of a capacitor C1 in the output stage of amplifier Din2.

The low pass filter LPF1 is inserted in the signal line of the buffered output signal VBn of amplifier Din2. The capacitor C1 is inserted between the signal line of the unbuffered output of amplifier Din2 and the power supply that functions as an effective ground (Vcc in this case). Accordingly, capacitor C1 is coupled between the base electrode of buffer transistor Q5 and the Vcc power supply. The addition of capacitor C1 and low pass filter LPF1 reduces noise in the VBn signal.

The capacitor C1 and low pass filter LPF1 can be added to the output stage of amplifier Din2 because this amplifier generates a substantially direct-current output voltage waveform, which is not degraded by the presence of the capacitor C1 and low pass filter LPF1. Embodiment 1C is useful when the amplitude level of the VBp component is small and noise reduction in the VBn component is therefore required.

In a variation of embodiment 1C, only one of the two circuit elements C1 and LPF1 is present. Noise reduction is still achieved.

Embodiments 2A, 2B, 2C

The main amplifier in embodiments 2A–2C adds a low pass filter to the input stage of at least one of the peak-hold circuits in the offset compensator. This low pass filter can be added to a conventional main amplifier circuit or to one of the main amplifiers in embodiments 1A–1C.

Embodiment 2A

Figure 13:
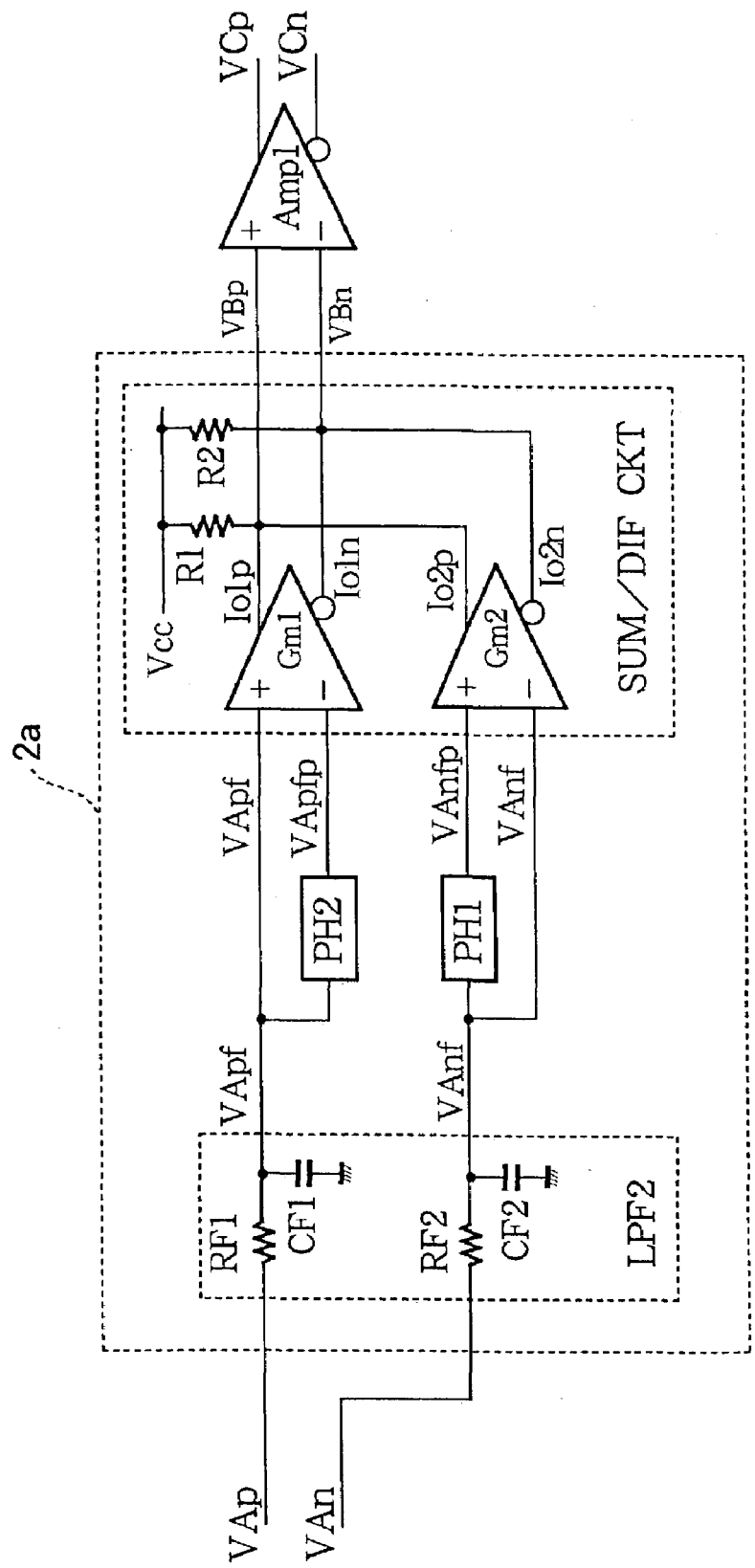
FIG. 13 shows the structure of a main amplifier in embodiment 2A of the present invention.

FIG. 13 shows the main amplifier structure in embodiment 2A. This main amplifier comprises an offset compensator 2a and a differential amplifier Amp1. The offset compensator 2a includes a pair of peak-hold circuits PH1, PH2 and an analog summing and differencing circuit. The analog summing and differencing circuit includes a pair of amplifiers Gm1, Gm2 with differential voltage input and differential current output, and a pair of resistors R1, R2. These circuit elements are interconnected in the same way as in the conventional main amplifier in FIG. 53.

The offset compensator 2a differs from the conventional offset compensator 101b in FIG. 53 by including a dual low pass filter LPF2 in its input stage. The dual low pass filter LPF2 includes a pair of resistors RF1, RF2 and a pair of capacitors CF1, CF2. The low pass filter formed by resistor RF1 and capacitor CF1 removes high frequency components exceeding the necessary signal band of the positive differential voltage VAp and outputs a positive filtered differential voltage VApf to peak-hold circuit PH2 and amplifier Gm1. The low pass filter formed by resistor RF2 and capacitor CF2 removes high frequency components exceeding the necessary signal band of the negative differential voltage VAn and outputs a negative filtered differential voltage VAnf to peak-hold circuit PH1 and amplifier Gm2.

Figure 14A:
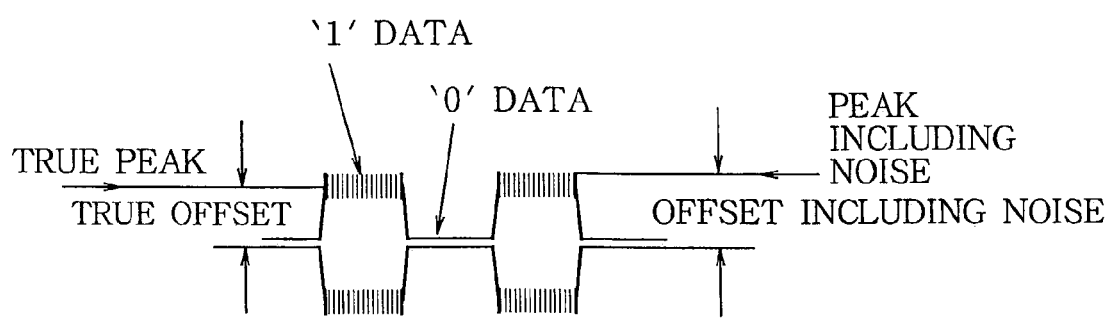
FIGS. 14A, 14B, and 14C show waveforms in the main amplifier in embodiment 2A.
Figure 14B:
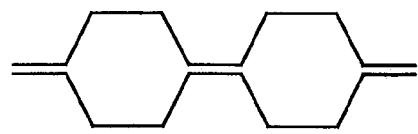
Figure 14C:

FIGS. 14A, 14B, and 14C show waveforms in the main amplifier in embodiment 2A. FIG. 14A shows waveforms of the differential voltages VAp, VAn input to the offset compensator 2a. FIG. 14B shows waveforms of the filtered differential voltages VApf, VAnf output from the low pass filter LPF2. FIG. 14C shows waveforms of the differential voltages VBp, VBn output from the offset compensator 2a.

Photoelectric current flows in the photodetector PD (cf. FIG. 1) in the optical receiving circuit during light-receiving periods (while receiving '1' data), and does not flow during extinction periods (while receiving '0' data or no optical signal). Accordingly, as shown in FIG. 14A, the waveforms of the differential voltages VAp, VAn output from the preamplifier and input to the offset compensator 2a include more output noise during the reception of '1' data, when photoelectric current flows in the photodetector PD, than during the reception of '0' data, when photoelectric current does not flow in the photodetector PD.

Since the low pass filter LPF2 removes high frequency components outside the necessary signal band, it removes much of the noise included in the differential input voltages VAp, VAn input to the offset compensator 2a mainly during light-receiving periods (while receiving '1' data). After the waveform in FIG. 14A has passed through the low pass filter LPF2, it therefore appears as shown in FIG. 14B. The rise and fall times of the waveform may be lengthened, depending on the setting of the passband of the low pass filter LPF2.

After the offset compensator 2a compensates for the offset of the waveform in FIG. 14B, from which high frequency components (noise components) have been removed by the low pass filter LPF2, a completely offset-compensated and substantially noise-free waveform is obtained, as shown in FIG. 14C. The waveform in FIG. 14C has a more consistently open eye pattern than the conventional waveform in FIG. 64C, and thus provides a greater noise margin for '1' or '0' data decisions.

As described above, embodiment 2A has the following effects regarding the offset compensator 2a.

(1) As shown in FIG. 14C, a noise-free waveform with complete offset compensation can be obtained.
(2) Effect (1) provides a more open eye pattern (thus a greater noise margin for '1'/'0' decisions).
(3) Effect (2) can improve the minimum receiving level characteristic of an optical receiving circuit.

Embodiment 2B

Figure 15:
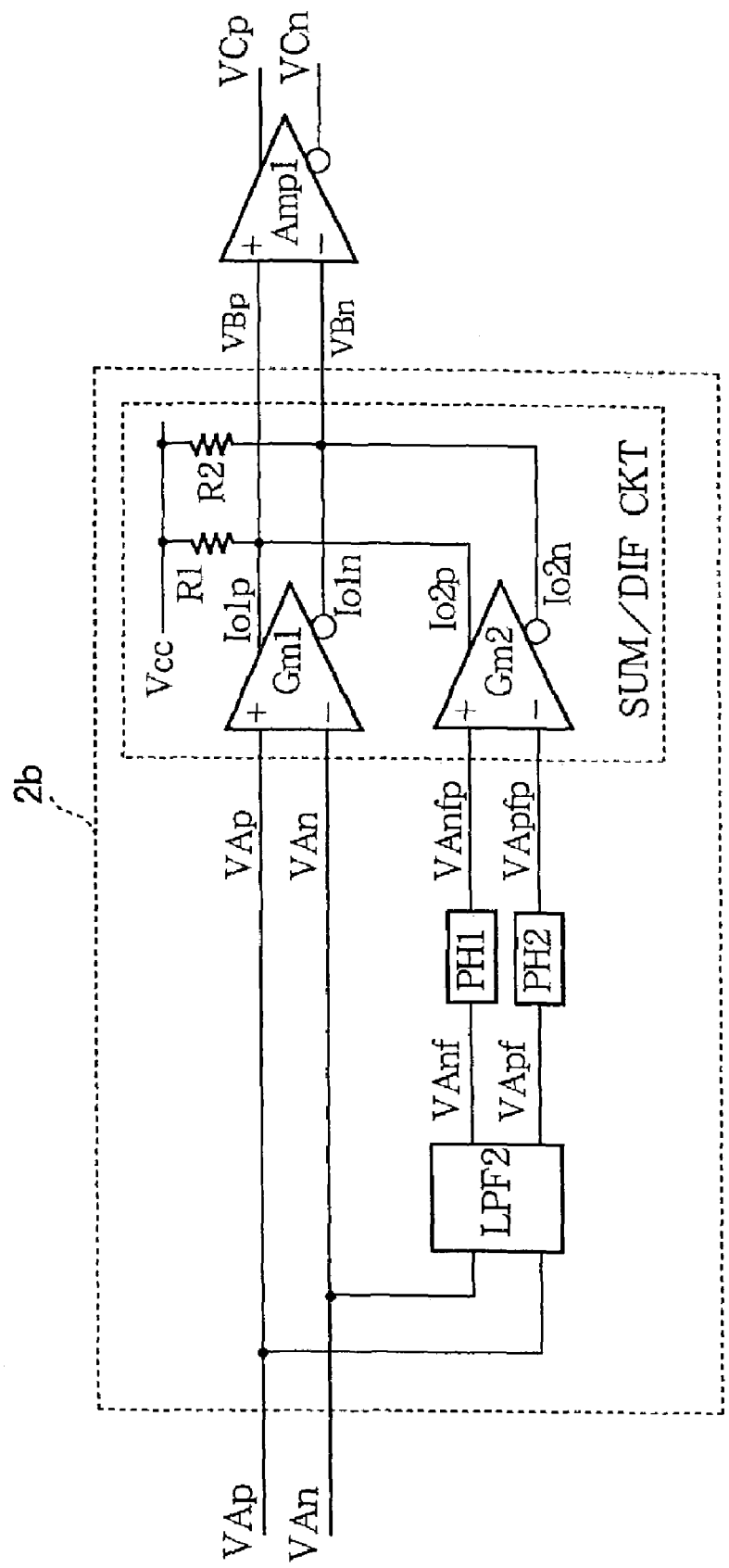
FIG. 15 shows the structure of a main amplifier in embodiment 2B of the present invention.

FIG. 15 shows the main amplifier structure in embodiment 2B, using the same reference characters as in FIG. 5 or FIG. 13 for similar elements. The main amplifier in embodiment 2B comprises an offset compensator 2b and a differential amplifier Amp1. The offset compensator 2b includes a pair of peak-hold circuits PH1, PH2 and an analog summing and differencing circuit. The analog summing and differencing circuit includes a pair of amplifiers Gm1, Gm2 with differential voltage input and differential current output, and a pair of resistors R1, R2. These circuit elements are interconnected in the same way as in embodiment 1A (FIG. 5).

The offset compensator 2b differs from the offset compensator 1a in embodiment 1A by including a dual low pass filter LPF2 (cf. FIG. 13) in the input stage of peak-hold circuits PH1, PH2.

Figure 16A:
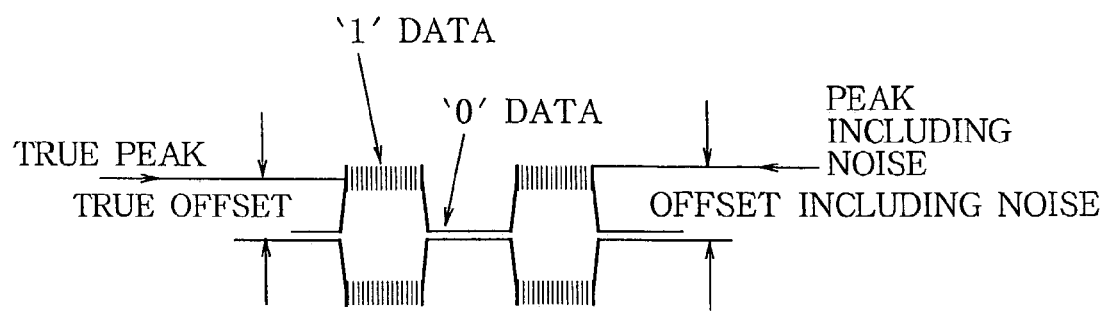
FIGS. 16A, 16B, 16C, and 16D show waveforms in the main amplifier in embodiment 2B.
Figure 16B:
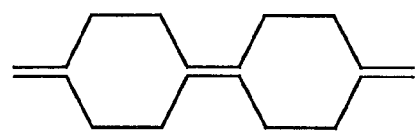
Figure 16C:
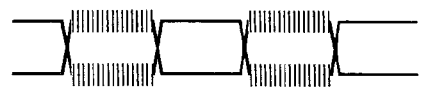
Figure 16D:
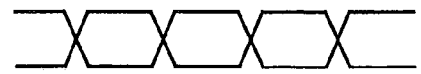

FIGS. 16A, 16B, 16C, and 16D show waveforms in the main amplifier in embodiment 2B. FIG. 16A shows waveforms of the differential voltages VAp, VAn input to the offset compensator 2b. FIG. 16B shows waveforms of the filtered differential voltages VApf, VAnf output from the low pass filter LPF2. FIG. 16C shows waveforms of the differential voltages VBp, VBn output from the offset compensator 2b. FIG. 16D shows waveforms in which high frequency components (noise components) have been removed from the waveforms in FIG. 16C by an additional low pass filter, not shown in FIG. 15.

Figure 64A:
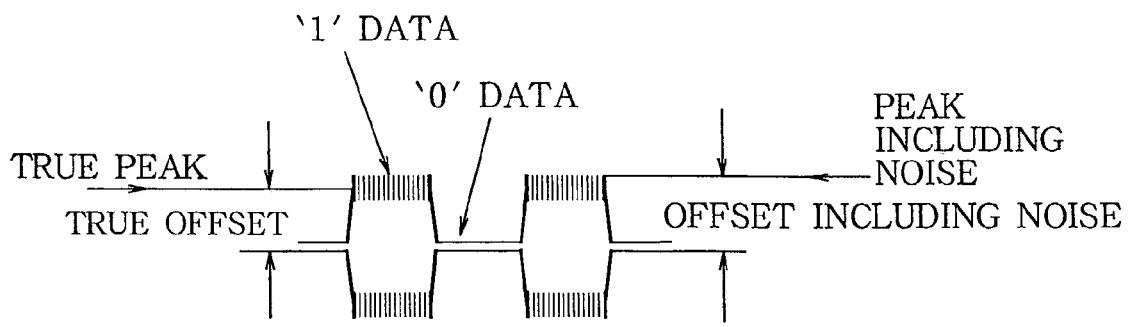
FIGS. 64A, 64B, and 64C show waveforms in a conventional main amplifier.
Figure 64B:
Figure 64C:
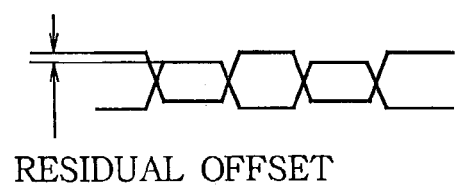

After the low pass filter LPF2 removes high frequency components outside the necessary signal band from the differential voltages VAp, VAn input to peak-hold circuits PH1, PH2 as shown in FIG. 16B, two peak-hold values VApfp, VAnfp without high frequency noise are obtained. The difference between the two peak values VApfp and VAnfp is exactly the offset value between the differential voltages VAp, VAn input from the preamplifier. After offset compensation of the differential input voltages VAp, VAn using the peak-hold values VApfp, VAnfp, the waveforms shown in FIG. 16C are obtained. Even after noise components have been removed from the conventional waveforms in FIG. 64B by a low pass filter, the dc offset due to the noise components persists unnecessarily as shown in FIG. 64C, but after noise components have been removed from the waveform in FIG. 16C by a low pass filter, a completely offset-compensated waveform is obtained, as shown in FIG. 16D. The waveforms in FIGS. 16C and 16D have more open eye patterns than the conventional waveforms in FIGS. 64B and 64C, and thus provide greater noise margins for '1' or '0' data decisions.

In embodiment 2B, the differential voltages VAp, VAn input to amplifiers Gm1 as variable components do not pass through the low pass filter LPF2, thereby preventing the rise and fall times of the offset-compensated output from being lengthened as in embodiment 2A.

As described above, embodiment 2B has the same effects regarding the offset compensator 2b as seen in embodiment 2A.
(1) As shown in FIG. 16C, a completely offset-compensated waveform can be obtained.
(2) Effect (1) provides a more open eye pattern (thus a greater noise margin for '1'/'0' decisions).
   (3) Effect (2) can improve the minimum receiving level characteristic of an optical receiving circuit.

Embodiment 2C

Figure 17:
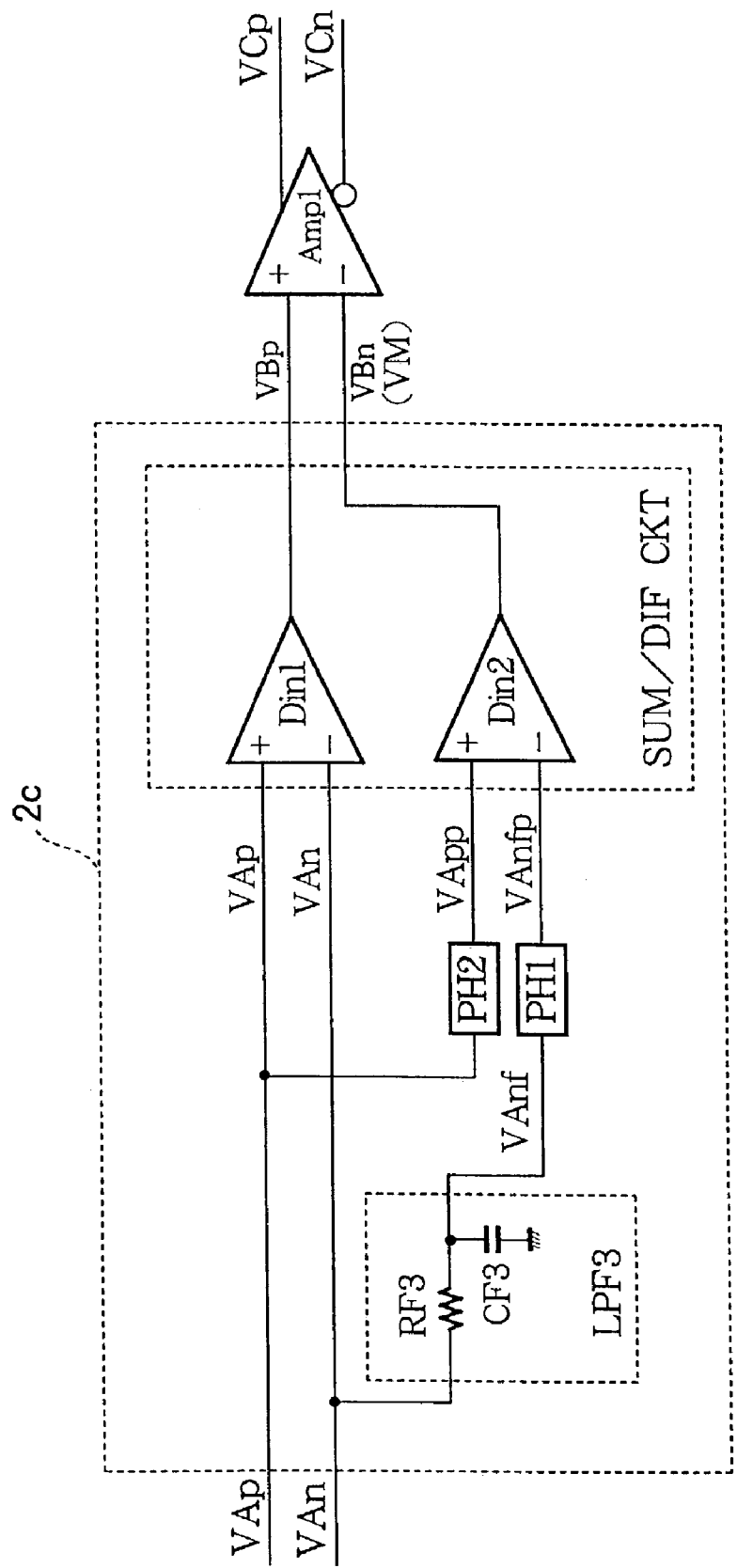
FIG. 17 shows the structure of a main amplifier in embodiment 2C of the present invention.

FIG. 17 shows the main amplifier structure in embodiment 2C, using the same reference characters as in FIG. 9 for similar elements. The main amplifier in embodiment 2C comprises an offset compensator 2c and a differential amplifier Amp1. The offset compensator 2c includes a pair of peak-hold circuits PH1, PH2, a low pass filter LPF3, and an analog summing and differencing circuit comprising a pair of amplifiers Din1, Din2 with differential voltage input and single-ended voltage output.

The offset compensator 2c differs from the offset compensator 1b in embodiment 1B (FIG. 9) by the presence of the low pass filter LPF3, comprising a resistor RF3 and a capacitor CF3, in the input stage of one of the peak-hold circuits PH1, PH2 (peak-hold circuit PH1 in this case). The low pass filter LPF3 removes high frequency components outside the necessary signal band of the negative differential voltage VAn and outputs a negative filtered differential voltage VAnf to peak-hold circuit PH1.

Of the two peak-hold circuits PH1, PH2, peak-hold circuit PH1 is the one in which noise has an effect on the peak value during light-receiving periods (during reception of '1' data). The low pass filter LPF3 removes high frequency components outside the necessary signal band of the negative differential input voltage VAn and outputs a negative filtered differential voltage VAnf to peak-hold circuit PH1. Accordingly, the difference between peak-hold voltage VApp and the filtered peak-hold voltage VAnfp accurately indicates the offset value between the differential voltages VAp, VAn input from the preamplifier. An output waveform similar to the one obtained from the offset compensator 2b in embodiment 2B, shown in FIG. 16C, is obtained from the offset compensator 2c in embodiment 2C.

The low pass filter LPF3 in the offset compensator 2c in embodiment 2C, however, has a simpler circuit configuration than the dual low pass filter LPF2 (cf. FIG. 13) in the offset compensator 2b in embodiment 2B.

As described above, embodiment 2C has the same effects regarding the offset compensator 2c as seen in embodiments 2A and 2B.
(1) As shown in FIG. 16C, a completely offset-compensated waveform can be obtained.
(2) Effect (1) provides a more open eye pattern (thus a greater noise margin for '1'/'0' decisions).
(3) Effect (2) can improve the minimum receiving level characteristic of the optical receiving circuit.

Embodiments 3A, 3B

The main amplifiers in embodiments 3A, 3B add resistors or constant-current sources for discharging the capacitors that hold charges in the peak-hold circuits in the offset compensator. The resistors or constant-current sources can be added to a conventional main amplifier circuit or to one of the main amplifiers in embodiments 1A–1C and 2A–2C.

Embodiment 3A

Figure 18:
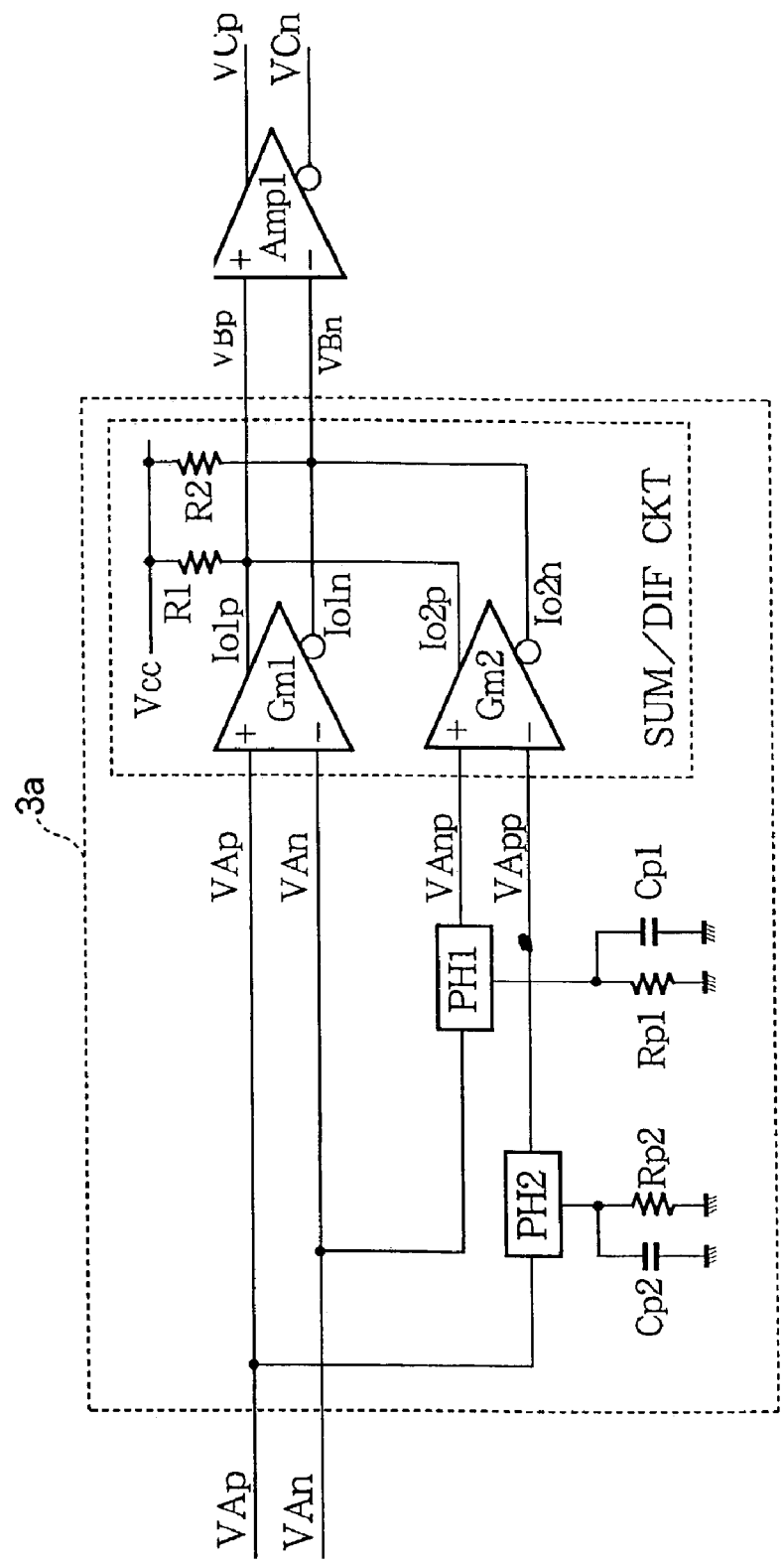
FIG. 18 shows the structure of a main amplifier in embodiment 3A of the present invention.

FIG. 18 shows the main amplifier structure in embodiment 3A. This main amplifier comprises an offset compensator 3a and a differential amplifier Amp1. The offset compensator 3a includes a pair of peak-hold circuits PH1, PH2 and an analog summing and differencing circuit. Peak-hold circuits PH1, PH2 include a pair of capacitors Cp1, Cp2. The analog summing and differencing circuit includes a pair of amplifiers Gm1, Gm2 with differential voltage input and differential current output, and a pair of resistors R1, R2. These circuit elements are interconnected in the same way as in the offset compensator 1a in embodiment 1A (FIG. 5). The main amplifier in embodiment 3A receives differential voltages VAp, VAn from, for example, the preamplifier in FIG. 2B or FIG. 2C.

The offset compensator 3a differs from the offset compensator 1a in embodiment 1A by adding resistors Rp1, Rp2 to discharge the capacitors Cp1, Cp2 that hold the charges indicating peak voltages in the peak-hold circuits PH1, PH2.

In the output of a preamplifier, such as the one in FIG. 2B or 2C, that amplifies a pulse signal with capacitive coupling in the signal amplification system, the dc level (mean value) of the output varies according to the time-variable probability of appearance '0' or '1' in the amplified pulse signal.

In the offset compensator 3a, the discharge time constants of capacitor Cp1 and resistor Rp1 (Cp1×Rp1) and capacitor Cp2 and resistor Rp2 (Cp2×Rp2) are set to be larger than the maximum duration of a successive run of '0' information (or a successive run of '1' information), and to be smaller than the time constant of the dc level variation of the output from the preamplifier.

With this setting, the peak-hold outputs from peak-hold circuits PH1, PH2 can track gradual decreases of the dc level (mean value) of the output from the preamplifier. Offset compensation by the offset compensator 3a in embodiment 3A differs from offset compensation by the offset compensator 1a in embodiment 1A in that, by tracking variations in the dc level (mean value) of the output from the preamplifier, it compensates for these variations, and regenerates a differential voltage in which the pulse signals have equal '0' and '1' width per unit time.

If many main amplifiers are included in embodiment 3A, the main amplifiers can be capacitively coupled, so matching of the dc level between the main amplifiers is not required. In general, a preamplifier with capacitive coupling, which can be used in embodiment 3A, can be implemented with a simple circuit configuration having a small number of circuit elements and consuming only a small amount of power.

The main amplifier in embodiment 3A can be used to obtain an offset-compensated balanced differential signal from an unbalanced signal including dc level variations not only in optical communication, but also in circuits for receiving a pulse signal transmitted on an unbalanced transmission line such as a coaxial cable.

As described above, embodiment 3A has the following effects regarding the main amplifier and the offset compensator 3a.

(1) Offset compensation is performed so that even variations in the dc level (mean value) of the output from the preamplifier are compensated for.
(2) In multistage amplification, all the main amplifiers can be capacitively coupled, enabling the use of a simple amplifier circuit such as an unbalanced amplifier or an amplifier with capacitive coupling.
(3) By use of a simple amplifier, power consumption can be lowered.
(4) The main amplifier can be used to obtain an offset-compensated balanced differential signal from an unbalanced signal including dc level variations, not only in optical communications, but also in pulse transmission receiving circuits connected to an unbalanced transmission line such as a coaxial cable.

Embodiment 3B

Figure 19:
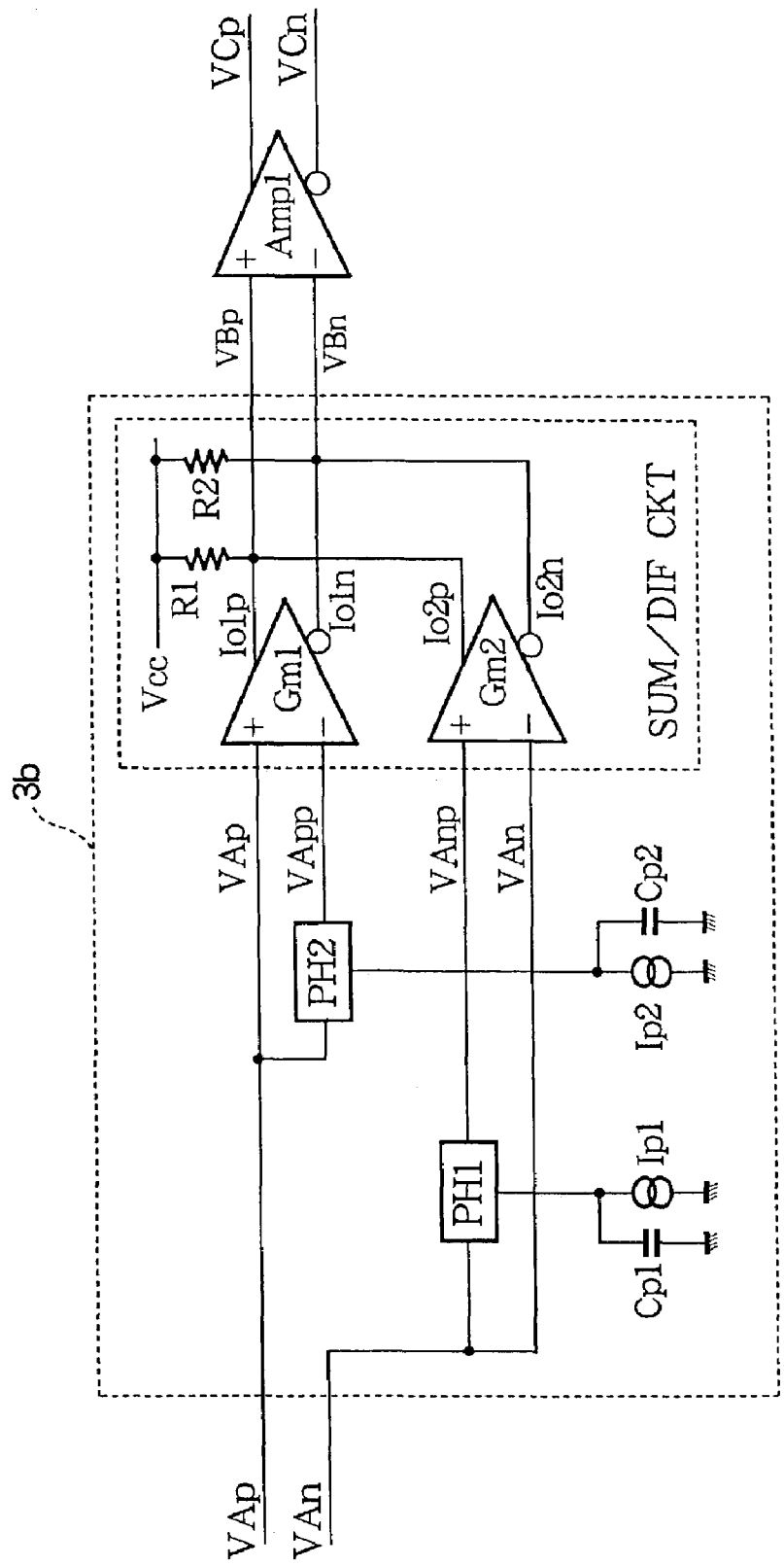
FIG. 19 shows the structure of a main amplifier in embodiment 3B of the present invention.

FIG. 19 shows the main amplifier structure in embodiment 3B. This main amplifier comprises an offset compensator 3b and a differential amplifier Amp1. The offset compensator 3b includes a pair of peak-hold circuits PH1, PH2 and an analog summing and differencing circuit. Peak-hold circuits PH1, PH2 include a pair of capacitors Cp1, Cp2. The analog summing and differencing circuit includes a pair of amplifiers Gm1, Gm2 with differential voltage input and differential current output, and a pair of resistors R1, R2. These circuit elements are interconnected in the same way as in the offset compensator 3a in embodiment 3A (FIG. 18) or in the conventional offset compensator 101b (FIG. 53).

The offset compensator 3b differs from the conventional offset compensator 101b by adding constant-current sources Ip1, Ip2 to discharge the capacitors Cp1, Cp2 that hold the charges of the peak-hold circuits PH1, PH2. The constant-current sources Ip1, Ip2 provide an effect similar to that of resistors Rp1, Rp2 in embodiment 3A.

In the offset compensator 3b, as in embodiment 3A, the discharge time constants of capacitor Cp1 and constant-current source Ip1, and capacitor Cp2 and constant-current source Ip2, are set to be larger than the maximum duration of a successive run of '0' information (or a successive run of '1' information), and to be smaller than the time constant of the dc level variation of the output from the preamplifier.

With this setting, the peak-hold outputs from peak-hold circuits PH1, PH2 can track gradual decreases of the dc level (mean value) of the output from the preamplifier. Offset compensation by the offset compensator 3b in embodiment 3B differs from offset compensation by the offset compensator 1a in embodiment 1A in that, by tracking variations in the dc level (mean value) of the output from the preamplifier, it compensates for these variations, and regenerates a differential voltage in which the pulse signals have equal '0' and '1' width per unit time.

If many main amplifiers are included in embodiment 3B, then as in embodiment 3A, the main amplifiers can be capacitively coupled, so matching of the dc level between the main amplifiers is not required, and the preamplifier can be implemented with a simple circuit configuration having a small number of circuit elements and consuming only a small amount of power.

The main amplifier in embodiment 3B, like the main amplifier in embodiment 3A, can be used to obtain an offset-compensated balanced differential signal from an unbalanced signal including dc level variations not only in optical communication, but also in circuits for receiving a pulse signal transmitted on an unbalanced transmission line such as a coaxial cable.

As in embodiment 3A, embodiment 3B has the following effects regarding the main amplifier and the offset compensator 3a.

(1) Offset compensation is performed so that even variations in the dc level (mean value) of the output from the preamplifier are compensated for.
(2) In multistage amplification, all the main amplifiers can be capacitively coupled, enabling the use of a simple amplifier circuit such as an unbalanced amplifier or an amplifier with capacitive coupling.
(3) By use of a simple amplifier, power consumption can be lowered.
(4) The main amplifier can be used to obtain an offset-compensated balanced differential signal from an unbalanced signal including dc level variations, not only in optical communications, but also in pulse transmission receiving circuits connected to an unbalanced transmission line such as a coaxial cable.

Embodiments 4A, 4B, 4C, 4D

Figure 20:
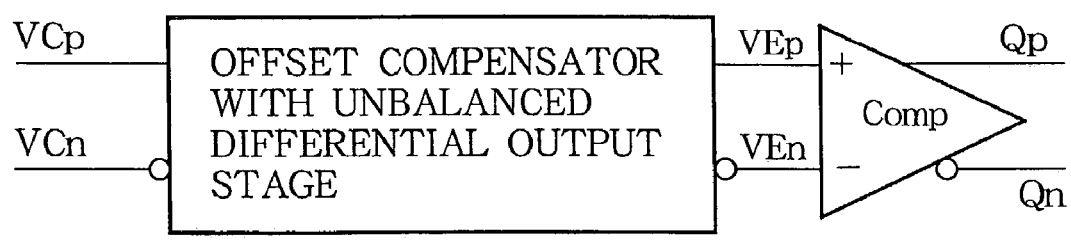
FIG. 20 shows the general structure of the level discrimination circuit in embodiments 4A–4D of the present invention.

FIG. 20 shows the general structure of the level discrimination circuit in embodiments 4A–4D. The level discrimination circuit includes a comparator (Comp) and an offset compensator with an analog summing and differencing circuit having a differential output stage. Unbalanced circuit elements are used in the differential output stage. Consequently, when the differential input voltages VCp, VCn are substantially equal (VCp–VCn~0), a fixed offset is generated between the differential voltages VEp, VEn output from the offset compensator.

Embodiment 4A

Figure 21:
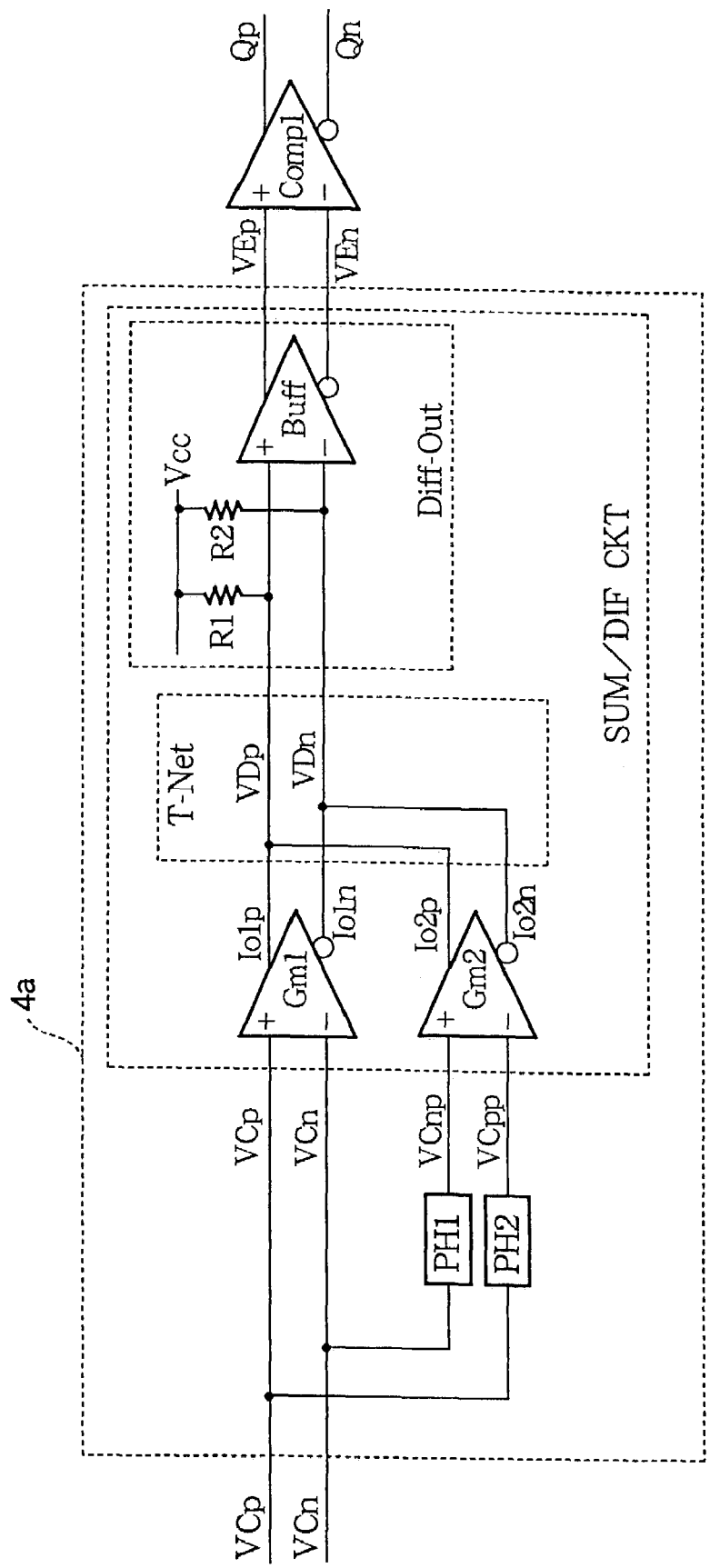
FIG. 21 shows the structure of the level discrimination circuit in embodiment 4A.
Figure 22:
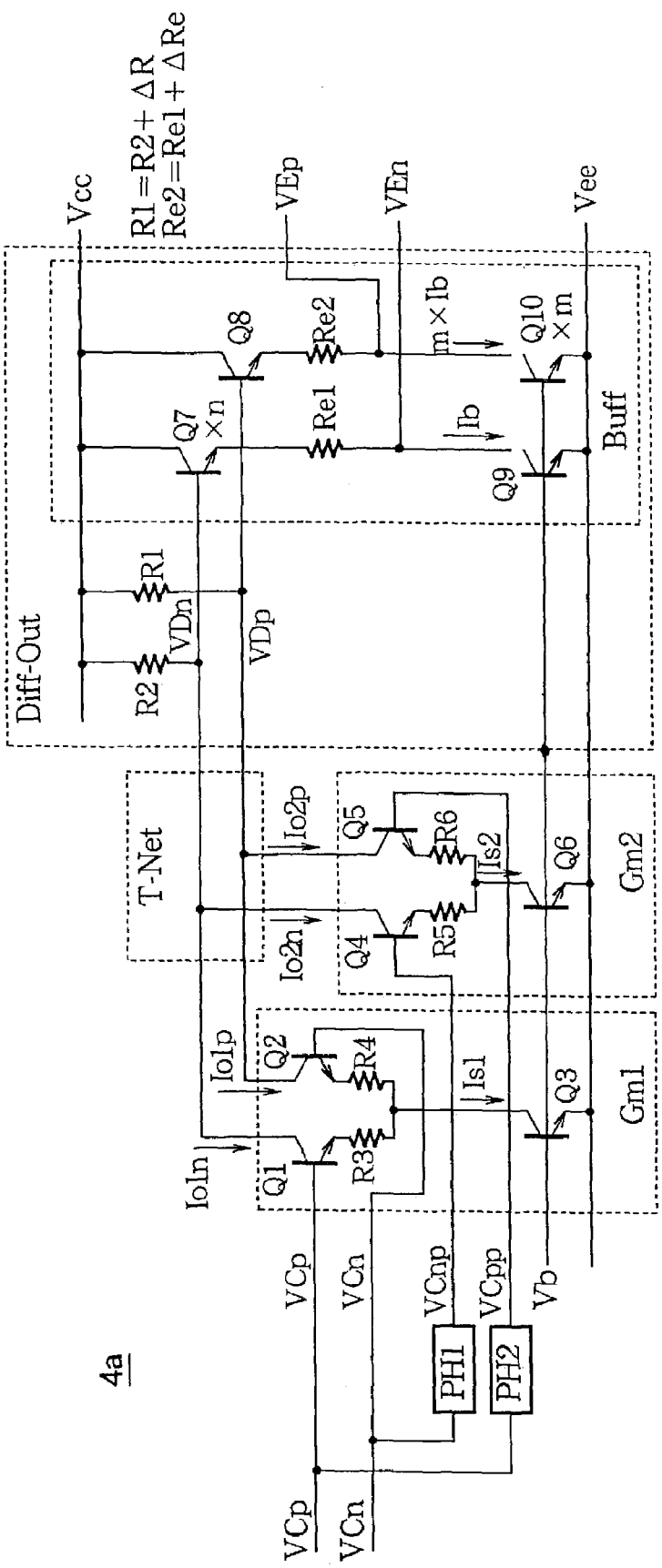
FIG. 22 is a circuit diagram of the offset compensator in FIG. 21.
Figure 56:
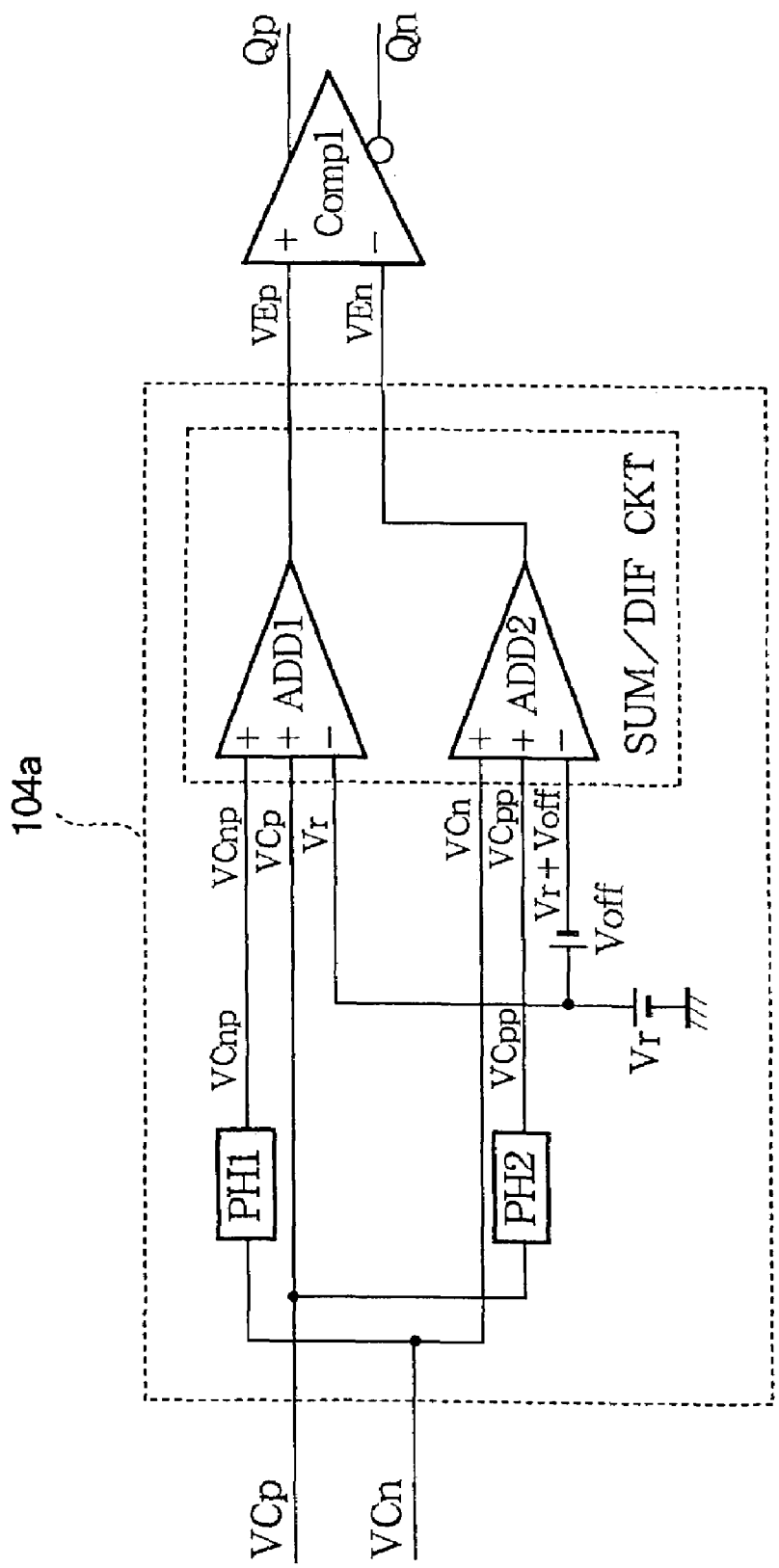
FIG. 56 shows the structure of a conventional level discrimination circuit described in U.S. Pat. No. 6,151,150.

FIG. 21 shows the structure of the level discrimination circuit in embodiment 4A, using the same reference characters as in FIG. 5 or FIG. 56 for similar elements. This level discrimination circuit comprises an offset compensator 4a and a comparator Comp1. The offset compensator 4a includes a pair of peak-hold circuits PH1, PH2 and an analog summing and differencing circuit. The analog summing and differencing circuit includes a pair of amplifiers Gm1, Gm2 with differential voltage input and differential current output, and a differential output stage (Diff-Out) having a pair of resistors R1, R2 and a buffer circuit (Buff). FIG. 22 shows an example of the circuit configuration of the offset compensator 4a.

The offset compensator 4a differs from the offset compensator 1a in embodiment 1A (FIG. 5) by the presence of the buffer circuit in the differential output stage. The offset compensator 4a compensates for dc offset in the differential input voltages VCp, VCn, and outputs differential voltages VEp, VEn differing by a fixed offset value when VCp–VCn~0.

In the differential output stage of the offset compensator 4a, resistor T1 converts the sum of the positive differential currents Io1p and Io2p to a positive differential voltage VDp. Resistor R2 converts the sum of the negative differential currents Io1n and Io2n to a negative differential voltage VDn. The buffer circuit receives the positive differential voltage VDp as its non-inverting input and the negative differential voltage VDn as its inverting input, and converts the differential voltages VDp, VDn to differential voltages VEp, VEn to which the fixed offset mentioned above is added. Comparator Comp1 converts these differential voltages VEp, VEn to logic signals Qp, Qn.

In the differential output stage in FIG. 22, corresponding circuit elements in the positive and negative differential circuit phases are unbalanced by one or a combination of the following methods (a)–(d) so as to add a fixed offset Voff (Voff=VEn–VEp>0) when VCp–VCn~0 during, for example, a period of reception of successive '0' data.

(a) The resistance values of resistors R1, R2 are chosen so that R1 is larger than R2 (R1=R2+ΔR).
(b) The emitter follower transistors Q7, Q8 in the buffer circuit are sized so that transistor Q7 is n times as large as transistor Q8, where n is an integer greater than one. Alternatively, the buffer circuit includes n transistors Q7, each having the same size as transistor Q8.
(c) The current sink transistors Q9, Q10 in the buffer circuit are sized so that transistor Q10 is m times as large as transistor Q9, where m is an integer greater than one. Alternatively, the buffer circuit includes m transistors Q10, each having the same size as transistor Q9.
(d) The level shift resistors Re1, Re2 in the buffer circuit are inserted on the emitter sides of emitter follower transistors Q7, Q8, and the resistance values of resistors Re1, Re2 are chosen so that Re1 is smaller than Re2 (Re2=Re1+ΔRe).

In the offset compensator 4a, the operation of compensating for dc offset in the differential voltages VCp, VCn to obtain offset-compensated differential voltages VEp, VEn is performed in the same way as in embodiment 1A, so a description will be omitted.

The operation of adding a dc offset Voff to the differential voltages VEp, VEn so that VEn is greater than VEp during long extinction periods (e.g., successive runs of '0' data), when VCp–VCn~0, will be described below.

Amplifiers Gm1, Gm2 in the offset compensator 4a have the same circuit configuration, so the two T-network (T-Net) current sums of their differential output currents (the positive phase and the negative phase) have equal values during a long extinction period. The currents flowing through resistors R1, R2 then both have the value Is given by the equation below.

Current through resistor $R1 = $ current through resistor $R2 = (Is1 + Is2)/2 = Is$ If the resistance values of resistors R1, R2 are chosen so that R1=R2+ΔR as in method (a), the voltage drop across resistor R1 is ΔR×Is greater than the voltage drop across resistor R2. This voltage difference produces an identical difference between the outputs VEp, VEn from the offset compensator 4a, so the outputs from comparator Comp1 are Qp='0' and Qn='1'.

If the emitter follower transistors Q7, Q8 in the buffer circuit are sized so that transistor Q7 is n times as large as transistor Q8 (or the buffer circuit includes n transistors Q7) as in method (b), then when the currents flowing through these two transistors Q7, Q8 have equal values, the voltage difference ΔVbe indicated in the equation below is generated between their base-emitter voltages (the base-emitter voltage Vbe of the larger transistor Q7 is smaller by ΔVbe).

$$\Delta Vbe=(k*T/q)\ln(n)$$

k: Boltzmann constant
T: absolute temperature
q: charge of the electron

This voltage difference ΔVbe produces an identical difference between the outputs VEp, VEn from the offset compensator 4a, so the outputs from comparator Comp1 are Qp='0' and Qn='1'.

If the current sink transistors Q9, Q10 in the buffer circuit are sized so that transistor Q10 is m times as large as transistor Q9 (or the buffer circuit includes m transistors Q10) as in method (c), m times as much current flows through the larger transistor Q10 as through the smaller transistor Q9. If the emitter follower transistors Q7, Q8 are equally sized, the voltage difference ΔVbe indicated in the equation below is generated between their base-emitter voltages (the base-emitter voltage Vbe of the transistor Q8 conducting the larger current is larger by □Vbe).

$$\Delta Vbe=(k \times T/q)\ln(m)$$

k: Boltzmann constant
T: absolute temperature
q: charge of the electron

This voltage difference ΔVbe produces an identical difference between the outputs VEp, VEn from the offset compensator 4a, so the outputs from comparator Comp1 are, accordingly, Qp='0' and Qn='1'.

If the level shift resistors Re1, Re2 are inserted on the emitter sides of emitter follower transistors Q7, Q8, and the resistance values of resistors Re1, Re2 are chosen so that Re1 is smaller than Re2 (Re2=Re1+ΔRe, where Re1 may be zero) as in method (d), then the voltage drop component due to the ΔRe resistance component creates an identical difference between the outputs VEp, VEn from the offset compensator 4a, and the outputs from comparator Comp1 are Qp='0' and Qn='1'.

If the relationship of the resistance values of resistors R1, R2, the size relationship of the emitter follower transistors Q7, Q8, the size relationship of the current sink transistors Q9, Q10, and the relationship of the level shift resistors Re1, Re2 are reversed, the outputs from comparator Comp1 can be Qp='1' and Qn='0'.

Two or more of the above methods (a)–(d) may be combined. Methods (a)–(d) are examples of methods that apply to the offset compensator 4a in FIG. 22; if the circuit configuration of the differential output stage is altered, so that the corresponding circuit elements in the positive and negative differential circuit phases are different, then different unbalanced circuit elements (methods) may be used.

As described above, embodiment 4A has the following effects regarding the offset compensator 4a.

(1) Special power supply circuits for generating a reference voltage Vr and an offset voltage Voff are not required.
(2) The addition and subtraction of three values as in adders ADD1, ADD2 in FIG. 56 is unnecessary. Since amplifiers Gm1, Gm2 perform subtraction on two differential input values each, their output currents can be added by forming two T-network current sums, thereby simplifying the circuit configuration.

Embodiment 4B

Figure 23:
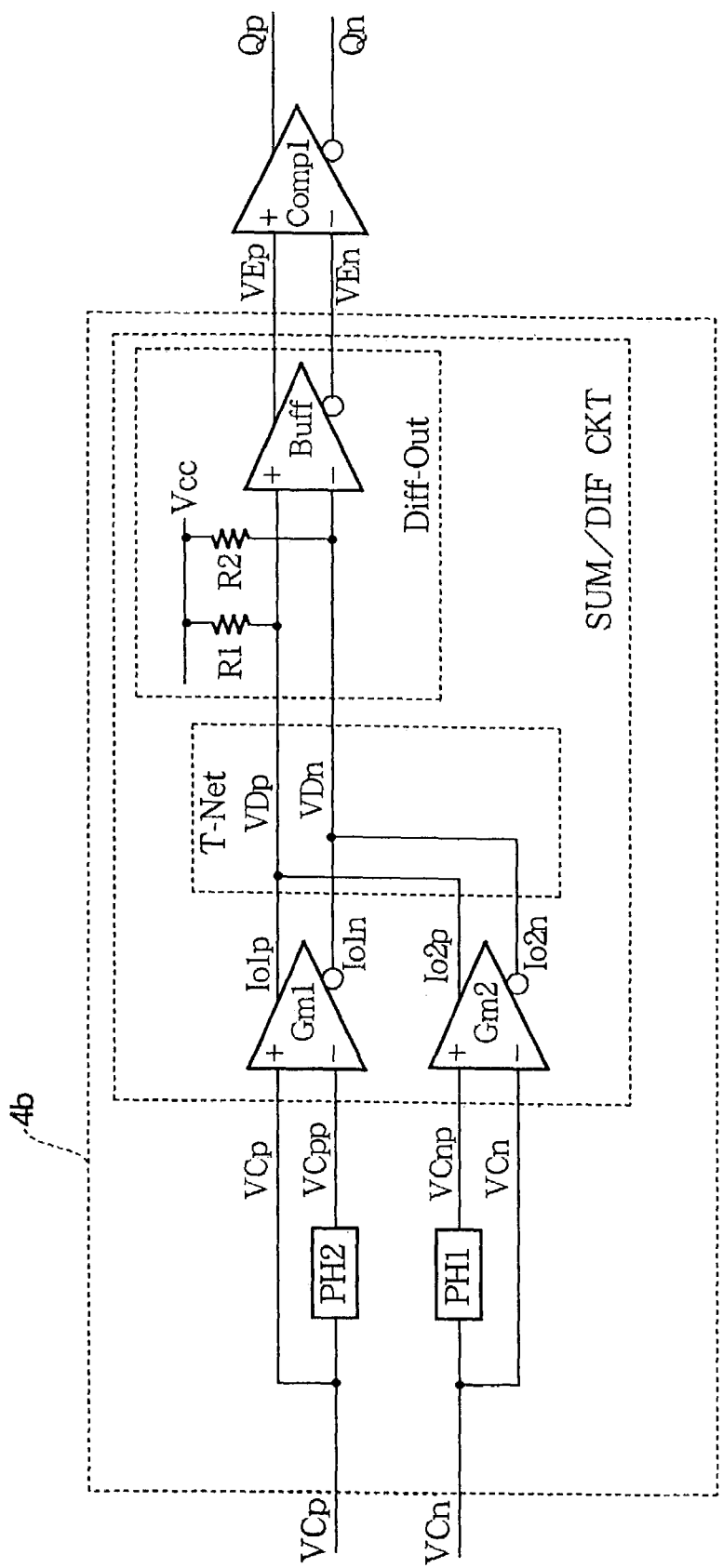
FIG. 23 shows the structure of the level discrimination circuit in embodiment 4B.

FIG. 23 shows the structure of the level discrimination circuit in embodiment 4B, using the same reference characters as in FIG. 21 or FIG. 53 for similar elements. This level discrimination circuit comprises the same circuit blocks and circuit elements as in embodiment 4A (FIG. 21), but differs in that peak-hold circuit PH1 is connected to amplifier Gm2 and peak-hold circuit PH2 is connected to amplifier Gm1, as in the conventional offset compensator 101b in FIG. 53.

The offset compensator 4b differs from the conventional offset compensator 101b (FIG. 53) by the presence of the buffer circuit in the output stage. Like the offset compensator 4a in embodiment 4A (FIG. 21), the offset compensator 4b in embodiment 4B compensates for dc offset in the differential input voltages VCp, VCn, and outputs differential voltages VEp, VEn differing by a fixed offset value when the differential input voltages VCp, VCn are substantially equal (when VCp−VCn∼0). In the differential output stage of the offset compensator 4b, corresponding circuit elements in the positive and negative differential circuit phases are unbalanced.

In the offset compensator 4b, the operation of compensating for dc offset in the differential input voltages VCp, VCn to obtain offset-compensated differential voltages VEp, VEn, and the operation of adding a dc offset Voff to the differential output voltages VEp, VEn, so that VEn is greater than VEp, are performed in the same way as in embodiment 4A.

As in embodiment 4A, embodiment 4B has the following effects regarding the offset compensator 4b.

(1) Special power supply circuits for generating a reference voltage Vr and an offset voltage Voff are not required.
(2) The circuit configuration is simplified because the addition and subtraction of three values as in adders ADD1, ADD2 in FIG. 56 is unnecessary.

Embodiment 4C

Figure 24:
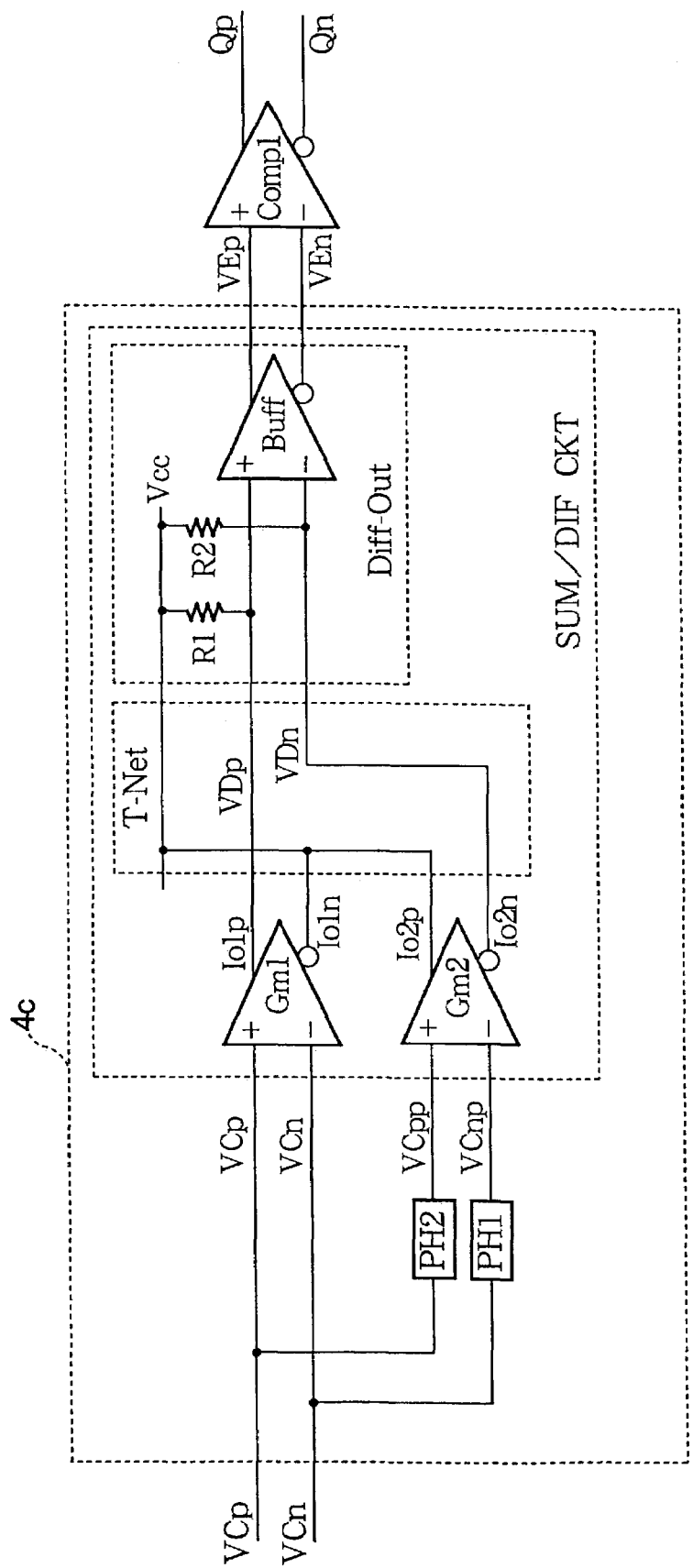
FIG. 24 shows the structure of the level discrimination circuit in embodiment 4C.
Figure 25:
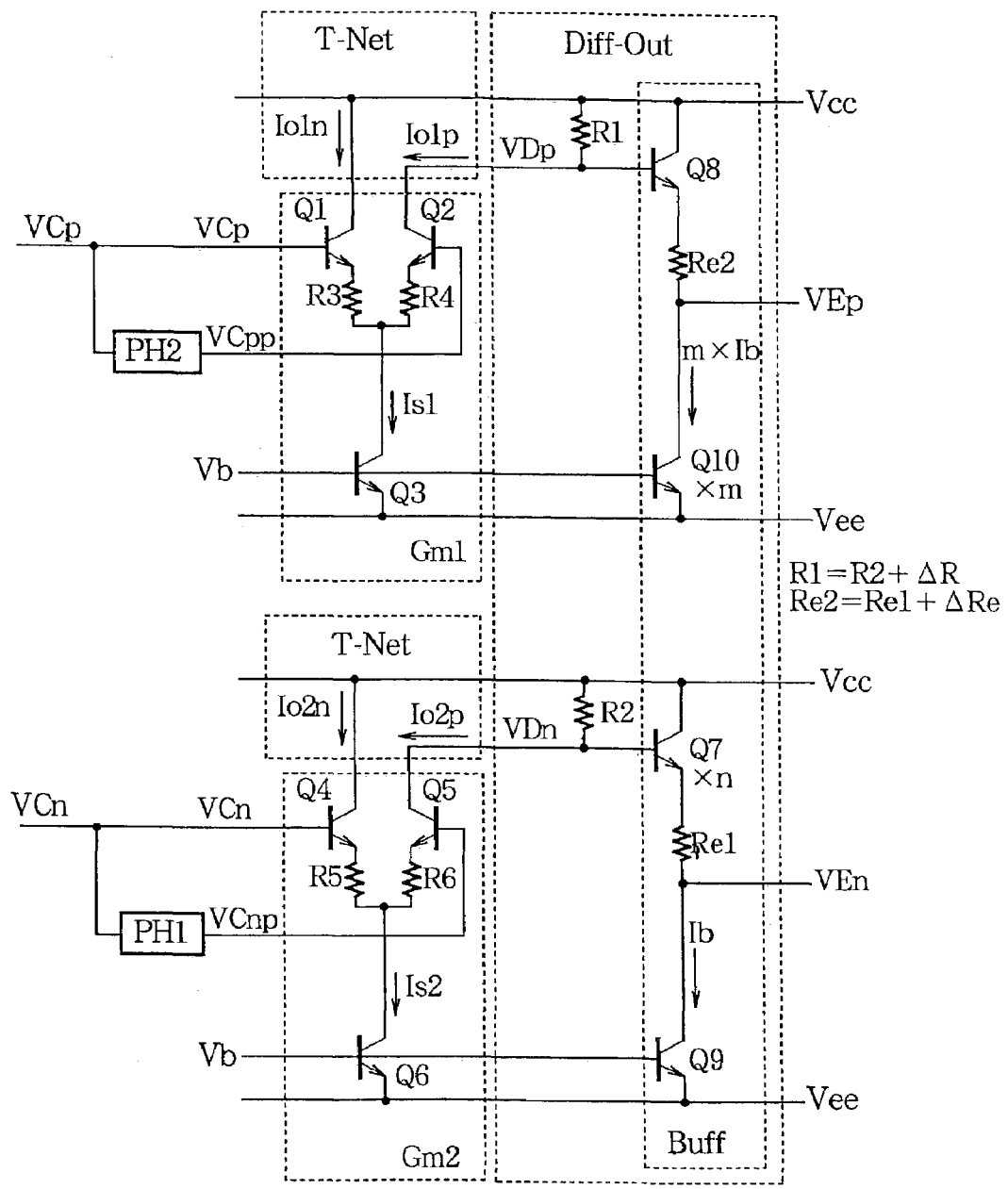
FIG. 25 is a circuit diagram of the offset compensator in FIG. 24.

FIG. 24 shows the structure of the level discrimination circuit in embodiment 4C. This level discrimination circuit is identical to the one in embodiment 4A (FIG. 21) except that the output currents of amplifiers Gm1 and Gm2 are not summed. FIG. 25 shows an example of the circuit configuration of the offset compensator 4c in the level discrimination circuit in embodiment 4C.

The offset compensator 4c differs from the offset compensator 4a in embodiment 4A (FIG. 21) by connecting the negative output terminals of amplifiers Gm1, Gm2 directly to the power supply Vcc. The offset compensator 4c, like the offset compensator 4a, compensates for dc offset in the differential input voltages VCp, VCn, and outputs differential voltages VEp, VEn having a fixed mutual offset when VCp−VCn∼0. In the differential output stage of the offset compensator 4c, corresponding circuit elements in the positive and negative differential circuit phases are unbalanced.

In the differential output stage in FIG. 25, as in the differential output stage in FIG. 22, corresponding circuit elements in the positive and negative differential circuit phases are unbalanced by one or a combination of the methods (a)–(d) described above in order to add a fixed offset Voff, where Voff=VEn−VEp>0, when VCp−VCn∼0 during, for example, a period of reception of a successive run of '0' data.

Amplifiers Gm1, Gm2 in the offset compensator 4c have the same circuit configuration, so their output currents (the positive phase and the negative phase) have equal values during a long extinction period. The currents flowing through resistors R1, R2 then both have the value Is/2 given by the equations below.

Current through resistor $R1 = Is1/2 = Is/2$

Current through resistor $R2 = Is2/2 = Is/2$

If the resistance values of resistors R1, R2 are chosen so that R1=R2+ΔR as in method (a), the voltage drop across resistor R1 is ΔR×Is/2 greater than the voltage drop across resistor R2. This voltage difference produces an identical difference between the outputs VEp, VEn from the offset compensator 4c, so the outputs from comparator Comp1 are Qp='0' and Qn='1'. In methods (b)–(d), the outputs Qp='0' and Qn='1' from comparator Comp1 are produced in the same way as in embodiment 4A.

In FIG. 24, the negative differential currents Io1n, Io2n output from amplifiers Gm1, Gm2 with differential voltage input and differential current output are connected with the power supply Vcc, but if the positive differential output currents Io1p, Io2p are connected with the power supply Vcc, and the negative differential output currents Io1n, Io2n are connected with resistors R2, R1, respectively, the same effect can be obtained.

As in embodiment 4A, embodiment 4C has the following effects regarding the offset compensator 4c.

(1) Special power supply circuits for generating a reference voltage Vr and an offset voltage Voff are not required.
(2) The circuit configuration is simplified because the addition and subtraction of three values as in adders ADD1, ADD2 in FIG. 56 is unnecessary.

Embodiment 4D

Figure 26:
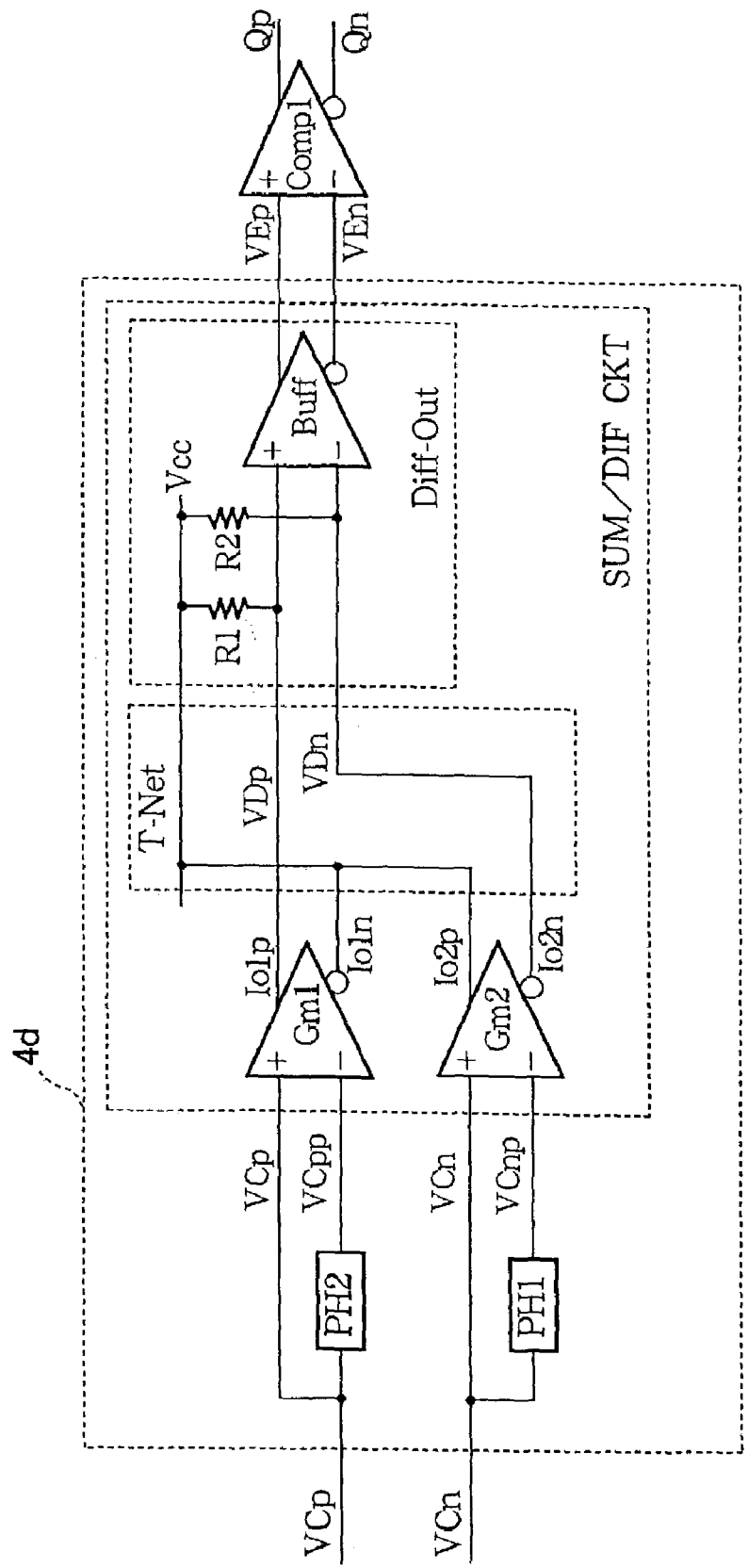
FIG. 26 shows the structure of the level discrimination circuit in embodiment 4D.

FIG. 26 shows the structure of the level discrimination circuit in embodiment 4D, using the same reference characters as in FIG. 24 or FIG. 53 for similar elements. This level discrimination circuit comprises the same circuit blocks and circuit elements as in embodiment 4C (FIG. 24), but differs in that peak-hold circuit PH1 is connected to amplifier Gm2 and peak-hold circuit PH2 is connected to amplifier Gm1, as in the conventional offset compensator 101$b$ in FIG. 53.

The offset compensator 4$d$ differs from the conventional offset compensator 101$b$ (FIG. 53) by including the buffer circuit in the output stage and connecting the positive output terminals of amplifiers Gm1, Gm2 directly to the power supply Vcc. Like the offset compensator 4$c$ in embodiment 4C (FIG. 24), the offset compensator 4$d$ compensates for dc offset in the differential input voltages VCp, VCn, and outputs differential voltages VEp, VEn having a fixed mutual offset when VCp−VCn~0. In the differential output stage of the offset compensator 4$d$, corresponding circuit elements in the positive and negative differential circuit phases are unbalanced.

In the offset compensator 4$d$, the operation of compensating for dc offset in the differential input voltages VCp, VCn to obtain offset-compensated differential voltages VEp, VEn and the operation of adding a dc offset Voff to the differential output voltages VEp, VEn, so that VEn is greater than VEp, are performed in the same way as in embodiment 4C.

As in embodiment 4C, embodiment 4D has the following effects regarding the offset compensator 4$d$.
(1) Special power supply circuits generating a reference voltage Vr and an offset voltage Voff are not required.
(2) The circuit configuration is simplified because the addition and subtraction of three values as in adders ADD1, ADD2 in FIG. 56 is unnecessary.

Embodiments 5A, 5B, 5C

Figure 27:
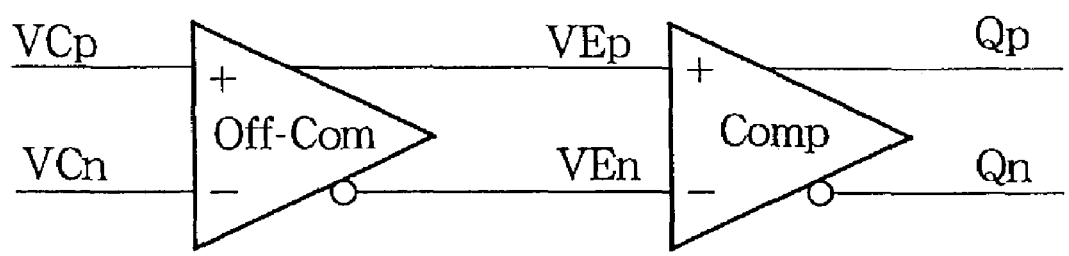
FIG. 27 shows the general structure of the level discrimination circuit in embodiments 5A–5C of the present invention.

FIG. 27 shows the general structure of the level discrimination circuit in embodiments 5A–5C. The level discrimination circuit includes a comparator (Comp) having an input-output hysteresis characteristic, and an offset compensator (Off-Com) for compensating for dc offset in the differential input voltages VCp, VCn (a conventional offset compensator or one of the offset compensators 1$a$–3$b$ in embodiments 1A–3B having balanced circuit elements in the positive and negative differential circuit phases). The comparator may have a single-ended output.

Embodiment 5A

Figure 28:
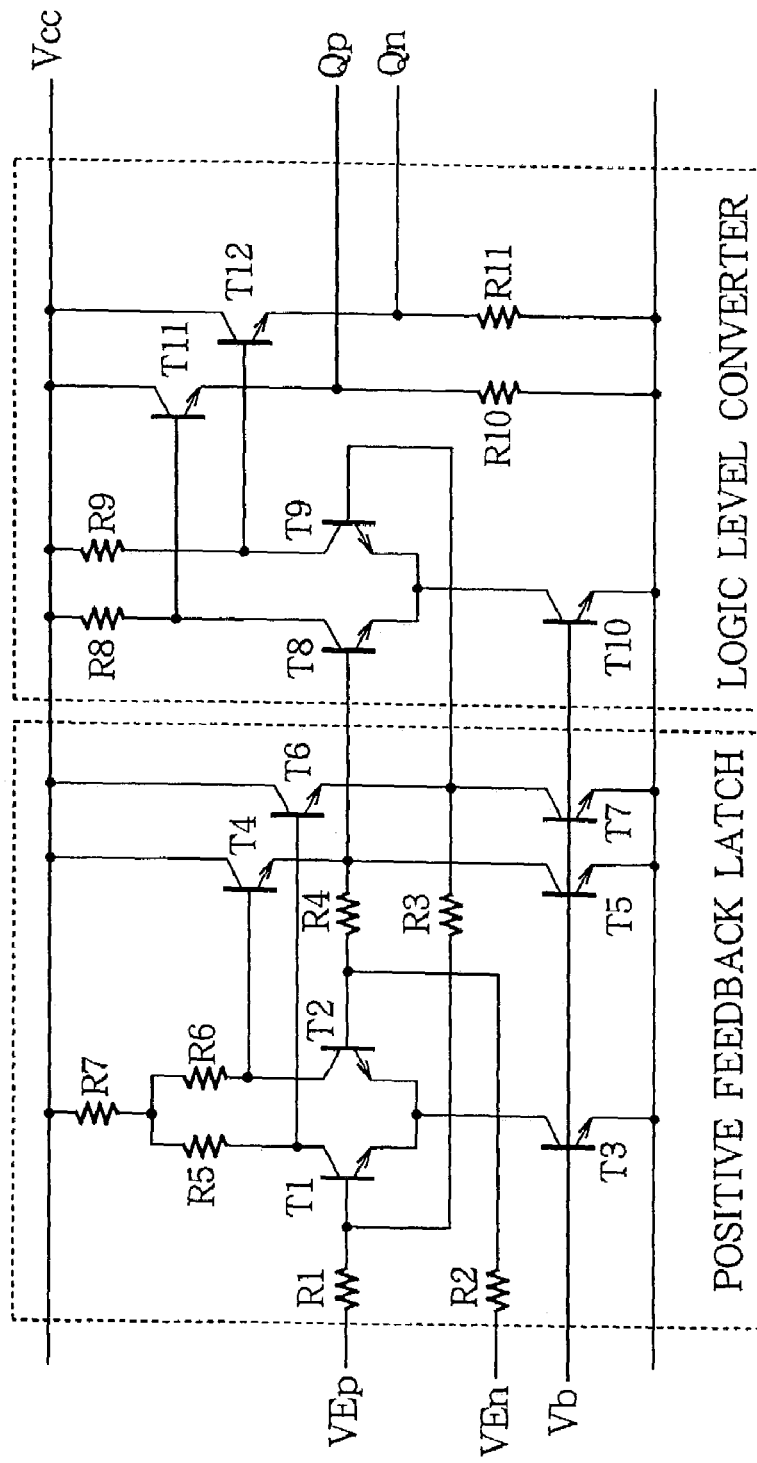
FIG. 28 is a circuit diagram of the comparator in the level discrimination circuit in embodiment 5A.

FIG. 28 shows the circuit configuration of the comparator in the level discrimination circuit in embodiment 5A. This comparator comprises a positive feedback latch, and a logic level converter.

Due to the hysteresis characteristic of the comparator in the level discrimination circuit in embodiment 5A, when the differential relationship of the input voltages VEp, VEn reverses, the output logic signals Qp, Qn maintain their existing values until the difference between the input voltages exceeds a given threshold voltage value Vth. That is, the comparator operates as a hysteresis comparator.

The hysteresis comparator operation described above takes place as follows.

When VEp is much greater than VEn (VEp>>VEn), the output signals Qp, Qn always have predetermined values. For example, Qp='1', Qn='0'

If the differential input voltages VEp, VEn change from a VEp>>VEn relationship to VEp~VEn, the output logic remains the same.

Qp='1', Qn='0'

After the differential input voltage relationship has reversed so far that VEn−VEp>Vthn, the output logic is inverted as follows.

Qp='0', Qn='1'

If the differential input voltage relationship changes from VEn−VEp>Vthn to VEp<<VEn, the output logic remains the same.

Qp='0', Qn='1'

If the differential input voltage relationship then changes from VEp<<VEn to VEp~VEn, the output logic still remains the same.

Qp='0', Qn='1'

If the differential input voltage relationship reverses again, when the reversal becomes large enough so that VEp−VEn>Vthp, the output logic inverts again.

Qp='1', Qn='0'

If the differential input voltage relationship then changes from VEp−VEn>Vthp to VEp>>VEn, the new output logic is maintained.

Qp='1', Qn='0'

That is, as long as the differential input voltage VEp−VEn stays within the range between Vthp and −Vthn, the output logic does not change.

Accordingly, if the threshold voltages Vthn and Vthp are set so as to exceed the levels of the noise superimposed on the differential input voltages VEp, VEn and the residual dc offset of the offset comparator, then when VEp−VEn~0 during long extinction periods (e.g., while receiving runs of '0' data), or during long light-receiving periods (runs of '1' data), the output logic signals maintain their existing values.

Furthermore, if the threshold voltages Vthn and Vthp are equal (Vthn=Vthp), the output logic changes from '1' to '0' and from '0' to '1' under equal output inversion conditions, thereby equalizing the time-slot widths of the '1' and '0' logic outputs.

In the comparator in embodiment 5A, the hysteresis characteristic described above results from positive feedback obtained by pairing resistor R3 with resistor R1, and resistor R4 with resistor R2. Due to this positive feedback, when the differential relationship of the input voltages VEp, VEn reverses, the relationship of the base potential levels of transistors T1, T2 does not reverse until the difference between VEp and VEn has widened by a sufficient amount. When the relationship of the base voltages of transistors T1, T2 finally does reverse, the positive feedback described above rapidly inverts the logic output signals.

As described above, embodiment 5A has the following effects regarding the comparator.
(1) The conventional reference voltage is not required.
(2) Hysteresis comparator operation removes differential mode noise below a certain level.
(3) Due to the hysteresis comparator operation, unchanging logic output can be maintained during both long extinction periods (e.g., while receiving successive runs of '0' data) and long light-receiving periods (while receiving successive runs of '1' data). (In a conventional level discrimination circuit and the level discrimination circuits in embodiments 4A–4D, unchanging logic output is obtained only during extinction periods, or only during light-receiving periods.)

(4) If the threshold voltages Vthp and Vthn are equal, the output logic responds equally when inverting from '0' to '1' and from '1' to '0', thereby equalizing the time-slot widths of the '0' and '1' outputs.

Embodiment 5B

Figure 29:
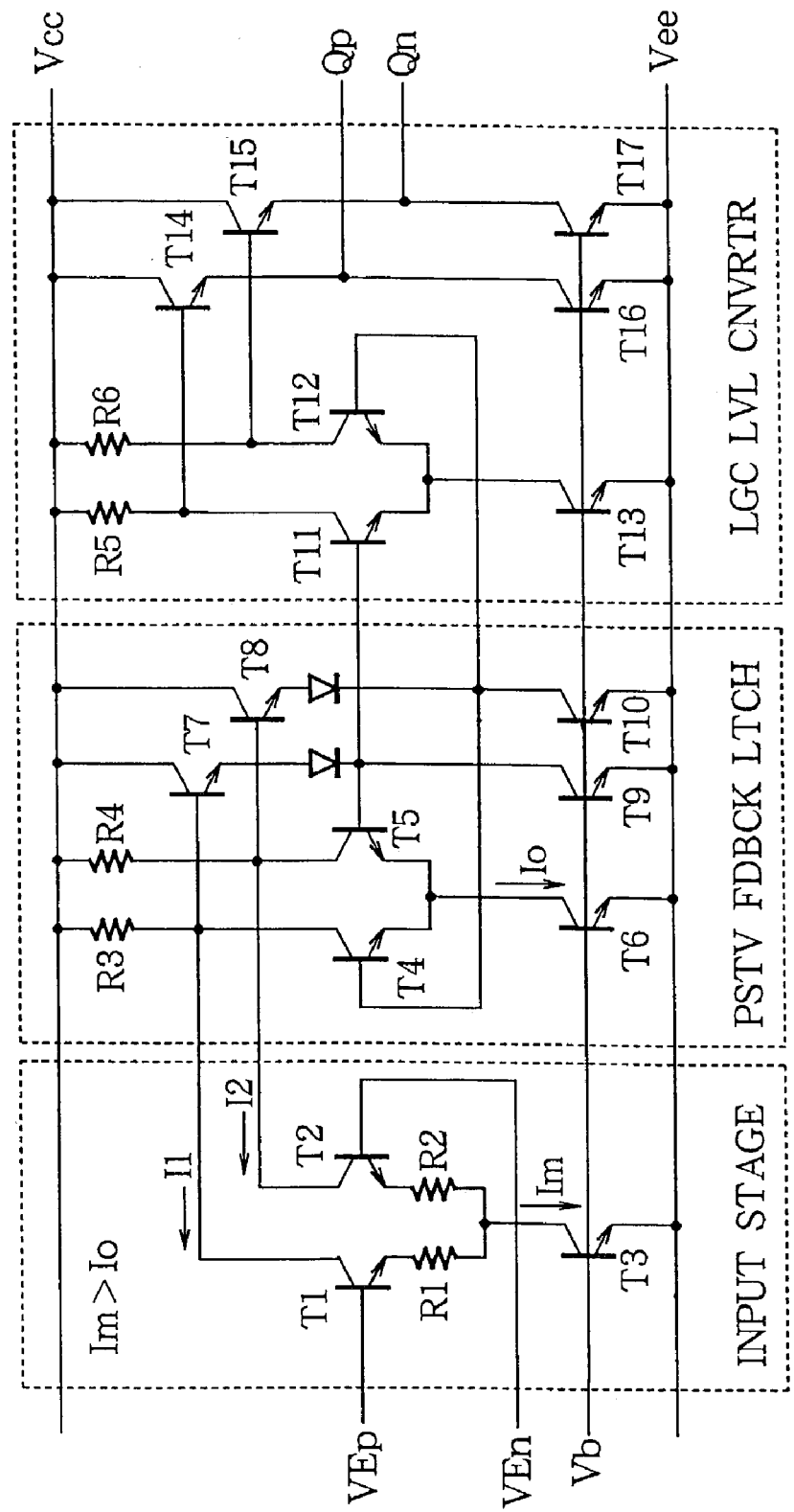
FIG. 29 is a circuit diagram of the comparator in the level discrimination circuit in embodiment 5B.

FIG. 29 shows the circuit configuration of the comparator in the level discrimination circuit in embodiment 5B. This comparator is an example of an emitter-coupled logic (ECL) output circuit and comprises an input stage, a positive feedback latch (PSTV FDBCK LTCH), and a logic level converter (LGC LVL CNVRTR).

In the comparator in embodiment 5B, the differential sink current Im in the input stage is set to exceed the differential sink current Io in the positive feedback latch. Current I1 flows through resistor R3, and current I2 flows through resistor R4, according to the differential relationship of the voltages VEp, VEn input to the input stage. When the positive feedback latch maintains an existing '1' or '0' output, the sink current Im described above flows through only one of these two resistors, either R3 or R4.

If the sink current Im flows through resistor R3, after the differential voltages VEp, VEn have been inverted, when the current I2 increases and the current I1 decreases to a point such that (I2−I1)>Io, then the voltage drop across resistor R4 is greater than the voltage drop across resistor R3. This reverses the relationship of the base potential levels of the input voltage transistors T4, T5 in the positive feedback latch, after which the positive feedback latch rapidly reverses the logic output.

As in embodiment 5A, embodiment 5B has the following effects regarding the comparator.

(1) The conventional reference voltage is not required.
(2) Hysteresis comparator operation removes differential mode noise below a certain level.
(3) Due to the hysteresis comparator operation, unchanging logic output can be maintained during both long extinction periods (e.g., while receiving successive runs of '0' data) and long light-receiving periods (while receiving successive runs of '1' data), instead of only during extinction periods, or only during light-receiving periods.
(4) If the threshold voltages Vthp and Vthn are equal, the output logic responds equally when inverting from '0' to '1' and from '1' to '0', thereby equalizing the time-slot widths of the '0' and '1' outputs.

Embodiment 5C

Figure 30:
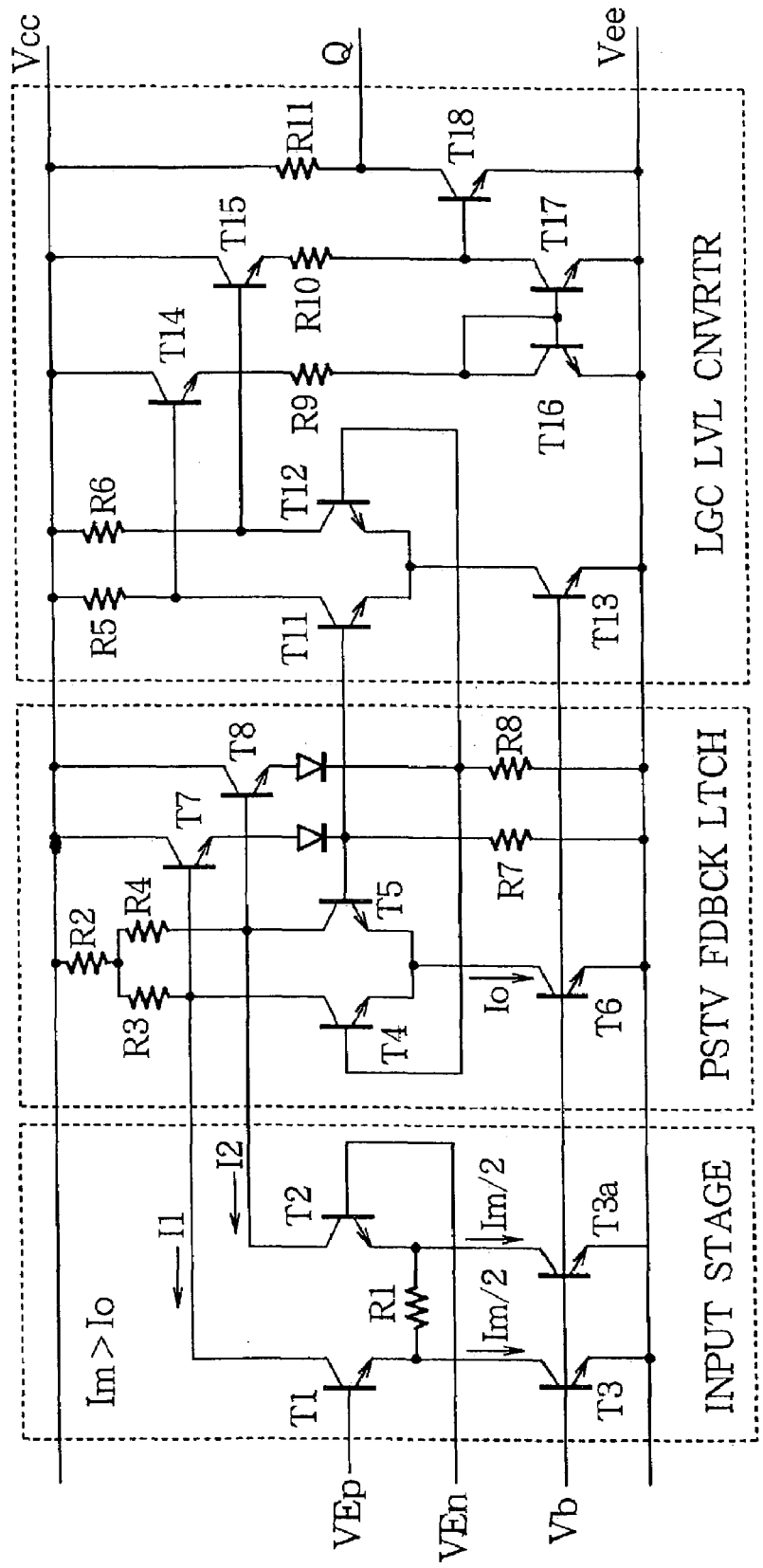
FIG. 30 is a circuit diagram of the comparator in the level discrimination circuit in embodiment 5C.

FIG. 30 shows the circuit configuration of the comparator in the level discrimination circuit in embodiment 5C. This comparator is an example of a transistor-transistor logic (TTL) output circuit and comprises an input stage, a positive feedback latch, and a logic level converter.

The operation of the comparator in embodiment 5C is similar to that of the comparator in embodiment 5B. The output logic inverts when current I2 increases and current I1 decreases from a state in which I2<I1 to a state in which (I2−I1)>Io, or when current I1 increases and current I2 decreases from a state in which I1<I2 to a state in which (I1−I2)>Io.

As in embodiment 5B, embodiment 5C has the following effects regarding the comparator.

(1) The conventional reference voltage is not required.
(2) Hysteresis comparator operation removes differential mode noise below a certain level.
(3) Due to the hysteresis comparator operation, unchanging logic output can be maintained during both long extinction periods (e.g., while receiving successive runs of '0' data) and long light-receiving periods (while receiving successive runs of '1' data), instead of only during extinction periods, or only during light-receiving periods.
(4) If the threshold voltages Vthp and Vthn are equal, the output logic responds equally when inverting from '0' to '1' and from '1' to '0', thereby equalizing the time-slot widths of the '0' and '1' outputs.

The level discrimination circuits in embodiment 4A–4D and 5A–5C can be used in low-voltage differential signaling (LVDS), in which a balanced differential signal is transmitted and received through a cable. In LVDS, if the cable is long and the signal level is attenuated, the received signal must first be amplified with compensation for dc offset and a $\sqrt{f}$ attenuation characteristic; nevertheless, even long successive runs of '0' or '1' signals can be received stably if the level discrimination circuit in one of embodiments 4A–4D or 5A–5C is used.

Embodiments 6A–6D

The automatic gain control amplifier circuit (AGC amplifier circuit) in embodiments 6A–6D includes a variable gain amplifier circuit, an amplitude detection circuit, and a gain control amplifier. The variable gain amplifier circuit amplifies an input voltage with a controlled gain and outputs a positive differential voltage VGp and a negative differential voltage VGn. The amplitude detection circuit detects the amplitude of the differential voltages VGp, VGn and outputs a positive differential voltage VHp and a negative differential voltage VHn according to the amplitude. The gain control amplifier controls the gain of the variable gain amplifier circuit according to the differential voltages VHp, VHn.

Embodiment 6A

Figure 31:
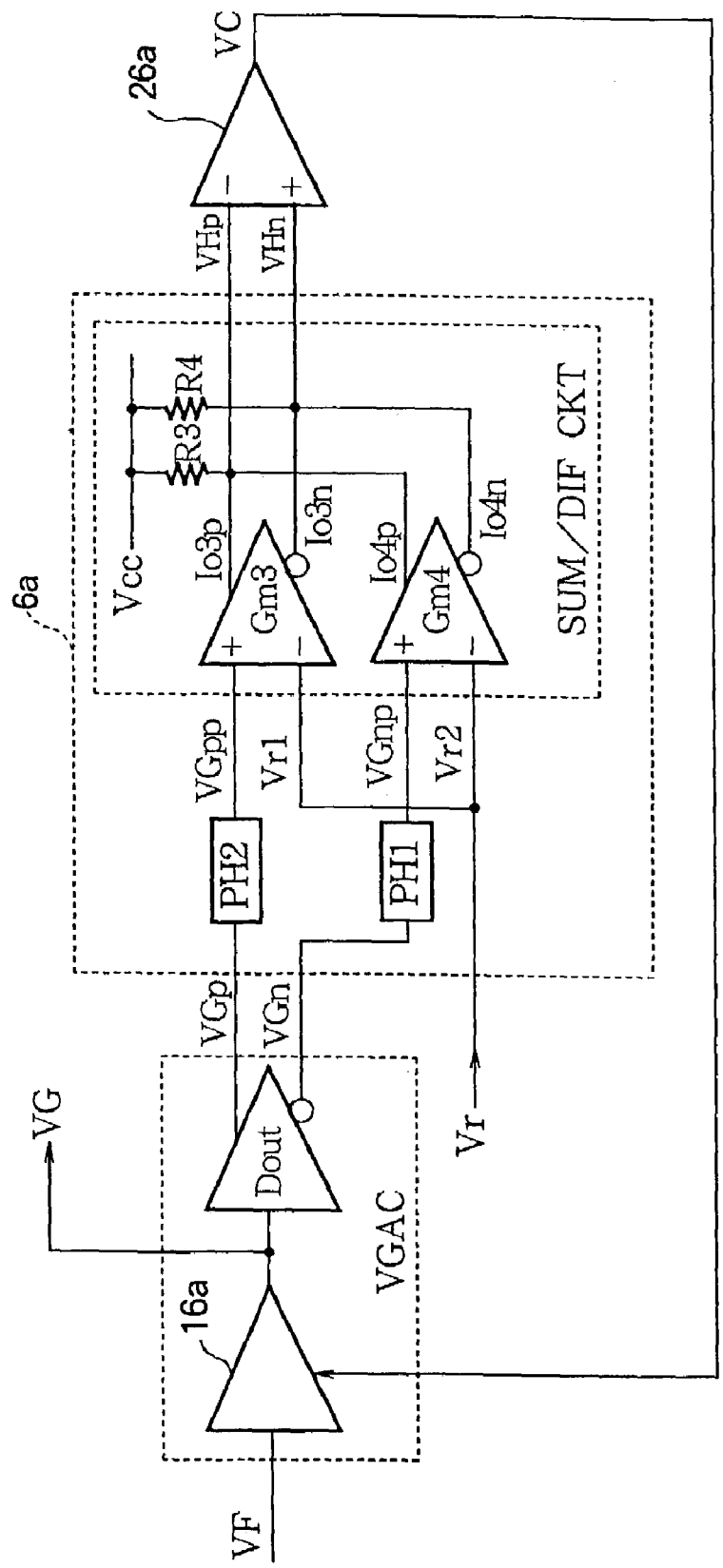
FIG. 31 shows the structure of an AGC amplifier circuit according to embodiment 6A of the present invention.
Figure 57:
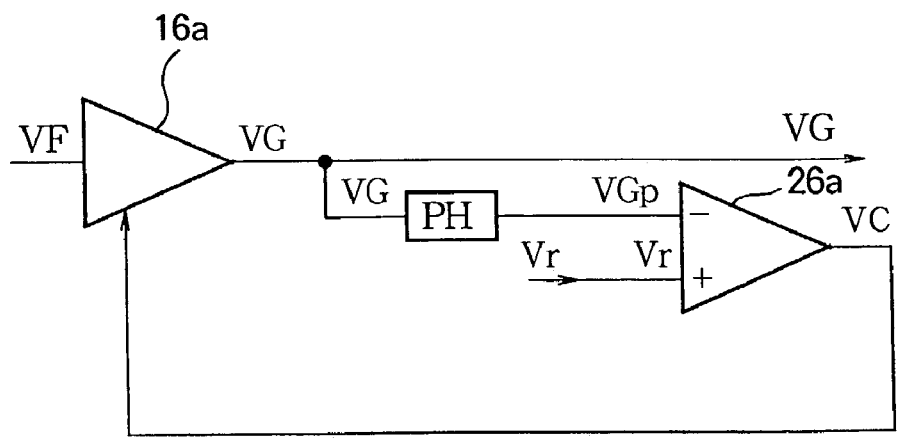
FIG. 57 shows the general structure of a conventional AGC amplifier circuit.

FIG. 31 shows the general structure of the AGC amplifier circuit in embodiment 6A, using the same reference characters as in FIG. 5 or FIG. 57 for similar elements. This AGC amplifier circuit comprises a variable gain amplifier circuit (VGAC), an amplitude detection circuit 6a, and a gain control amplifier 26a. The variable gain amplifier circuit includes a variable gain amplifier 16a and a differential output amplifier Dout. The amplitude detection circuit 6a includes a pair of peak-hold circuits PH1, PH2 and an analog summing and differencing circuit. The analog summing and differencing circuit includes a pair of amplifiers Gm3, Gm4 with differential voltage input and differential current output, and a pair of resistors R3, R4.

The variable gain amplifier 16a amplifies an input voltage VF according to an externally controllable gain and outputs a voltage VG. The differential output amplifier Dout converts the voltage VG to the positive differential voltage VGp and a negative differential voltage VGn.

Peak-hold circuit PH1 senses the peak of the negative differential voltage VGn from the differential output amplifier Dout and outputs a peak value VGnp; peak-hold circuit PH2 senses the peak of the positive differential voltage VGp from the differential output amplifier Dout and outputs a peak value VGpp.

Amplifier Gm3 receives peak value VGpp as its non-inverting input and a reference voltage Vr1 from a reference voltage circuit (not shown) as its inverting input, and outputs differential currents Io3p, Io3n. Amplifier Gm4 receives peak value VGnp as its non-inverting input and a reference voltage Vr2 from the reference voltage circuit (not shown) as its inverting input, and outputs differential currents Io4p, Io4n. Amplifiers Gm3, Gm4 have the same circuit configuration as amplifiers Gm1, Gm2 in embodiment 1A (FIG. 6), receiving differential voltage input and producing differential current output. Resistor R3 converts the sum of the positive differential currents Io3p and Io4p to a positive output voltage VHp. Resistor R4 converts the sum of the negative differential currents Io3n and Io4n to a negative output voltage VHn.

Figure 32:
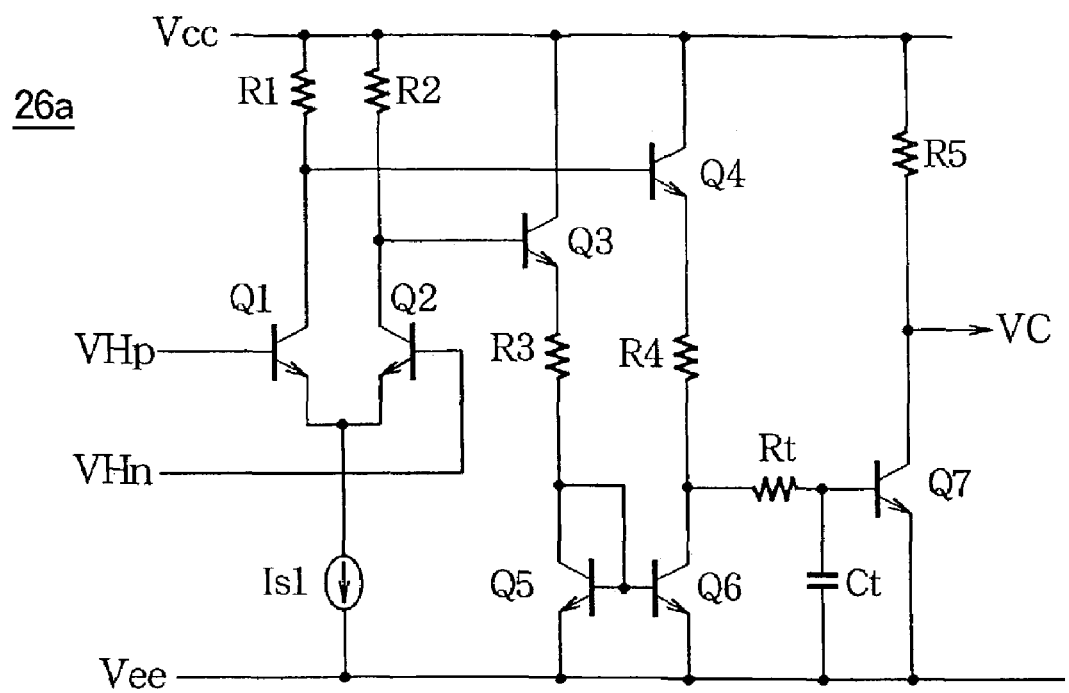
FIG. 32 is a circuit diagram of the gain control amplifier in FIG. 31.

FIG. 32 shows an example of the circuit configuration of the gain control amplifier 26a. The gain control amplifier 26a receives the positive differential voltage VHp from the amplitude detection circuit 6a as its inverting input and the negative differential voltage VHn from the amplitude detection circuit 6a as its non-inverting input, and produces a control voltage VC that depends on VHp and VHn. The control voltage VC controls the gain of the variable gain amplifier 16a.

Figure 33:
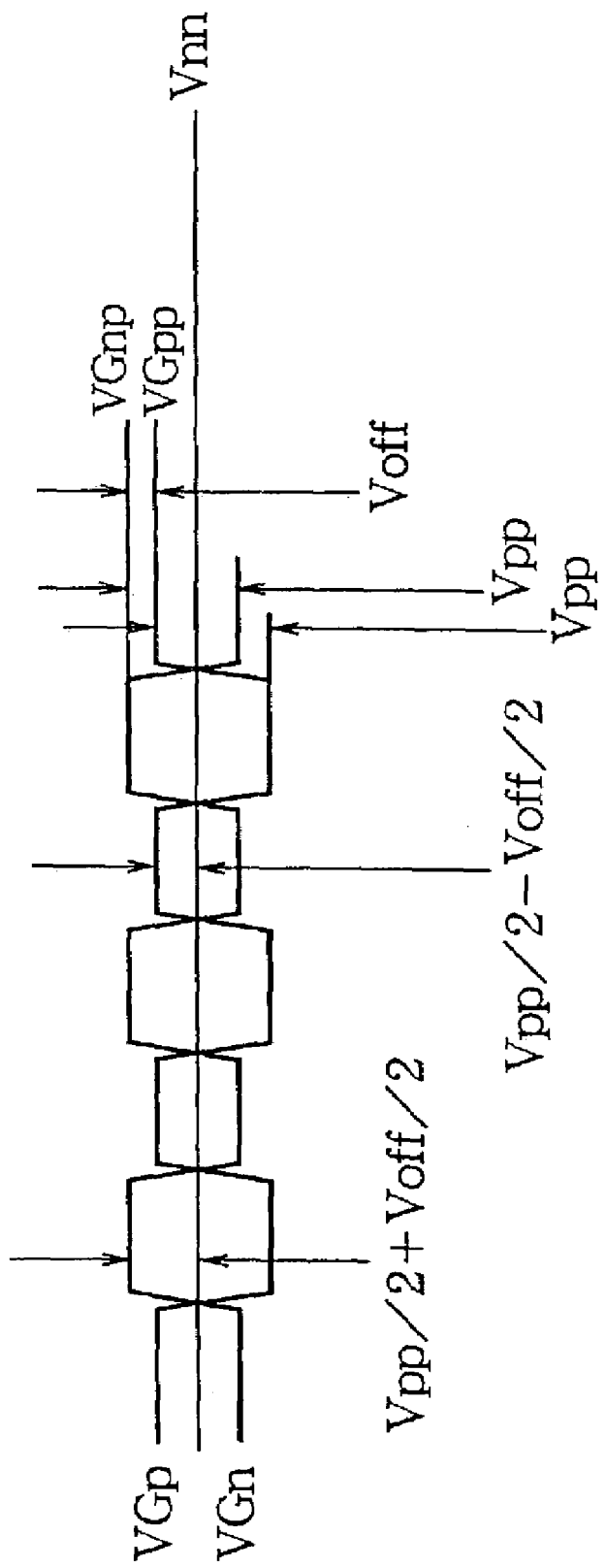
FIG. 33 shows waveforms input to the amplitude detection circuit in FIG. 31.

FIG. 33 shows an example of waveforms of the differential voltages VGp, VGn input to the amplitude detection circuit 6a (the differential voltages VGp, VGn output from the differential output amplifier Dout). Vpp indicates the amplitude of the differential voltages VGp, VGn; Voff indicates the offset voltage between the differential voltages VGp, VGn; and Vnn indicates the dc bias voltage (the center voltage) of the differential voltages VGp, VGn. With this notation, the voltages VGpp, VGnp output from peak-hold circuits PH1, PH2 are given by the equations below.

$$VGpp = Vpp/2 + Voff/2 + Vnn \quad (13)$$

$$VGnp = Vpp/2 - Voff/2 + Vnn \quad (14)$$

If differential input is regarded as subtraction and a current sum is regarded as addition in the analog summing and differencing circuit in FIG. 31, differential voltages VHp, VHn are related as indicated in the equation below.

$$VHp - VHn = K((VGpp - Vr1) + (VGnp - Vr2)) \quad (15)$$
$$= K(VGpp + VGnp - Vr1 - Vr2)$$
$$= K(Vpp + 2Vnn - Vr1 - Vr2)$$

For example, if the reference voltages Vr1, Vr2 are both equal to Vnn plus a quantity defined as Vps/2 (Vr1=Vr2=Vr=Vnn+Vps/2), then:

$$VHp - VHn = K(Vpp + 2Vnn - 2(Vnn + Vps/2)) \quad (16)$$
$$= K(Vpp - Vps)$$

The gain control amplifier 26a controls the gain of the variable gain amplifier 16a so as to equalize the differential voltages VHp, VHn, thereby holding Vpp equal to Vps, so that automatic gain control (AGC) takes place.

$$VHp - VHn = K(Vpp - Vps) = 0, \ Vpp = Vps \quad (17)$$

As described above, the AGC amplifier circuit in embodiment 6A can accurately detect the amplitude value, and can therefore accurately control the amplitude (completely removing the effect of the dc offset of, for example, the differential output amplifier Dout).

Embodiment 6B

Figure 34:
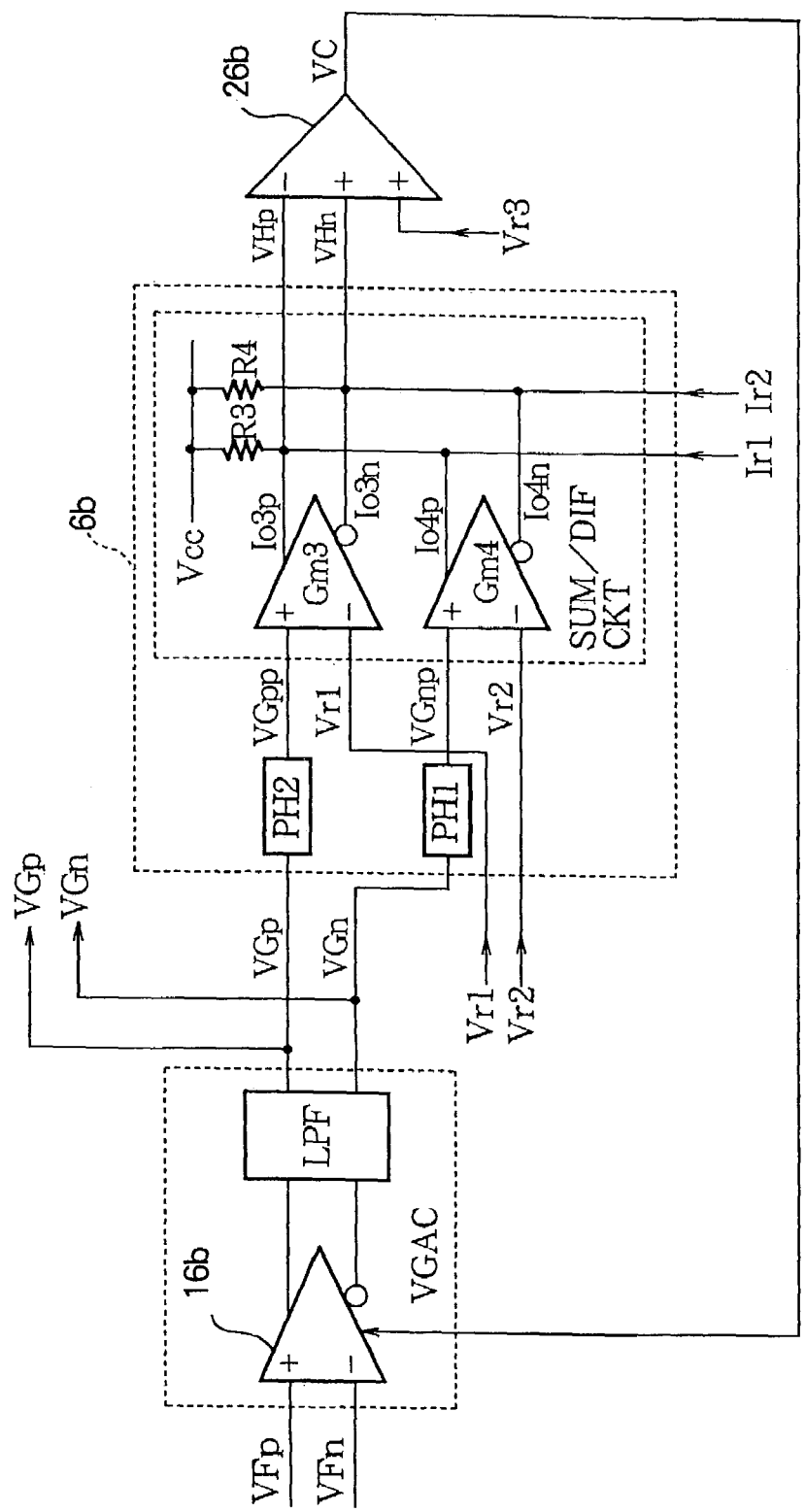
FIG. 34 shows the structure of an AGC amplifier circuit according to embodiment 6B of the present invention.

FIG. 34 shows the general structure of the AGC amplifier circuit in embodiment 6B, using the same reference characters as in FIG. 31 for similar elements. This AGC amplifier circuit comprises a variable gain amplifier circuit, an amplitude detection circuit 6b, and a gain control amplifier 26b. The variable gain amplifier circuit includes a variable gain amplifier 16b and a low pass filter LPF. The amplitude detection circuit 6b includes the same circuit blocks and elements as in embodiment 6A (FIG. 31), interconnected in the same way.

Figure 35:
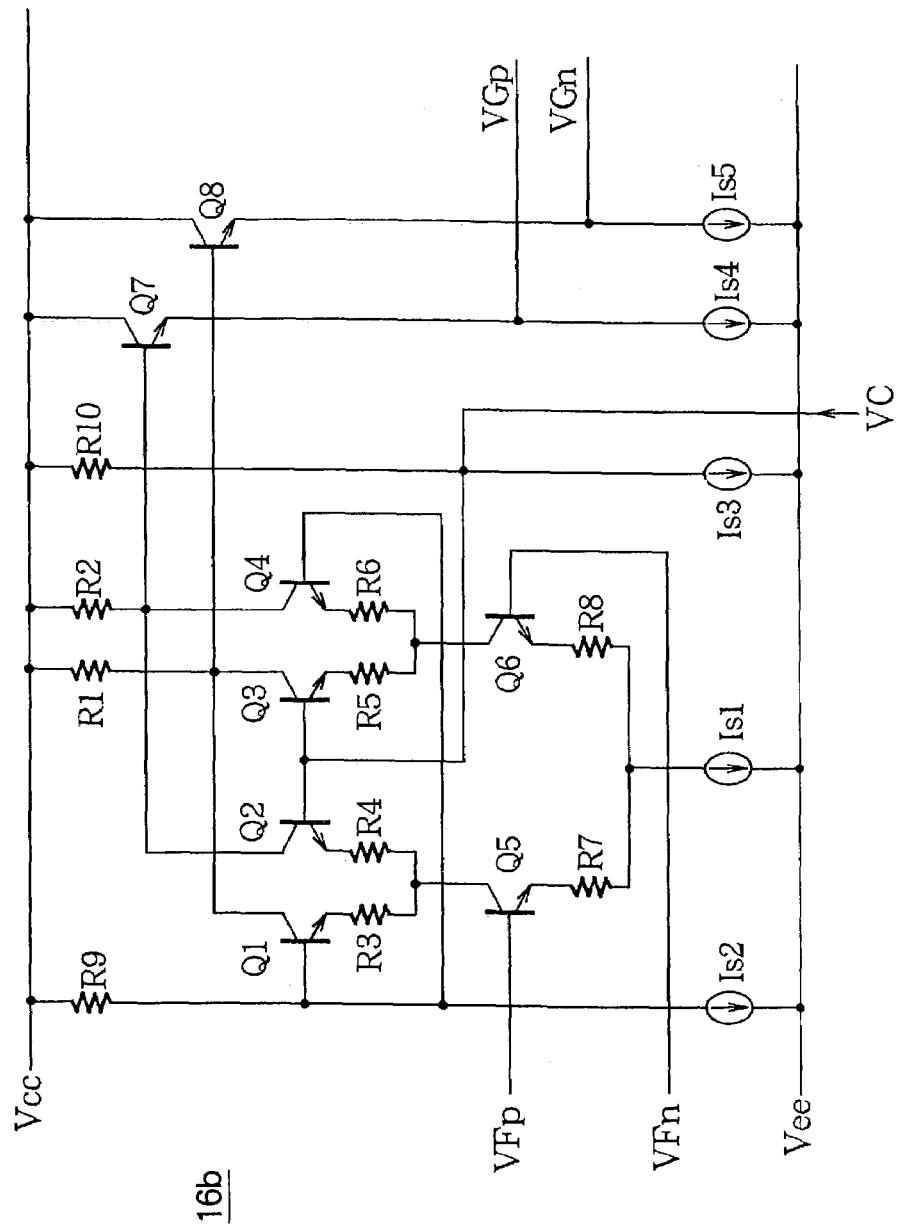
FIG. 35 is a circuit diagram of the variable gain amplifier in FIG. 34.

FIG. 35 shows an example of the circuit configuration of the variable gain amplifier 16b, which receives differential input voltages VFp, VFn and produces differential output voltages VGp, VGn amplified according to an externally controllable gain. The use of this variable gain amplifier 16b enables the differential output amplifier (Dout in FIG. 31) to be omitted.

The low pass filter LPF removes high frequency components above the necessary signal band from the differential voltages output from the variable gain amplifier 16b and outputs filtered differential voltages VGp, VGn to the amplitude detection circuit 6b. The addition of the low pass filter LPF reduces noise in the output from the variable gain amplifier circuit and stabilizes the gain control output level.

The amplitude detection circuit 6b differs from the amplitude detection circuit 6a in embodiment 6A (FIG. 31) in that it receives reference currents (Ir1, Ir2) as well as reference voltages (Vr1, Vr2). Reference current Ir1 is routed through resistor R3; reference current Ir2 is routed through resistor R4.

The product of reference current Ir1 and resistance R3 is equal to reference voltage Vr1, and the product of reference current Ir2 and resistance R4 is equal to reference voltage Vr2, as indicated by the equations below.

$$Vr1 = R3 \times Ir1, \ Vr2 = R4 \times Ir2 \quad (18)$$

The gain control amplifier 26b differs from the gain control amplifier 26a in embodiment 6A (FIGS. 31 and 32) in that it receives a reference voltage Vr3.

The insertion of the low pass filter LPF to remove unnecessary high frequency components from the output of the variable gain amplifier circuit in embodiment 6B reduces noise in the output and stabilizes the gain control output level.

Embodiment 6C

Figure 36:
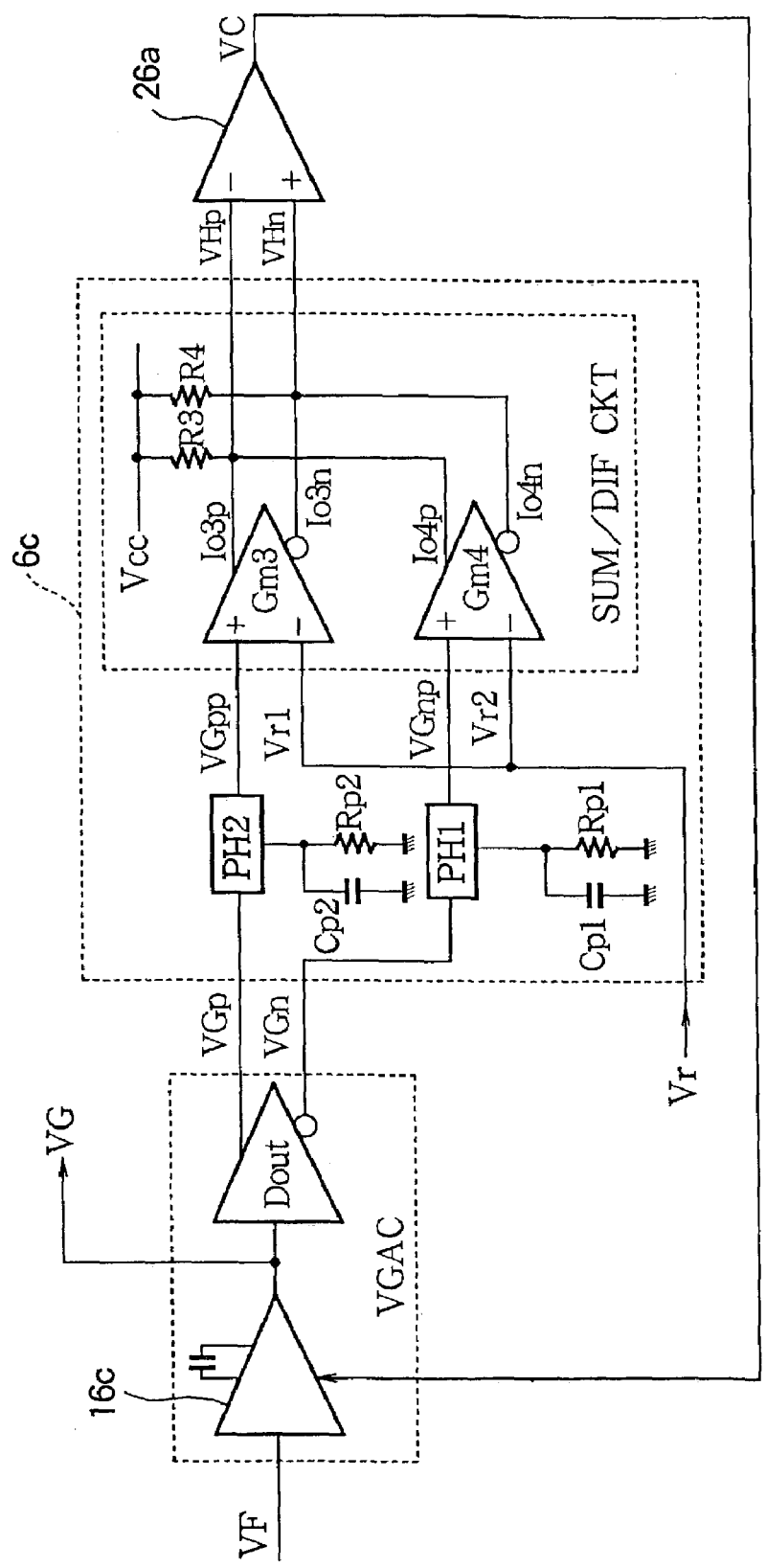
FIG. 36 shows the structure of an AGC amplifier circuit according to embodiment 6C of the present invention.

FIG. 36 shows the general structure of the AGC amplifier circuit in embodiment 6C, using the same reference characters as in FIG. 31 or FIG. 18 for similar elements. This AGC amplifier circuit comprises substantially the same circuit blocks and circuit elements as in embodiment 6A (FIG. 31), but differs in respect to the peak-hold circuits PH1, PH2 and the variable gain amplifier 16c in the variable gain amplifier circuit.

Like the variable gain amplifier 16a in embodiment 6A, variable gain amplifier 16c has single-ended input and output, amplifying an input voltage VF according to an externally controllable gain and outputting a voltage VG.

However, variable gain amplifier 16c also includes capacitive coupling, as indicated by the capacitor symbol in the drawing.

The amplitude detection circuit 6c differs from the amplitude detection circuit 6a in embodiment 6A (FIG. 31) by adding resistors Rp1, Rp2 to discharge the capacitors Cp1, Cp2 that hold the charges in the peak-hold circuits PH1, PH2. These resistors Rp1, Rp2 may be replaced by constant-current sources Ip1, Ip2, as in embodiment 3B.

Since the variable gain amplifier 16c includes capacitive coupling, the amplitude of the output voltage VG varies according to gain variations. The dc bias voltage may also vary in a capacitively coupled variable gain amplifier of this type, with single-ended output. Since the amplitude detection circuit 6c includes resistors Rp1, Rp2 (or constant-current sources Ip1, Ip2) to discharge the capacitors Cp1, Cp2 that hold the charges of the peak-hold circuits PH1, PH2, however, it can respond rapidly to the amplitude variations of the output voltage VG and the variations in the dc bias voltage, provided appropriately discharge time constants are selected.

As described above, in embodiment 6C, the addition of resistors Rp1, Rp2 (or constant-current sources Ip1, Ip2) improves the speed of response to amplitude variations and variations in the dc bias.

Embodiment 6D

Figure 37:
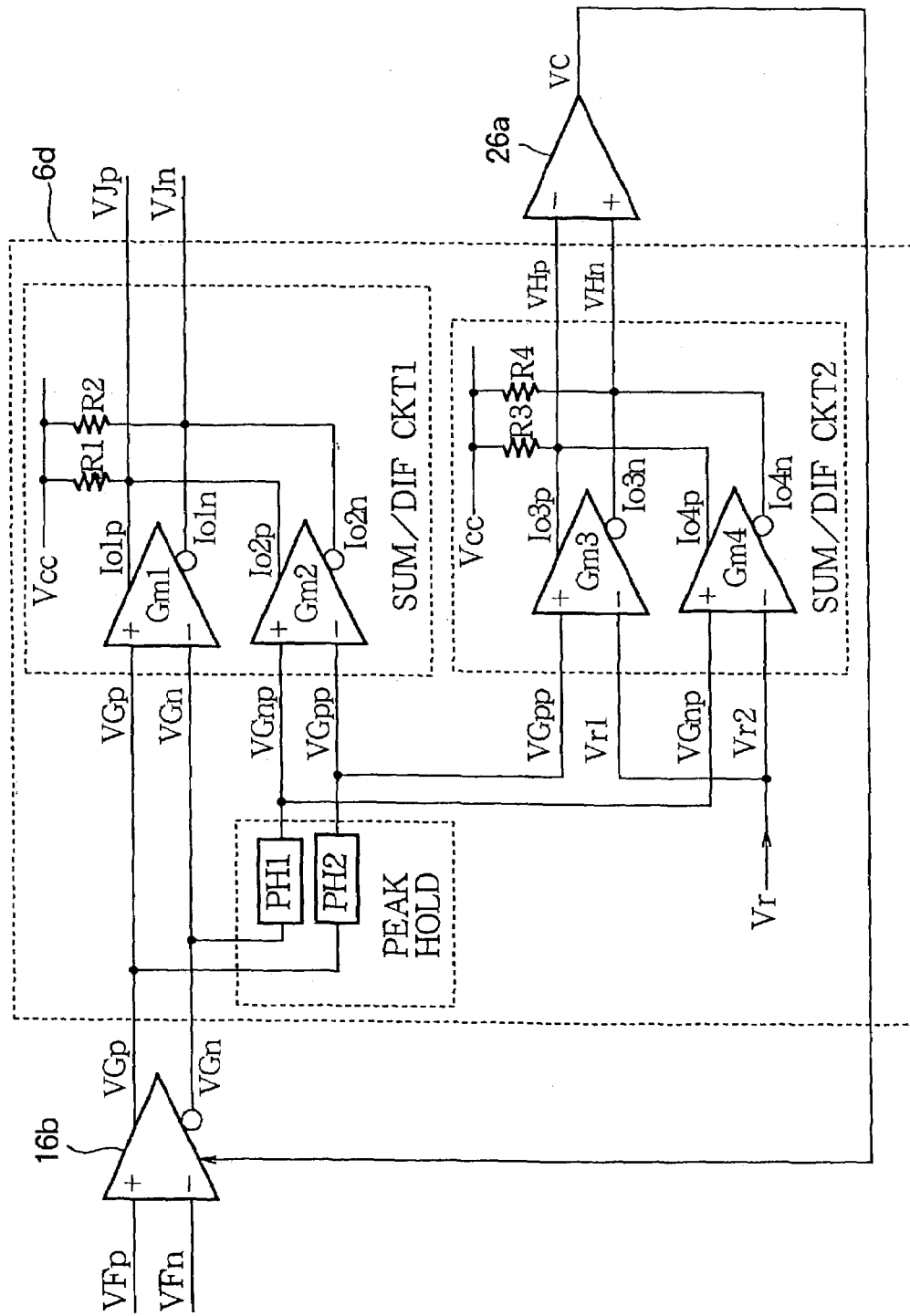
FIG. 37 shows the structure of an AGC amplifier circuit according to embodiment 6D of the present invention.

FIG. 37 shows the general structure of the AGC amplifier circuit in embodiment 6D, using the same reference characters as in FIG. 31, FIG. 34, or FIG. 5 for similar elements. This AGC amplifier circuit comprises a variable gain amplifier 16b, an amplitude detection circuit 6d, and a gain control amplifier 26a. The amplitude detection circuit 6d includes a pair of peak-hold circuits PH1, PH2, and a pair of analog summing and differencing circuits. The analog summing and differencing circuit for offset compensation includes a pair of amplifiers Gm1, Gm2 with differential voltage input and differential current output, and a pair of resistors R1, R2. The analog summing and differencing circuit for amplitude detection includes a pair of amplifiers Gm3, Gm4 with differential voltage input and differential current output, and a pair of resistors R3, R4.

In the amplitude detection circuit 6d, the analog summing and differencing circuit for offset compensation (SUM/DIF CKT1), which has the same circuit configuration as in the offset compensator 1a in embodiment 1A (FIG. 5), compensates for dc offset in the differential voltages VGp, VGn output from the gain control amplifier 26a and outputs differential voltages VJp, VJn. The analog summing and differencing circuit for amplitude detection (SUM/DIF CKT2), which has the same circuit configuration as the amplitude detection circuit 6a in embodiment 6A (FIG. 31), detects the amplitude of differential voltages VGp, VGn and outputs differential voltages VHp, VHn according to the detected amplitude. The gain control amplifier 26a controls the gain of the variable gain amplifier 16b according to differential voltages VHp, VHn.

The two analog summing and differencing circuits share the peak-hold circuits PH1, PH2. Accordingly, only a single pair of peak-hold circuits is needed to generate offset-compensated differential output voltages VJp, VJn with a constant amplitude level.

In the AGC amplifier circuit in embodiment 6D, the AGC function operates in the same way as in embodiment 6A and the offset compensation function operates in the same way as in embodiment 1A, so detailed descriptions will be omitted.

To implement the AGC function, the AGC amplifier circuit in embodiment 6D can use the circuit configuration of the amplitude detection circuit 6b or 6c in embodiment 6B or 6C instead of the circuit configuration of amplitude detection circuit 6a in embodiment 6A. For each of these amplitude detection circuit configurations, offset compensation (including the peak-hold function) can be implemented with a conventional offset compensator or one of the offset compensators 1a–3b in embodiments 1A–3B. Use of the offset compensator circuit configuration in embodiment 3A or 3B can improve the response speed of the variable gain amplifier 16b.

As described above, embodiment 6D provides an AGC amplifier circuit that can also compensate for dc offset in the differential output.

Embodiments 7A, 7B

The automatic frequency compensation amplifier circuit ($\sqrt{f}$-AGC amplifier circuit) in embodiments 7A and 7B includes a variable frequency characteristic amplifier circuit, an amplitude detection circuit, and an equalization characteristic control amplifier. The variable frequency characteristic amplifier circuit amplifies an input voltage with a controlled gain frequency characteristic and outputs a positive differential voltage VGp and a negative differential voltage VGn. The amplitude detection circuit detects the amplitude of the differential voltages VGp, VGn and outputs a positive differential voltage VHp and a negative differential voltage VHn according to the amplitude. The equalization characteristic control amplifier controls the gain frequency characteristic of the variable frequency characteristic amplifier circuit according to the differential voltages VHp, VHn.

Embodiment 7A

Figure 38:
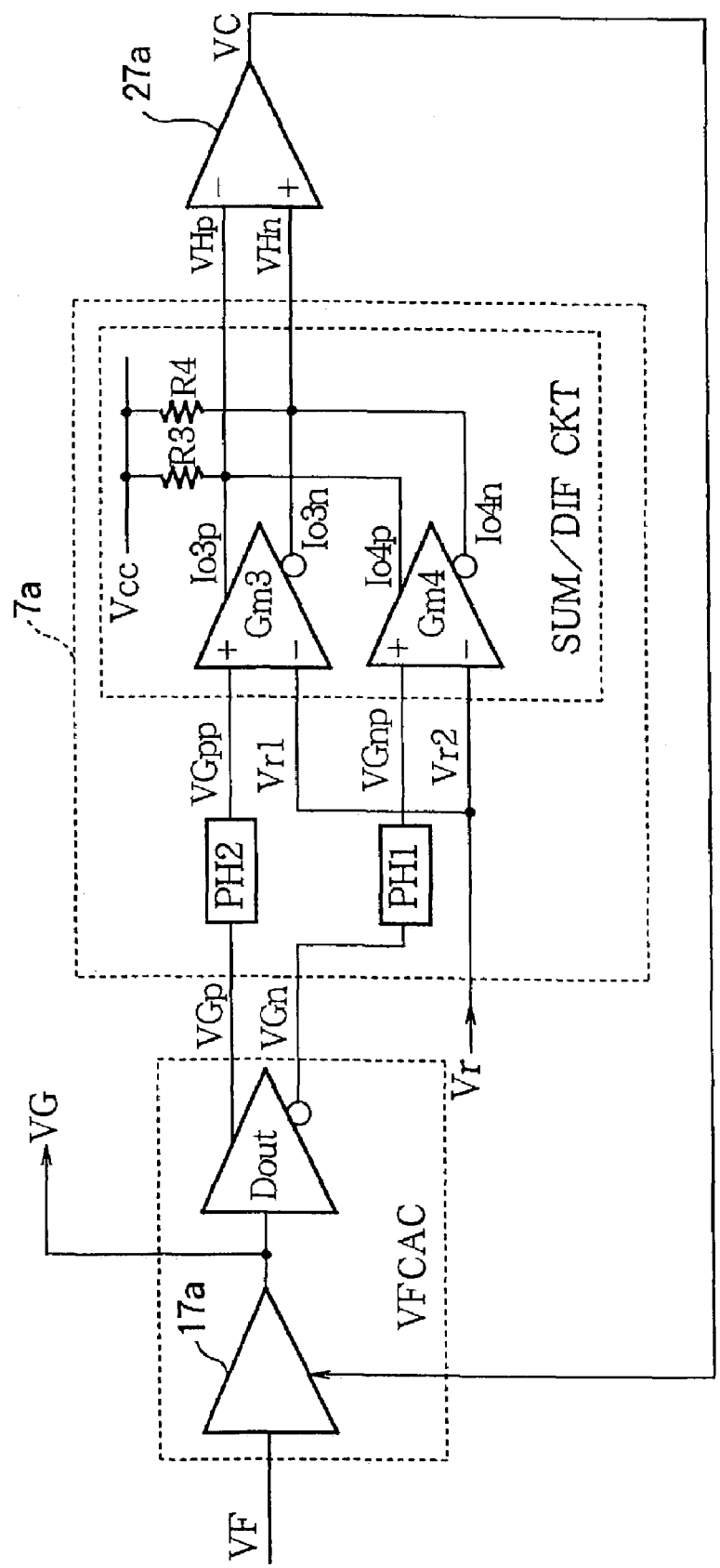
FIG. 38 shows the structure of a $\sqrt{f}$-AGC amplifier circuit according to embodiment 7A of the present invention.
Figure 58:
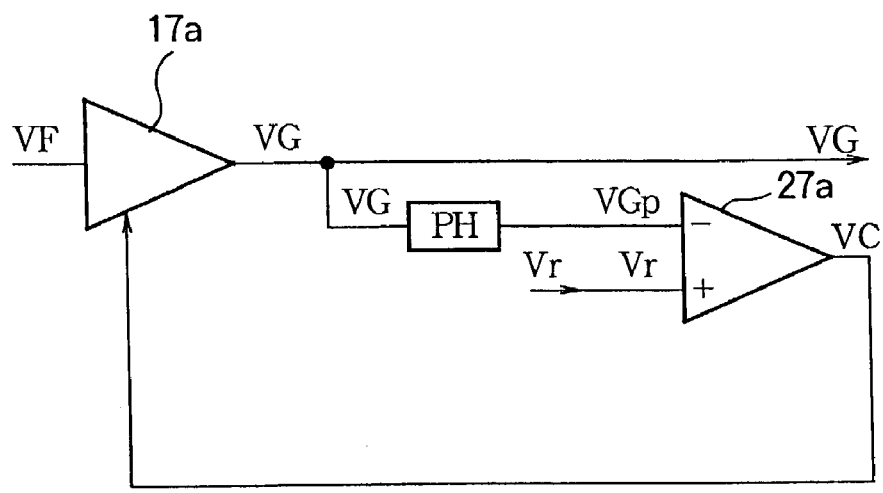
FIG. 58 shows the general structure of a conventional $\sqrt{f}$-AGC amplifier circuit.

FIG. 38 shows the general structure of the $\sqrt{f}$-AGC amplifier circuit in embodiment 7A, using the same reference characters as in FIG. 31 or FIG. 58 for similar elements. This $\sqrt{f}$-AGC amplifier circuit comprises a variable frequency characteristic amplifier circuit (VFCAC), an amplitude detection circuit 7a including an analog summing and differencing circuit, and an equalization characteristic control amplifier 27a. The variable frequency characteristic amplifier circuit includes a variable frequency characteristic amplifier 17a and a differential output amplifier Dout. The amplitude detection circuit 7a has the same circuit configuration as the amplitude detection circuit 6a (FIG. 31) in embodiment 6A.

The difference between the $\sqrt{f}$-AGC amplifier circuit in embodiment 7A and the AGC amplifier circuit (FIG. 31) in embodiment 6A is that the variable gain amplifier 16a is replaced with a different variable frequency characteristic amplifier 17a and the gain control amplifier 26a is replaced with a different equalization characteristic control amplifier 27a.

The variable frequency characteristic amplifier 17a amplifies an input voltage VF according to an externally controllable gain frequency characteristic and outputs a voltage VG.

The equalization characteristic control amplifier 27a receives the positive differential voltage VHp from the amplitude detection circuit 7a as its inverting input and the negative differential voltage VHn from the amplitude detection circuit 7a as its non-inverting input, and produces a control voltage VC that depends on VHp and VHn. The control voltage VC controls the gain frequency characteristic of the variable frequency characteristic amplifier 17a.

When a pulse signal is transmitted on a (metallic) cable, the pulse waveform degrades as the length of the cable increases. The main reason is that high frequency components are attenuated with what is generally termed a $\sqrt{f}$ characteristic. Accordingly, an AGC amplifier circuit having a flat frequency characteristic cannot recover a correct pulse waveform; the degraded waveform must be reshaped by the receiving frequency characteristic of the receiving circuit, by compensating for the $\sqrt{f}$ characteristic according to the length of the cable (the high frequency gain must increase according to the cable length). This compensation process is also referred to as equalization.

The voltage VG output from the variable frequency characteristic amplifier 17a is converted to differential signals VGp, VGn by the differential output amplifier Dout. If the differential signals VGp, VGn have a small amplitude because their high frequency components have been attenuated with a $\sqrt{f}$ characteristic according to the cable length, the peak values VGpp, VGnp of these signals will be smaller than the reference voltages Vr1, Vr2. Under these conditions, the equalization characteristic control amplifier 27a varies the control signal VC to increase the high frequency gain of the variable frequency characteristic amplifier 17a, so that the variable frequency characteristic amplifier 17a can recover an equalized pulse voltage VG with constant amplitude.

Figure 39:
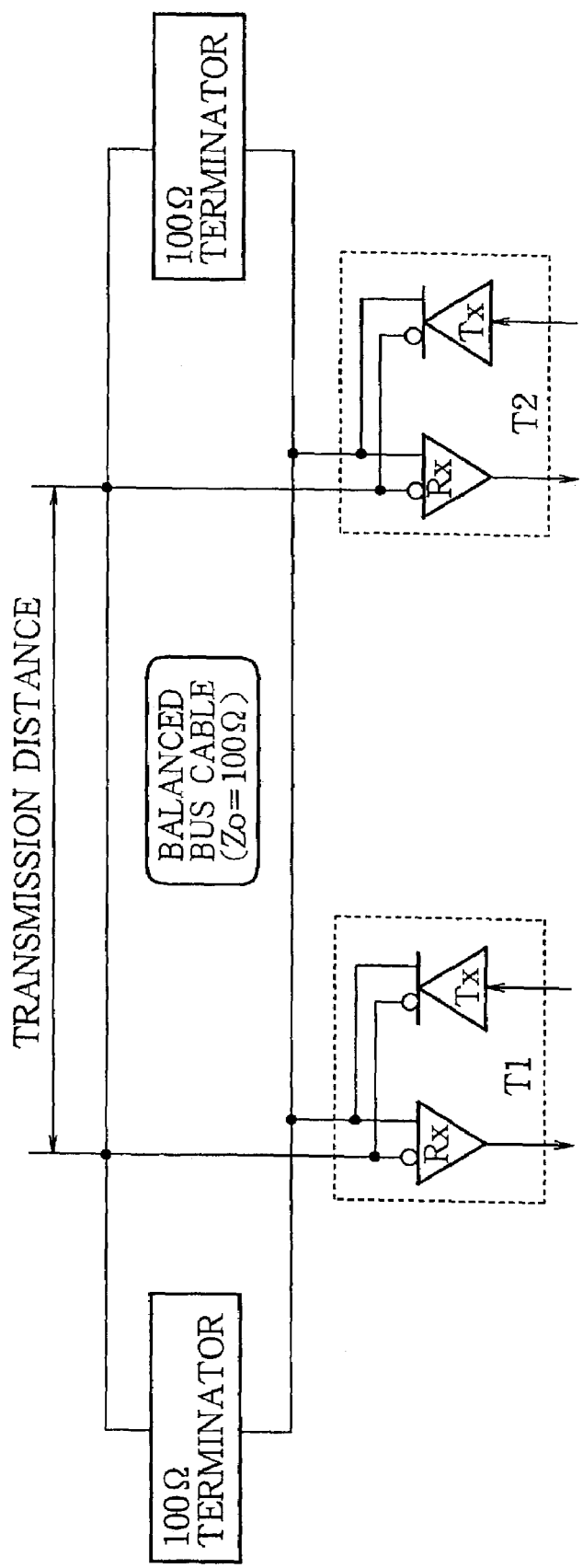
FIG. 39 shows the general structure of a low-voltage differential signaling (LVDS) system.
Figure 40:
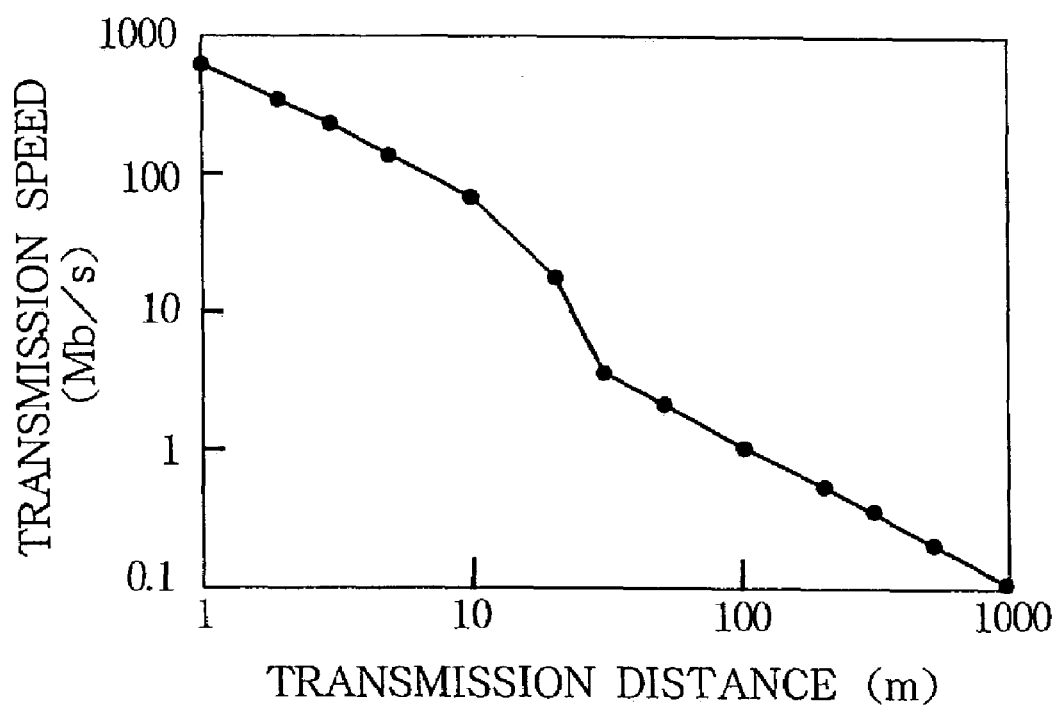
FIG. 40 shows the distances over which LVDS transmission is possible at various data rates.

FIG. 39 shows the general structure of a low-voltage differential signaling (LVDS) system. FIG. 40 shows the distances over which LVDS transmission is possible at various data rates. As shown in FIG. 39, in LVDS, both ends of a balanced bus cable with a 100-Ω characteristic impedance are terminated by non-reflective terminators with the same characteristic impedance resistance of 100 Ω. Each terminal T1, T2 has a current-drive transmitting (Tx) circuit and a receiving (Rx) circuit with high input impedance, so as to maintain non-reflective impedance conditions on the balanced bus cable. Balanced signaling is used to eliminate common mode noise such as a lightning noise. The current source of the transmitting circuit has a high output impedance. The output current signal is converted to a voltage signal by the 100-Ω characteristic impedance. The voltage signal is transmitted in both directions (right and left in the drawing) and is absorbed by the non-reflective terminators. Since the 100-Ω bus lines on both sides of the signal source are connected in parallel, the apparent load is 50 Ω.

As shown in FIG. 40 the LVDS transmission distance is restricted by the $\sqrt{f}$ attenuation characteristic at comparatively high data rates, and by both the $\sqrt{f}$ attenuation characteristic and the cable resistance at comparatively low data rates (high frequency components are lost due to the cable resistance component if the cable length exceeds several tens of meters). The main factor restricting LVDS transmission distance is thus the $\sqrt{f}$ high frequency attenuation characteristic. By compensating for the $\sqrt{f}$ characteristic, the $\sqrt{f}$-AGC amplifier circuit in embodiment 7A can extend LVDS transmission distances.

When multiple terminals are connected at arbitrary positions on the bus cable described above for communication between any two of the terminals, the cable length differs for different combinations of terminals, and the waveform degradation due to the $\sqrt{f}$ characteristic varies accordingly. Appropriate compensation for various degrees of waveform degradation due to the $\sqrt{f}$ characteristic is then required. When used in the receiving circuit of a terminal, the $\sqrt{f}$-AGC amplifier circuit in embodiment 7A can automatically compensate for varying waveform degradation, so that communication can always be carried out in the optimal state.

Figure 41A:
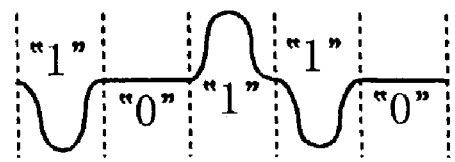
FIG. 41A shows a waveform illustrating an AMI code.
Figure 41B:
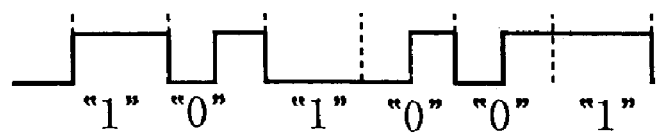
FIG. 41B shows a waveform illustrating a CMI code.
Figure 41C:
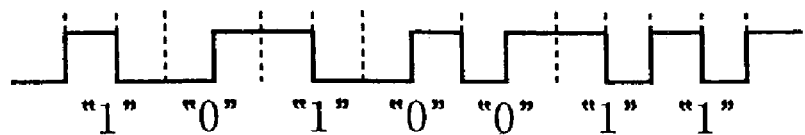
FIG. 41C shows a waveform illustrating a Manchester code.

FIGS. 41A, 41B, and 41C respectively show waveforms illustrating an AMI code, a CMI code, and a Manchester code, which are balanced codes for generating signals with relatively few low-frequency components. The $\sqrt{f}$-AGC amplifier circuit in embodiment 7A is optimally suited for these types of balanced codes.

All of the changes to the AGC amplifier circuit of embodiment 6A made in embodiment 7A can also be made to the AGC amplifier circuits of embodiments 6B and 6C (FIG. 34, FIG. 36). Alternatively, a low pass filter can be inserted in the circuit configuration of embodiment 7A, as was done in the AGC amplifier circuit in embodiment 6B, to reject unwanted high frequency noise. Resistors Rp1, Rp2 or constant-current sources Ip1, Ip2 can also be added to discharge the capacitors Cp1, Cp2 of the peak-hold circuits PH1, PH2 in embodiment 7A, as was done in the AGC amplifier circuit in embodiment 6C.

As described above, embodiment 7A has the following effects regarding the $\sqrt{f}$-AGC amplifier circuit.

(1) The $\sqrt{f}$-AGC amplifier circuit can accurately detect the amplitude value, and can therefore accurately control the amplitude (completely removing the effect of the dc offset of, for example, the differential output amplifier Dout).

(2) The insertion of a low pass filter as in embodiment 6B can eliminate unnecessary high frequency components, reduce noise in the output from the variable frequency characteristic amplifier, and stabilize the gain control output level.

(3) The addition of circuit elements to discharge the capacitors Cp1, Cp2 that hold the charges of the peak-hold circuits PH1, PH2 as in embodiments 3A and 3B can improve the control response speed.

Embodiment 7B

Figure 42:
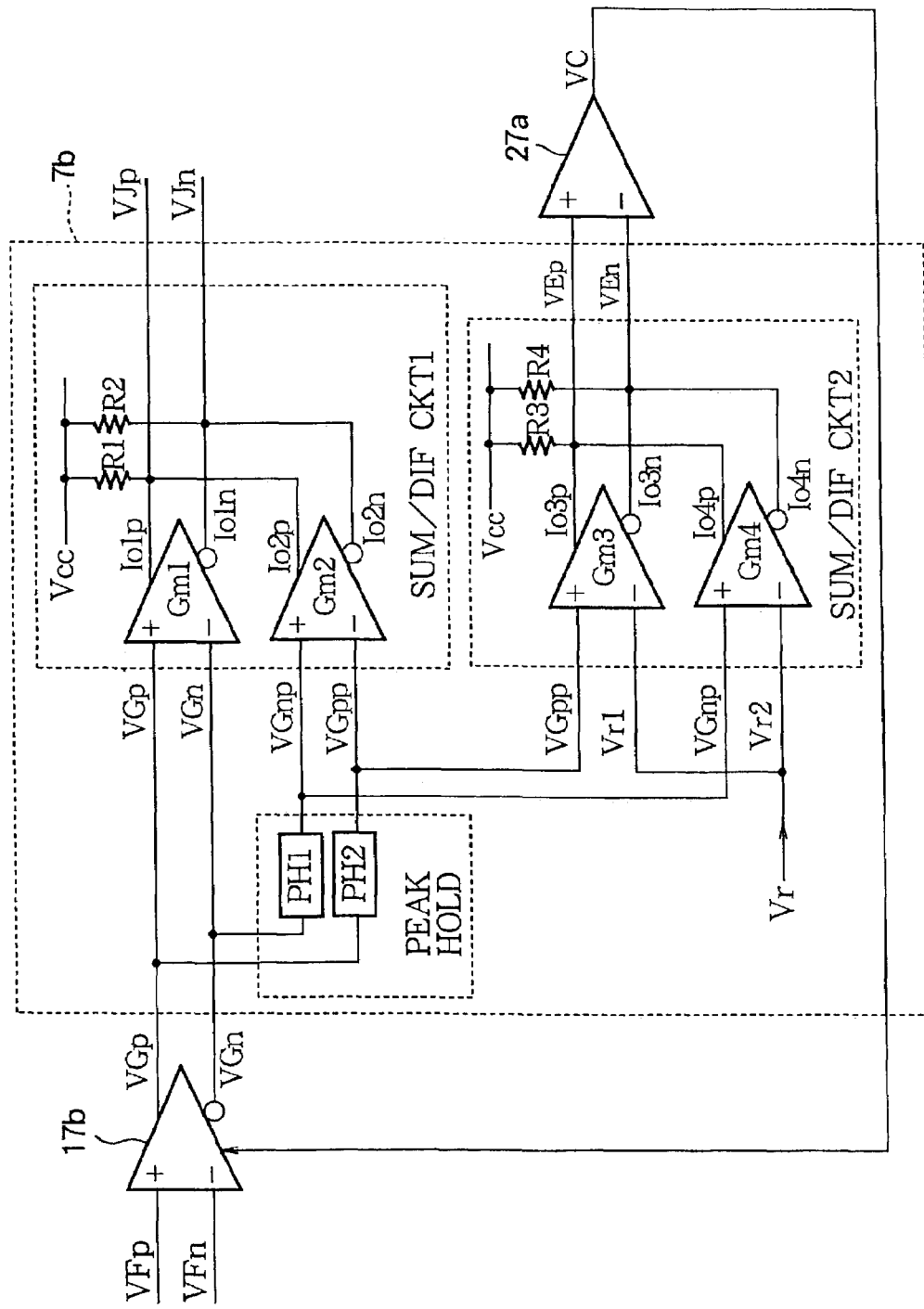
FIG. 42 shows the structure of a $\sqrt{f}$-AGC amplifier circuit according to embodiment 7B of the present invention.

FIG. 42 shows the general structure of the $\sqrt{f}$-AGC amplifier circuit in embodiment 7B, using the same reference characters as in FIG. 38, FIG. 37, or FIG. 5 for similar elements. This $\sqrt{f}$-AGC amplifier circuit comprises a variable frequency characteristic amplifier circuit including a variable frequency characteristic amplifier 17b, an amplitude detection circuit 7b, and an equalization characteristic control amplifier 27a. The amplitude detection circuit 7b has the same circuit configuration as the amplitude detection circuit 6d (FIG. 37) in embodiment 6D.

The difference between the $\sqrt{f}$-AGC amplifier circuit in embodiment 7A and the AGC amplifier circuit (FIG. 37) in embodiment 6D is that the variable gain amplifier 16b is replaced with a variable frequency characteristic amplifier 17b, and the gain control amplifier 26a is replaced with an equalization characteristic control amplifier 27a.

Figure 43:
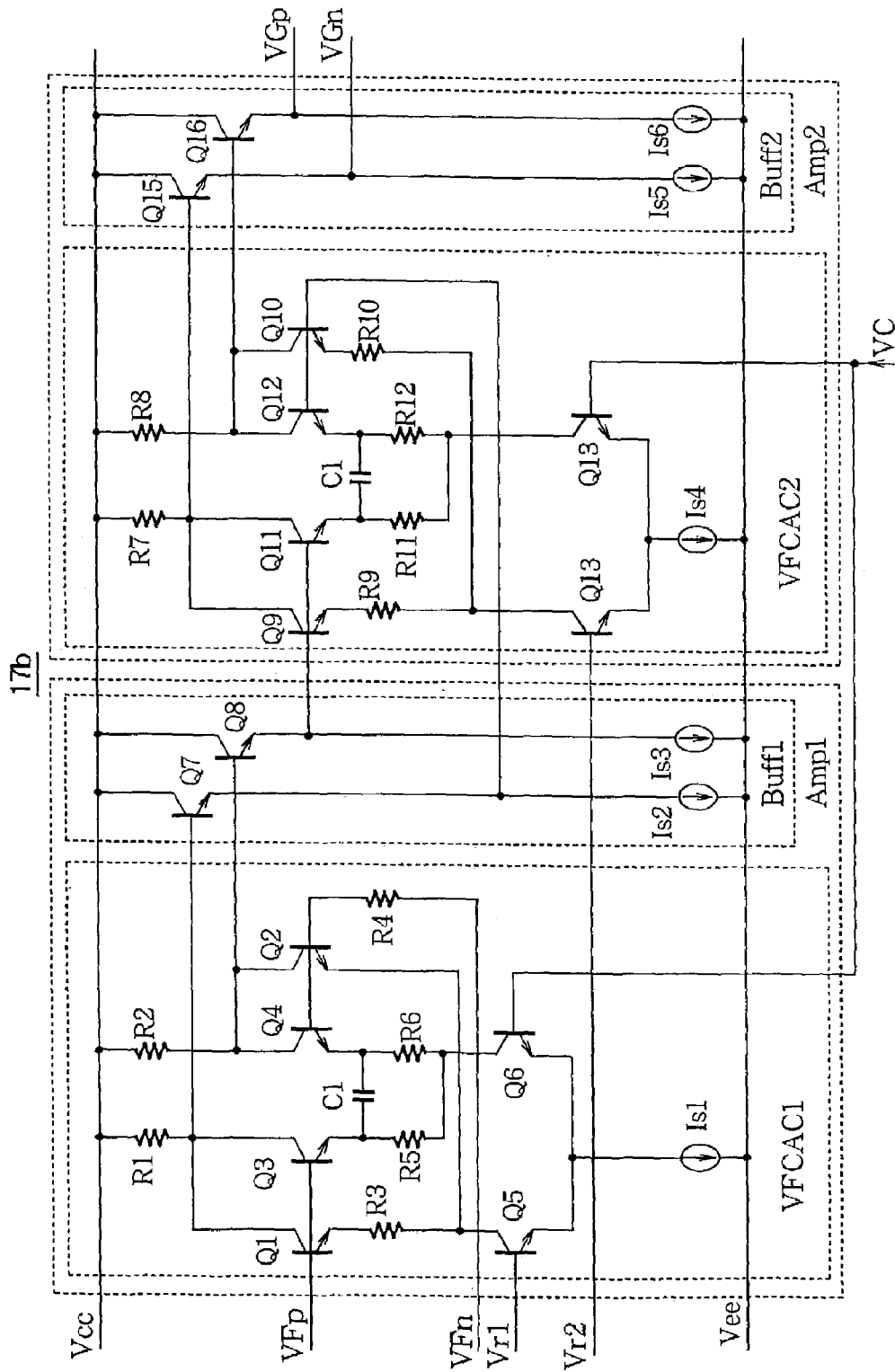
FIG. 43 is a circuit diagram of the variable frequency characteristic amplifier in FIG. 42.

FIG. 43 shows an example of the circuit configuration of the variable frequency characteristic amplifier 17b, which receives differential input voltages VFp, VFn and produces differential output voltages VGp, VGn amplified according to an externally controllable gain frequency characteristic. This amplifier 17b has two stages Amp1, Amp2, each comprising a variable frequency characteristic amplifier circuit (VFCAC1, VFCAC2) and a buffer circuit (Buff1, Buff2). Both stages Amp1, Amp2 have the same circuit topology. The use of this variable frequency characteristic amplifier 17b enables the differential output amplifier (Dout in FIG. 38) to be omitted.

As described above, embodiment 7B provides a $\sqrt{f}$-AGC amplifier circuit that can also compensate for dc offset in the differential output. The amplitude detection circuit 7b includes an analog summing and differencing circuit for offset compensation, which has the same circuit configuration as the offset compensator 1a in embodiment 1A (FIG. 5), and an analog summing and differencing circuit for amplitude detection, which has the same circuit configuration as the amplitude detection circuit 7a in embodiment 7A (FIG. 38). The two analog summing and differencing circuits share the peak-hold circuits PH1, PH2. Accordingly, only a single pair of peak-hold circuits is needed, as in embodiment 6D.

In the $\sqrt{f}$-AGC amplifier circuit in embodiment 7B, the frequency characteristic compensation function operates in the same way as embodiment 7A and the offset compensation function operates in the same way as in embodiment 1A, so detailed descriptions will be omitted.

Offset compensation can be implemented with a conventional offset compensator or one of the offset compensators 1b, 1c, 2a–3b in embodiments 1B–3B. Use of the offset compensator circuit configuration in embodiment 3A or 3B can improve the response speed of the variable frequency characteristic amplifier 17b.

As described above, embodiment 7B provides a $\sqrt{f}$-AGC amplifier circuit that can also compensate for dc offset in the differential output.

Embodiment 8

Figure 44:
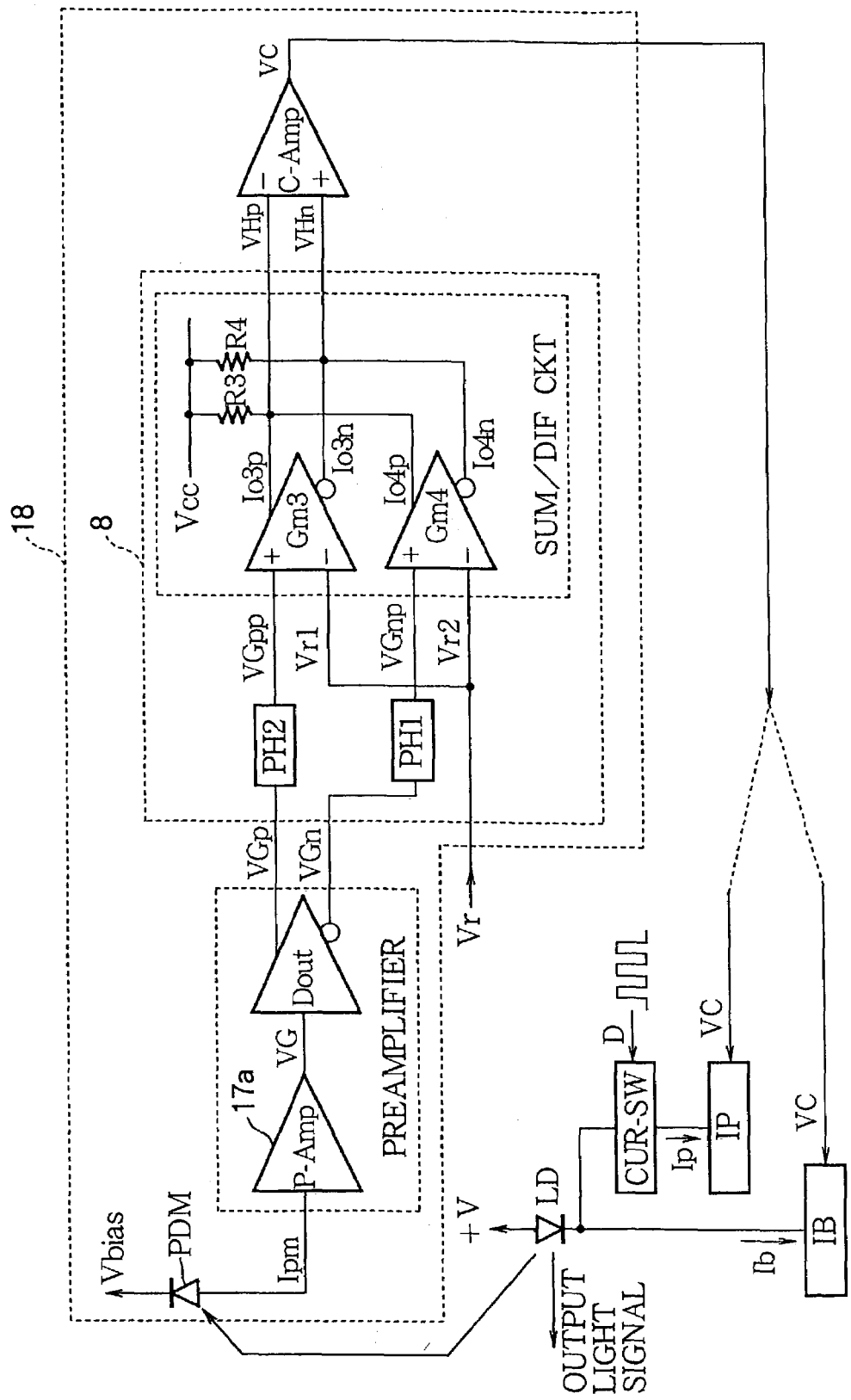
FIG. 44 shows the structure of an optical transmitter circuit according to embodiment 8 of the present invention.
Figure 59A:
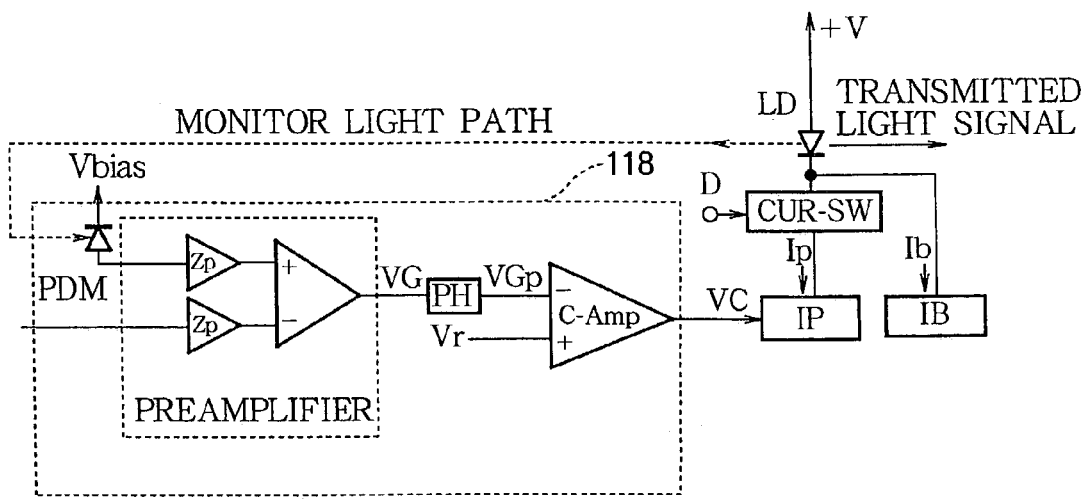
FIGS. 59A and 59B show examples of conventional optical transmitting circuits.
Figure 59B:
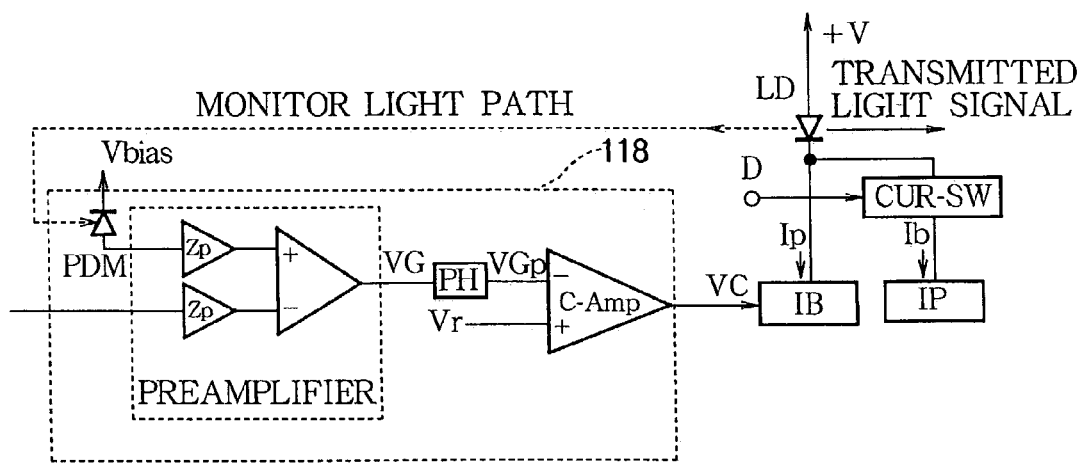
Figure 59C:
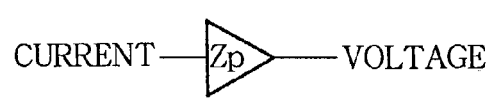
FIG. 59C illustrates the function of an impedance element.
Figure 60:
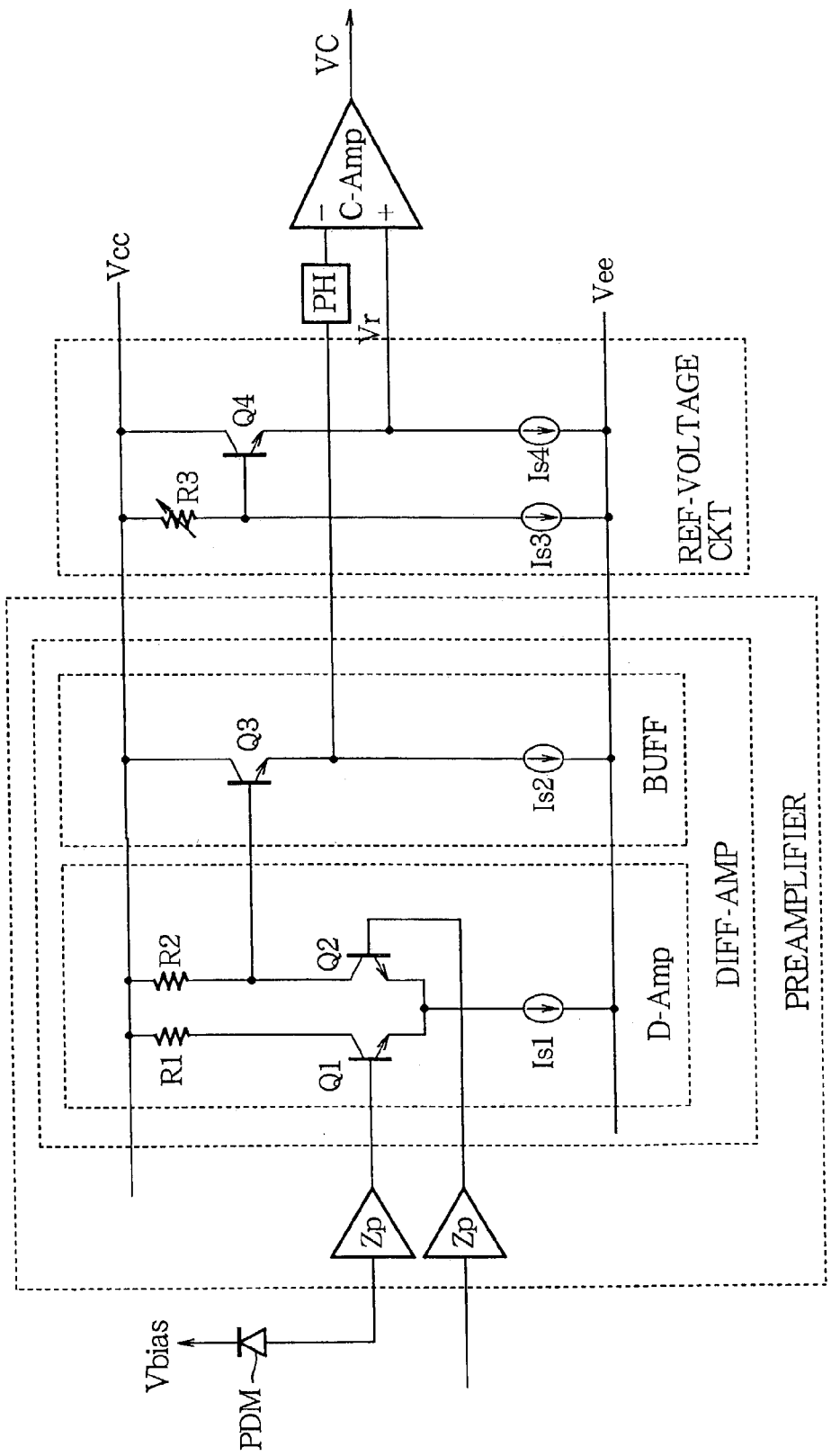
FIG. 60 is a circuit diagram of the light emission control circuit in FIGS. 59A and 59B.

FIG. 44 shows the general structure of the optical transmitter circuit in embodiment 8, using the same reference characters as in FIG. 31, FIG. 59A, or FIG. 59B for similar elements. This optical transmitter circuit comprises a light-emitting element (laser diode) LD, a switching circuit CUR-SW, driving current generating circuits IP, IB, and a light emission control circuit 18. The light emission control circuit 18 includes a monitor photodetector PDM, a preamplifier, a light emission control circuit 8, and a light emission control amplifier C-Amp.

As indicated by the dashed lines at the bottom of FIG. 44, this transmitting circuit may have either of two alternative configurations. In one configuration, the driving pulse current generating circuit IP generates a driving pulse current Ip according to a control voltage VC, and the driving bias current generating circuit IB feeds the light-emitting element LD a driving bias current Ib that is independent of the control voltage VC. In the other configuration, the driving pulse current generating circuit IP generates a driving pulse current Ip that is independent of the control voltage VC, and the driving bias current generating circuit IB feeds the light-emitting element LD a driving bias current Ib according to the control voltage VC. In both configurations, the switching circuit CUR-SW switches the driving pulse current Ip on and off according to a transmission data signal D, and outputs the switched driving pulse current Ip to the light-emitting element LD.

The light-emitting element LD emits light according to the driving pulse current Ip and driving bias current Ib, and transmits an optical signal. The monitor photodetector PDM converts a monitor light signal received from the light-emitting element LD to a monitor current signal Ipm.

The preamplifier includes a receiving preamplifier P-Amp and a differential output amplifier Dout. The receiving preamplifier P-Amp, which has single-ended input and output, converts the monitor current signal Ipm to a voltage VG. The differential output amplifier Dout converts the voltage VG to differential voltages VGp, VGn.

The light emission control circuit 8 has the same circuit configuration as the amplitude detection circuit 6a (FIG. 31) in embodiment 6A, including a pair of peak-hold circuits PH1, PH2, a pair of amplifiers Gm3, Gm4 with differential voltage input and differential current output, and a pair of resistors R3, R4.

Figure 45:
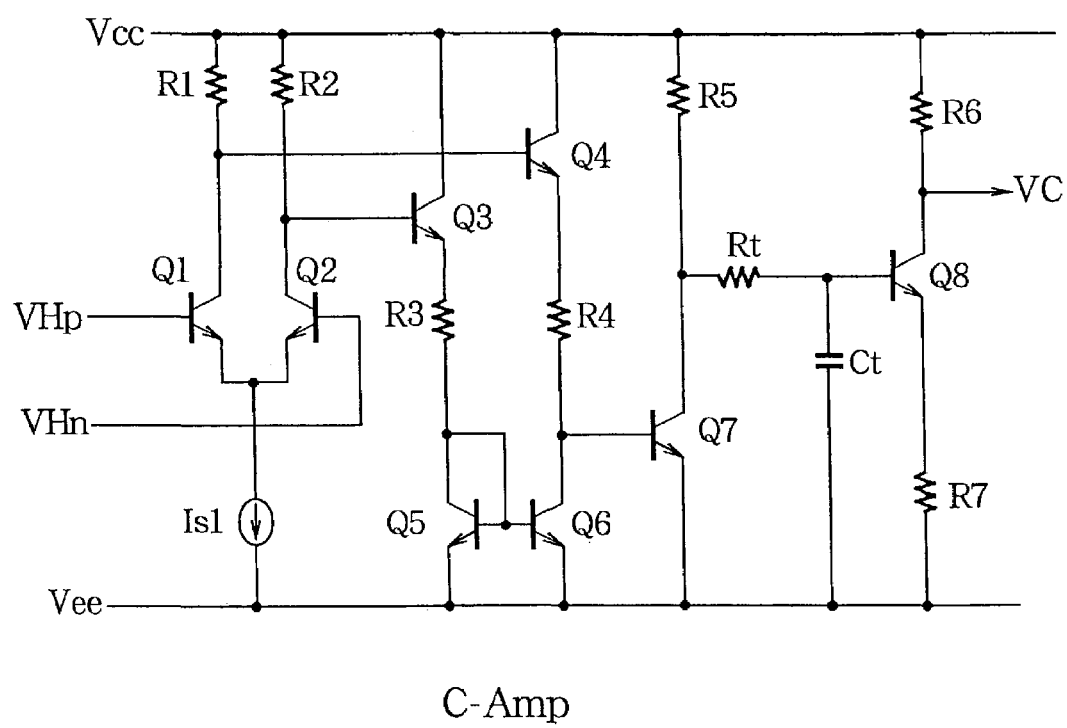
FIG. 45 is a circuit diagram of the light emission control amplifier in FIG. 44.

FIG. 45 shows an example of the circuit configuration of the light emission control amplifier C-Amp. The light emission control amplifier compares the peak value VGp with a reference voltage Vr and varies the light emission control voltage VC so as to decrease the driving pulse current Ip or driving bias current Ib if VGp is greater than Vr, or increase the driving pulse current Ip or driving bias current Ib if VGp is less than Vr.

The monitor photodetector PDM receives the monitor light signal from the light-emitting element LD and converts the received monitor light signal to the monitor current signal Ipm. The preamplifier converts the monitor current signal Ipm to the differential voltages VGn, VGp. Peak-hold circuits PH1, PH2 sense the peak values of the differential voltages VGn, VGp and output the peak values VGnp, VGpp.

The monitor current Ipm is the sum of the monitor light signal current from the light-emitting element LD and a leakage current, but as in embodiment 6A, the value of the sum voltage of the peak voltages VGnp, VGpp is proportional to the amplitude value of the differential voltages VGn, VGp output from the preamplifier, that is, the amplitude value of the monitor light signal output from the light-emitting element LD. The voltage effect of the leakage current component is compensated for and removed, as is the offset voltage of the preamplifier.

If the sum voltage of the peak voltages VGnp, VGpp is greater (or smaller) than the reference voltages Vr1, Vr2, the light emission control amplifier varies the light emission control voltage VC so as to decrease (or increase) the current Ip output from the driving pulse current generating circuit IP or the current Ib output from the driving bias current generating circuit IB. The amplitude of the optical signal obtained from the light-emitting element LD is thereby held constant.

If a monitor circuit to monitor the increase of the driving pulse current Ip or driving bias current Ib is added, degradation of the light-emitting element (laser diode) LD can be also detected. A low pass filter can be inserted in the circuit configuration of embodiment 8, as in embodiment 6B (FIG. 34), to reject unwanted high frequency noise, thus further improving the accuracy of light emission control. Resistors Rp1, Rp2 or constant-current sources Ip1, Ip2 can be added to discharge the capacitors Cp1, Cp2 of the peak-hold circuits PH1, PH2 in embodiment 8, as in embodiment 6C (FIG. 36), thereby improving the control response speed.

As described above, embodiment 8 has the following effects regarding an optical transmitter circuit.

(1) Even if the monitor photodetector PDM generates leakage current and the outputs of the differential output preamplifier have an offset voltage, these effects can be canceled and the light emission can be controlled so as to maintain a constant amplitude in the optical signal output from the light-emitting element LD.

(2) Effect (1) enables the use of a monitor photodetector PDM with leakage current, and a differential output preamplifier with a large offset voltage.

(3) By monitoring the increase of the current Ip output from the driving pulse current generating circuit IP or current Ib output from the driving bias current generating circuit IB, degradation of the light-emitting element LD can be detected accurately.

(4) A receiving preamplifier with capacitive coupling can be used, which is likely to lead to a simple circuit configuration and low power consumption.

Embodiments 9A, 9B

Figure 46:
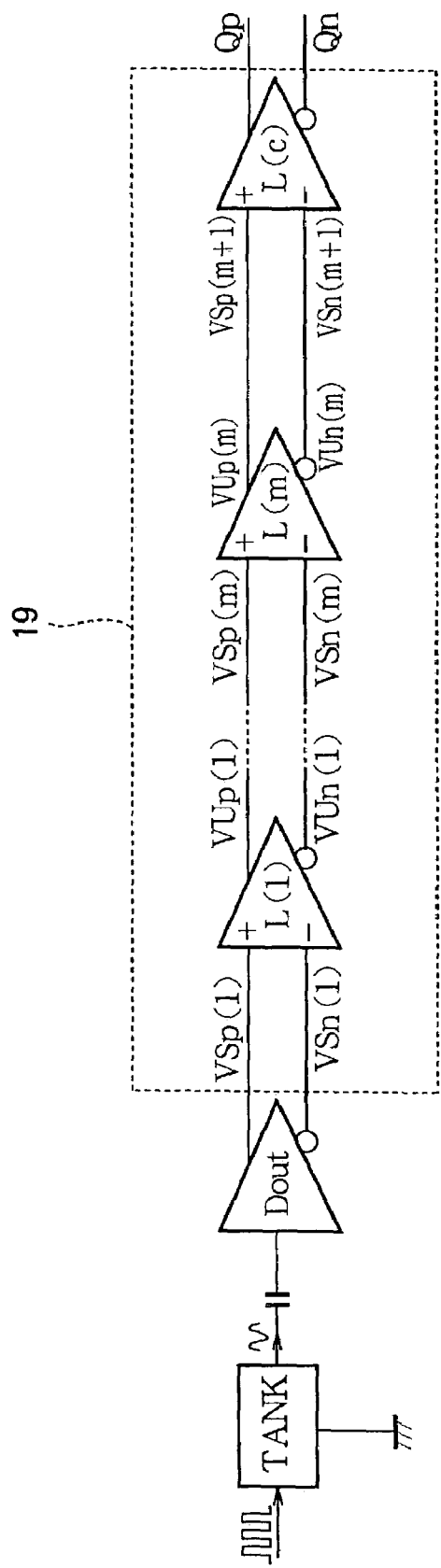
FIG. 46 shows the general structure of a limiting amplifier circuit including a limiting amplifier (or a limiting comparator) according to embodiment 9A or 9B of the present invention.
Figure 61:
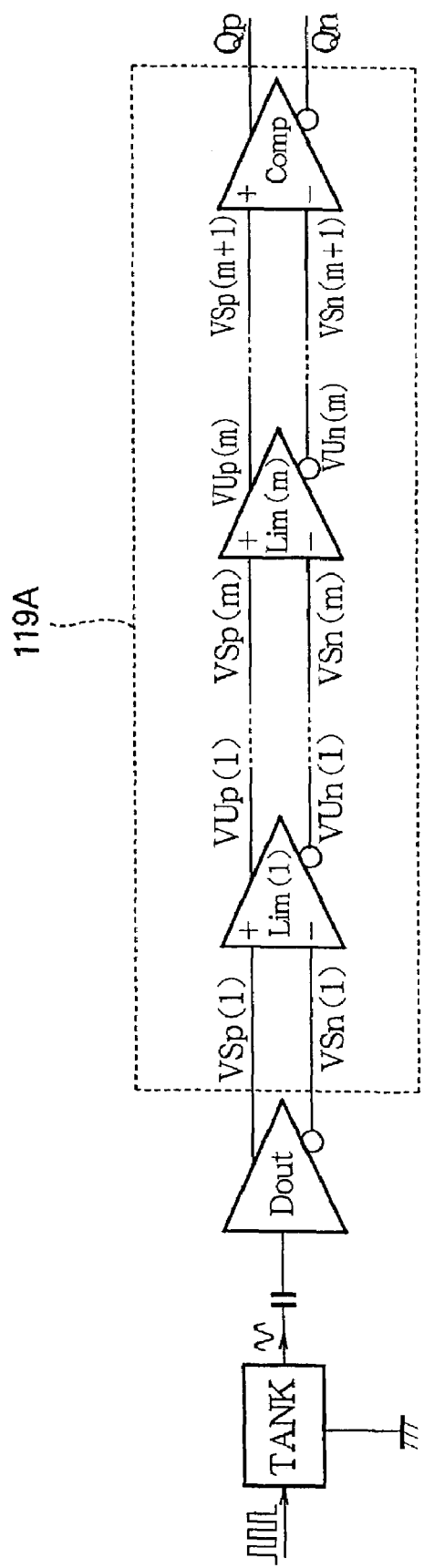
FIG. 61 shows the general structure of a conventional limiting amplifier circuit forming part of a clock recovery circuit.

FIG. 46 shows the general structure of a limiting amplifier circuit including a limiting amplifier (or a limiting comparator) according to embodiment 9A or 9B, using the same reference characters as in FIG. 61 for similar elements. This limiting amplifier circuit 19, which forms part of a clock recovery circuit, includes m limiting amplifiers L(1) to L(m) (where m is an integer equal to or greater than one), and a limiting comparator L(c). The limiting amplifiers L(1) to L(m) include respective differential amplifiers similar to the amplifiers Lim(1) to Lim(m) in FIG. 61; the limiting comparator L(c) includes a comparator similar to the comparator Comp in FIG. 61.

The limiting amplifiers L(1) to L(m) in embodiments 9A and 9B also include an offset compensator. The offset compensator compensates for dc offset in a pair of differential voltages VSp, VSn and outputs a positive differential voltage VTp and a negative differential voltage VTn. The differential amplifier Lim amplifies and limits the offset-compensated differential voltages VTp, VTn and outputs a positive differential voltage VUp and a negative differential voltage VUn. The offset compensator includes a pair of averaging circuits Me1, Me2, and a summing and differencing circuit. The averaging circuit Me1 outputs a mean negative voltage VSnm by detecting the mean value of the negative differential voltage VSn; the averaging circuit Me2 outputs a mean positive voltage VSpm by detecting the mean value of the positive differential voltage VSp. The analog summing and differencing circuit compensates for dc offset in the differential voltages VSp, VSn and outputs an offset-compensated positive differential voltage VTp and negative differential voltage VTn by appropriate addition and subtraction of the differential voltages VSp, VSn and the average voltages VSpm, VSnm.

For brevity, indices (1) to (m) have been omitted after signal names VSp, VSn, etc. in the preceding paragraph.

The limiting comparator in embodiments 9A and 9B includes an offset compensator and the conventional comparator Comp. The offset compensator has the same circuit configuration as the offset compensators in the limiting amplifiers. The comparator Comp compares the offset-compensated differential voltage VTp with the offset-compensated differential voltage VTn, and converts VTp and VTn to logic signals.

The difference between the offset compensator in the limiting amplifier or the limiting comparator in embodiments 9A and 9B and a conventional offset compensator or one of the offset compensators 1a–1c in embodiments 1A–1C is that the peak-hold circuits PH1, PH2 are replaced with the averaging circuits Me1, Me2.

The limiting amplifier or limiting comparator in embodiments 9A and 9B is included in one or more than one of the limiting amplifiers L(1)–L(m) or the limiting comparator in FIG. 46.

Embodiment 9A

Figure 47:
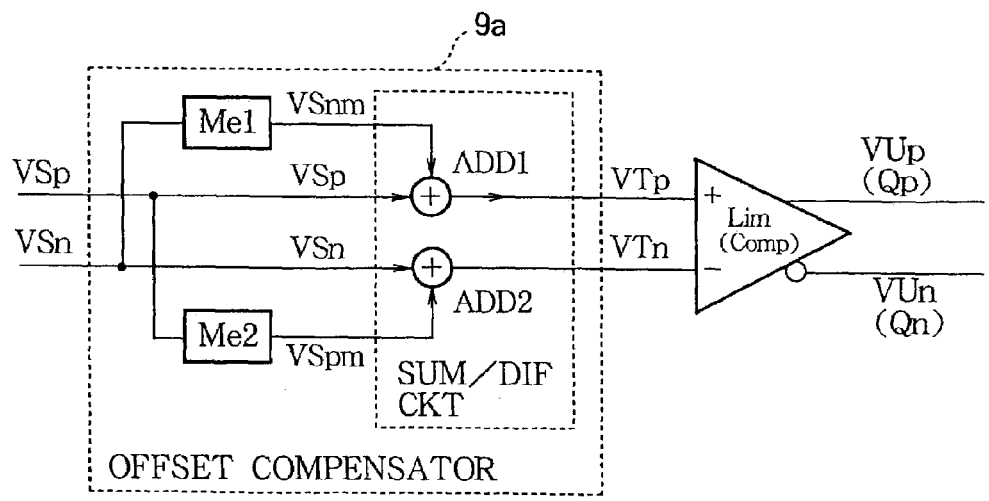
FIG. 47 shows the structure of a limiting amplifier (or limiting comparator) according to embodiment 9A.
Figure 49:
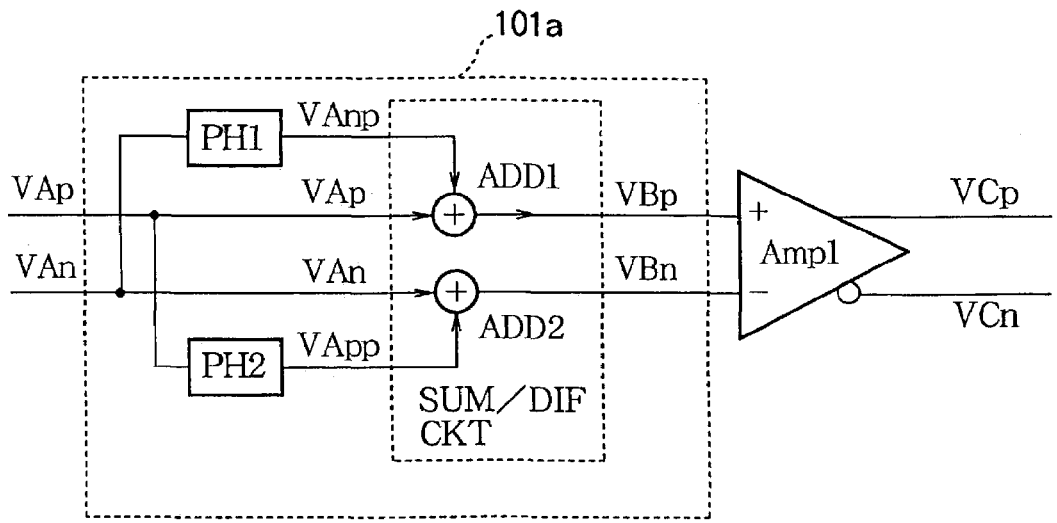
FIG. 49 shows the structure of a conventional main amplifier described in U.S. Pat. No. 5,612,810.
Figure 50:
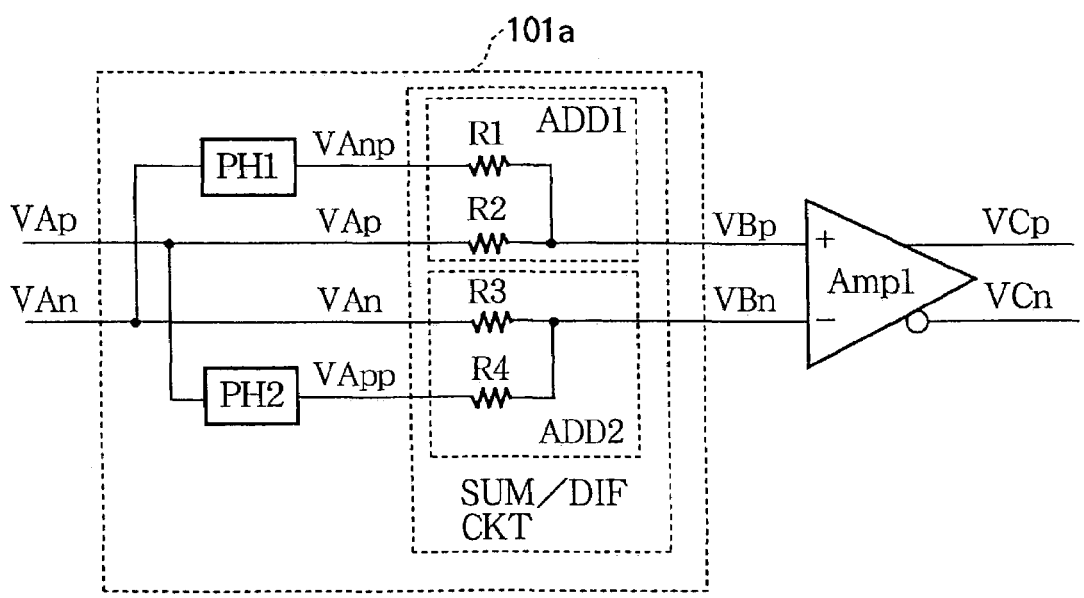
FIG. 50 is a circuit diagram showing an example of the offset compensator in FIG. 49.
Figure 51:
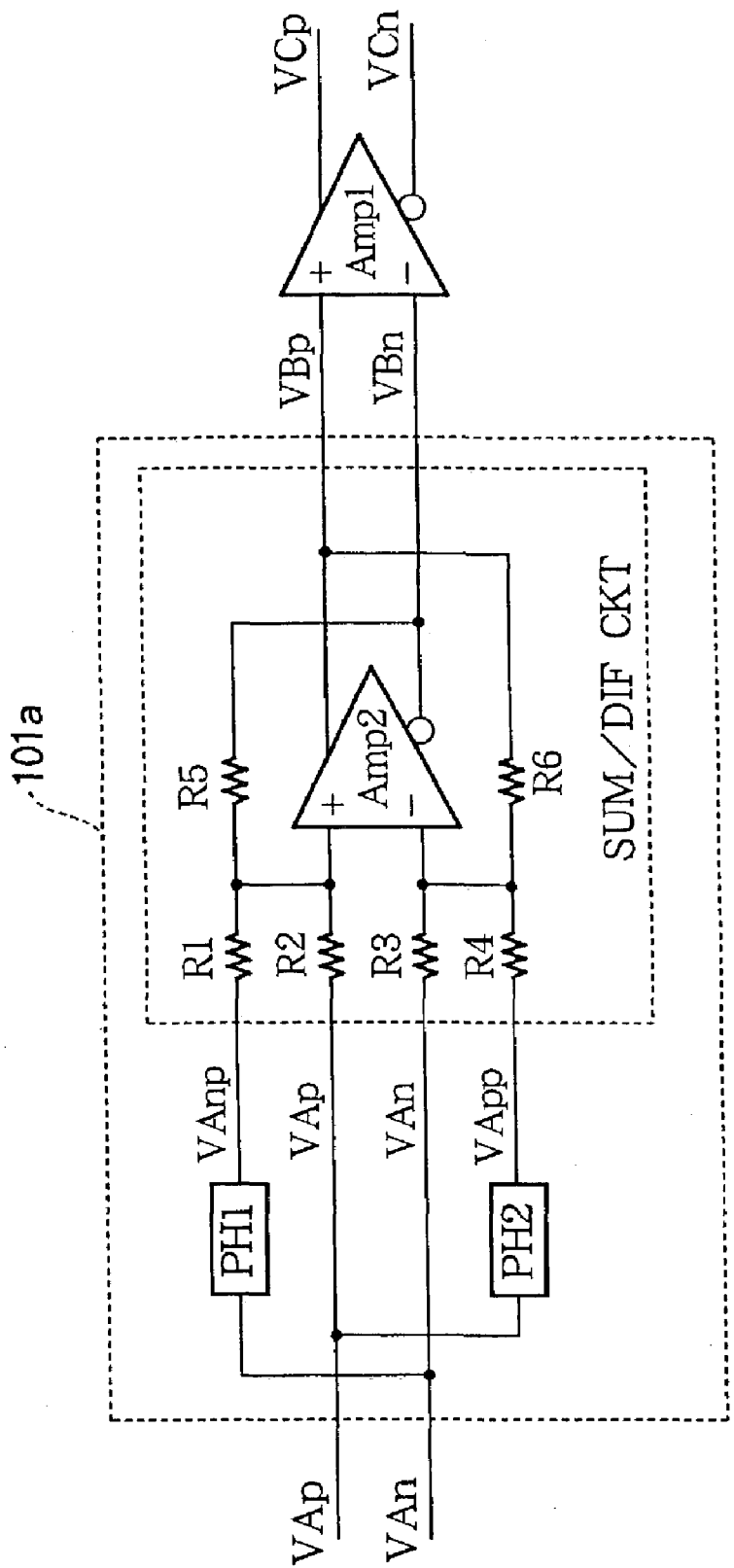
FIG. 51 is a circuit diagram showing another example of the offset compensator in FIG. 49.

FIG. 47 shows the general structure of the limiting amplifier (or limiting comparator) in embodiment 9A, using the same reference characters as in FIG. 49 or FIG. 61 for similar elements. This limiting amplifier (or limiting comparator) includes an offset compensator 9a comprising an analog summing and differencing circuit (SUM/DIF), and a differential amplifier Lim (or comparator Comp). The offset compensator 9a includes a pair of averaging circuits Me1, Me2, and a pair of adders ADD1, ADD2 that constitute the summing and differencing circuit.

As noted above, the difference between the offset compensator 9a in embodiment 9A and a conventional offset compensator 101a (FIG. 49) is that the peak-hold circuits PH1, PH2 are replaced by averaging circuits Me1, Me2.

Averaging circuit Me1 outputs a mean value VSnm by detecting the mean value of the negative differential voltage VSn; averaging circuit Me2 outputs a mean value VSpm by detecting the mean value of the positive differential voltage VSp.

Adder ADD1 adds the positive differential voltage VSp and the mean value VSnm and outputs an offset-compensated positive differential voltage VTp; adder ADD2 adds the negative differential voltage VSn and the mean value VSpm and outputs an offset-compensated negative differential voltage VTn.

In a limiting amplifier, the differential amplifier Lim amplifies and limits the offset-compensated differential voltages VTp, VTn, and outputs a positive differential voltage VUp and a negative differential voltage VUn. In a limiting comparator, the comparator Comp compares the offset-compensated differential voltage VTp with the offset-compensated differential voltage VTn, and converts VTp and VTn to logic signals Qp and Qn.

The conventional offset compensator 101a or one of the offset compensators 1a–1c in embodiments 1A–1C compensates for dc offset in a differential input voltage, which has a constant amplitude but in which the duty cycle (the high-to-low duration ratio) varies, but the offset compensator 9a in embodiment 9A compensates for dc offset in differential input voltages VSp, VSn having a continuously varying amplitude but a constant duty cycle (a high-to-low duration ratio of 1:1).

In differential input voltages, such as VSp, VSn, which have a constant high-to-low duration ratio (1:1), the offset component is the difference between the mean value VSpm of the positive voltage VSp and the mean value VSnm of the negative voltage VSn, not the difference between the peak values. Accordingly, to compensate for dc offset in the differential input voltages VSp, VSn, the peak-hold circuits PH1, PH2 are replaced by the averaging circuits Me1, Me2.

If the input to the differential amplifier Lim has a large amplitude, and the differential amplifier Lim operates as a switching element, the '1' and '0' duty cycle of the output is degraded by the difference between the risetime characteristic and falltime characteristic of the differential amplifier Lim, so the difference between the mean values cannot be regarded as an offset component. In this case, however, since the input itself has a large amplitude, the effect of dc offset can be ignored.

Figure 62:
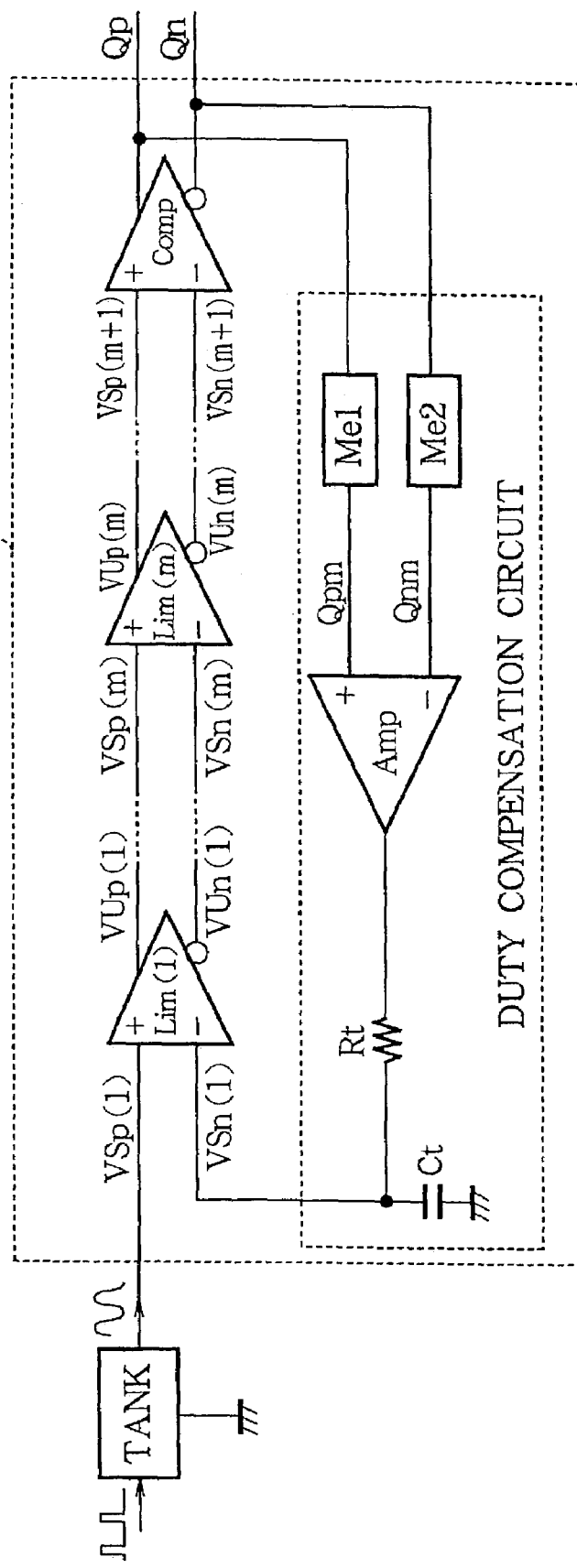
FIG. 62 shows the general structure of another conventional limiting amplifier circuit forming part of a clock recovery circuit.
Figure 63:
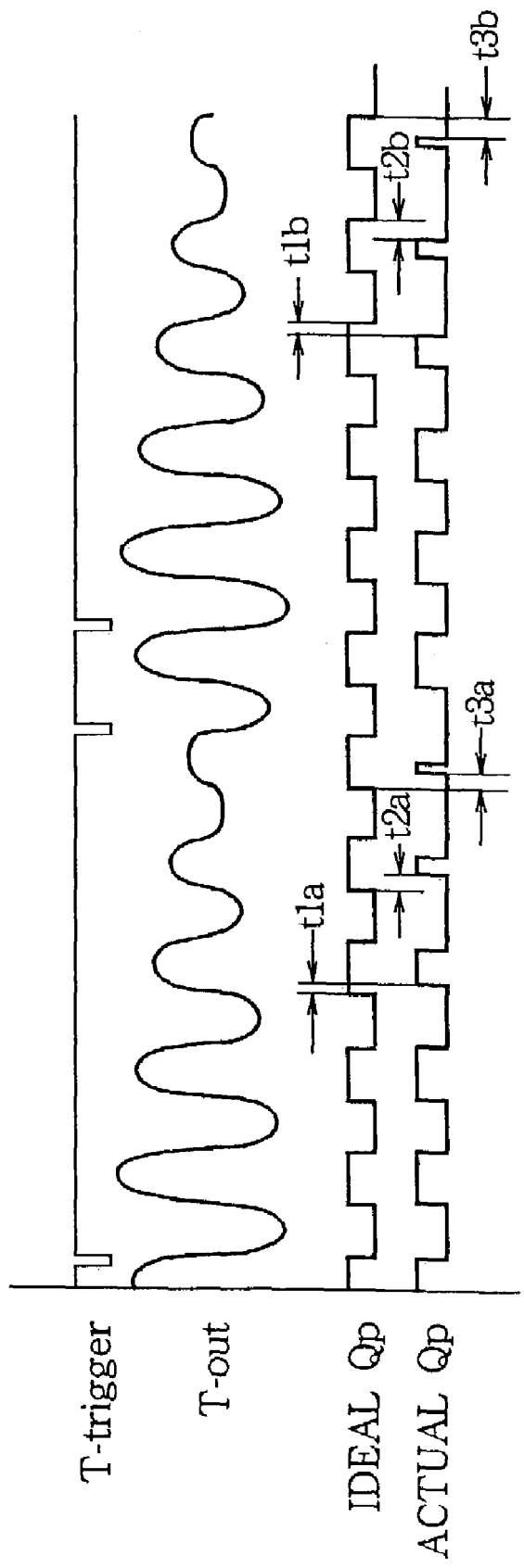
FIG. 63 shows signal waveforms in the clock recovery circuit in FIG. 61.

A limiting amplifier circuit which includes the limiting amplifier or the limiting compensator according to embodiment 9A or 9B does not use feedback as shown in the conventional limiting amplifier circuit 119B (FIG. 62), so a constant '1' to '0' ratio (1:1) can be continuously maintained in the output as the input ranges from a small amplitude to a large amplitude.

Embodiment 9A accordingly enables the realization of a limiting amplifier circuit that can continuously maintain a constant '1' to '0' output duration ratio (1:1) regardless of whether the input amplitude is large or small.

Embodiment 9B

Figure 48:
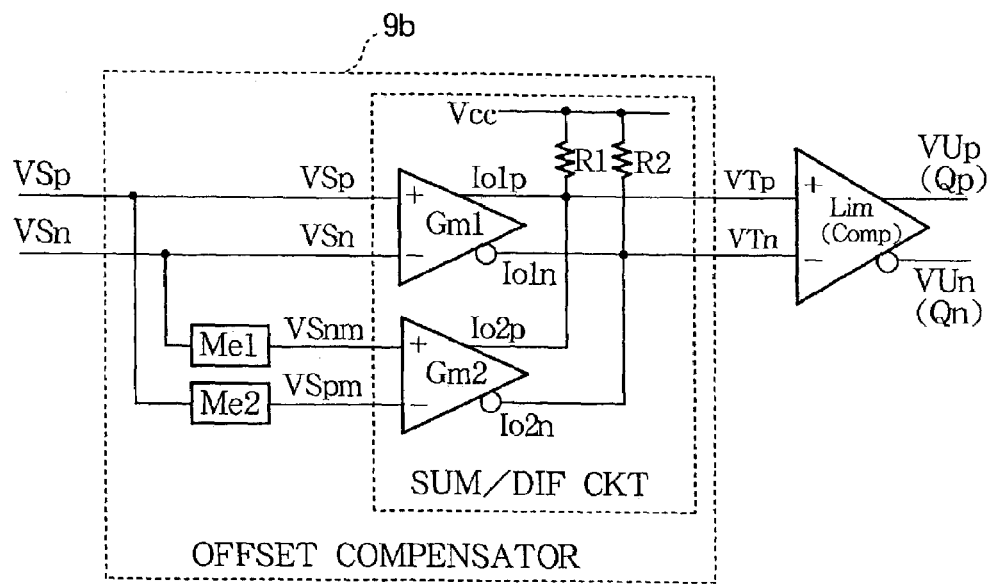
FIG. 48 shows the structure of a limiting amplifier (or limiting comparator) according to embodiment 9B.

FIG. 48 shows the general structure of the limiting amplifier (or limiting compensator) in embodiment 9B, using the same reference characters as in FIG. 47 or FIG. 5 for similar elements. This limiting amplifier (or limiting compensator) includes an offset compensator 9b comprising an analog summing and differencing circuit, and a differential amplifier Lim (or comparator Comp). The offset compensator 9b includes a pair of averaging circuits Me1, Me2, and a summing and differencing circuit. This analog summing and differencing circuit has the same circuit configuration as the analog summing and differencing circuit in embodiment 1A.

As noted above, the difference between the offset compensator 9b in embodiment 9B and the offset compensator 1a (FIG. 5) in embodiment 1A is that the peak-hold circuits PH1, PH2 are replaced by the averaging circuits Me1, Me2.

As in embodiment 9A, embodiment 9B enables the realization of a limiting amplifier circuit that can continuously maintain a constant '1' to '0' output duration ratio (1:1) over a wide range of input amplitudes.

It is also possible to replace the peak-hold circuits PH1, PH2 in the offset compensators 101a–101c in the conventional main amplifiers shown in FIGS. 50–55 with averaging circuits Me1, Me2, and still obtain dc offset compensation.

Those skilled in the art will recognize that further variations in embodiments 9A and 9B and the other embodiments described above are possible within the appended claims defining the scope of the invention.

What is claimed is:

1. An analog circuit for receiving a differential pair of input signals and compensating for a direct-current offset therein, the differential pair of input signals including a first input signal and a second input signal with mutually opposite phases, the analog circuit comprising:

a first peak-hold circuit receiving the first input signal and generating a first peak signal indicating a peak value of the first input signal;

a second peak-hold circuit receiving the second input signal and generating a second peak signal indicating a peak value of the second input signal;

a first differencing circuit receiving the first input signal and the second input signal and generating a first difference signal indicating an algebraic difference between the first input signal and the second input signal;

a second differencing circuit receiving the first peak signal and the second peak signal and generating a second difference signal indicating an algebraic difference between the first peak signal and the second peak signal;

a first combining circuit for additively combining the first difference signal and the second difference signal, wherein the first differencing circuit includes a first amplifier receiving the first and second input signals as differential voltage inputs, and having a first output terminal and a second output terminal for differential current output, the first difference signal being provided from the first output terminal, the second differencing circuit includes a second amplifier receiving the first and second peak signals as differential voltage inputs, and having a first output terminal and a second output terminal for differential current output, the second difference signal being provided from the first output terminal of the second differencing circuit, and the first combining circuit includes a first resistor having one terminal coupled to the first output terminals of the first and second amplifiers, for generating a first voltage output signal responsive to a sum of the first and second difference signals; and a second combining circuit including a second resistor having one terminal coupled to the second output terminals of the first and second amplifiers, for generating a second voltage output signal opposite in phase to the first voltage output signal.

2. A main amplifier including the analog circuit of claim 1 and a differential amplifier, the differential amplifier receiving the first and second voltage output signals from said analog circuit and generating a differential pair of amplified voltage output signals.

3. An optical signal receiving circuit having a cascaded series of n main amplifiers, n being a positive integer, at least one of the n main amplifiers being the main amplifier of claim 2, comprising:

a receiving element for receiving an optical signal and converting the optical signal to a current signal;

a preamplifier for converting the current signal from the receiving element to a differential pair of input signals for input to the cascaded series of n main amplifiers; and a level discrimination circuit for comparing a final differential pair of amplified voltage output signals output from the cascaded series of n main amplifiers and generating a logic signal.

4. The analog circuit of claim 1, further comprising:

a third amplifier receiving the first peak signal and a first reference signal as differential voltage inputs and having a first output terminal and a second output terminal for differential current output;

a fourth amplifier receiving the second peak signal and a second reference signal as differential voltage inputs and having a first output terminal and a second output terminal for differential current output;

a third resistor having one terminal coupled to the first output terminals of the third and fourth amplifiers, for generating a third voltage output signal; and a fourth resistor having one terminal coupled to the second output terminals of the third and fourth amplifiers, for generating a fourth voltage output signal opposite in phase to the third voltage output signal.

5. An automatic gain control (AGC) amplifier including the analog circuit of claim 4, comprising:

a variable gain amplifier for amplifying an input voltage with a gain determined by a control signal, thereby generating the first and second input signals received by said analog circuit; and a gain control amplifier receiving the third and fourth voltage output signals from said analog circuit and generating the control signal.

6. The AGC amplifier of claim 5, further comprising a low pass filter for filtering the first and second input signals received by said analog circuit.

7. An automatic frequency compensation amplifier including the analog circuit of claim 4, comprising:
- a variable frequency characteristic amplifier for amplifying an input voltage with a frequency-dependent gain characteristic determined by a control signal, thereby generating the first and second input signals received by said analog circuit; and
- an equalization characteristic control amplifier receiving the third and fourth voltage output signals from said analog circuit and generating the control signal.

8. A light emission control circuit including the analog circuit of claim 4, comprising:
- a receiving element for receiving a monitor light signal and converting the monitor light signal to a current signal;
- a preamplifier for converting the current signal from the receiving element to the first and second input signals received by said analog circuit; and
- a light emission control amplifier receiving the third and fourth voltage output signals from said analog circuit and generating a control signal.

9. An optical transmitter including the light emission control circuit of claim 8, comprising:
- a driving current generating circuit generating a driving current according to the control signal output from said light emission control circuit; and
- a light-emitting element emitting the monitor light signal according to the driving current.

10. An analog circuit for receiving a differential pair of input signals and compensating for a direct-current offset therein, the differential pair of input signals including a first input signal and a second input signal with mutually opposite phases, the analog circuit comprising:
- a first peak-hold circuit receiving the first input signal and generating a first peak signal indicating a peak value of the first input signal;
- a second peak-hold circuit receiving the second input signal and generating a second peak signal indicating a peak value of the second input signal;
- a first differencing circuit receiving the first input signal and the second input signal and generating a first difference signal indicating an algebraic difference between the first input signal and the second input signal;
- a second differencing circuit receiving the first peak signal and the second peak signal and generating a second difference signal indicating an algebraic difference between the first peak signal and the second peak signal; and
- a first combining circuit for additively combining the first difference signal and the second difference signal,
- wherein the first differencing circuit includes a first amplifier receiving the first and second input signals as differential voltage inputs and generating a first single-ended voltage signal,
- the second differencing circuit includes a second amplifier receiving the first and second peak signals as differential voltage inputs and generating a second single-ended voltage signal, and
- the first combining circuit includes a differential amplifier receiving the first and second single-ended voltage signals.

11. The analog circuit of claim 10, further comprising a low pass filter for filtering the second single-ended signal.

12. An analog circuit for receiving a differential pair of input signals and compensating for a direct-current offset therein, the differential pair of input signals including a first input signal and a second input signal with mutually opposite phases, the analog circuit comprising:
- a first low pass filter filtering the first input signal and generating a first filtered signal;
- a first peak-hold circuit receiving the first filtered signal from the low pass filter and generating a first peak signal indicating a peak value of the first filtered signal;
- a second peak-hold circuit receiving the second input signal and generating a second peak signal indicating a peak value of the second input signal; and
- an analog summing and differencing circuit for additively combining the first input signal, the second input signal, the first peak signal, and the second peak signal to generate an offset-compensated differential pair of voltage output signals.

13. The analog circuit of claim 12, further comprising a second low pass filter filtering the second input signal for input to the second peak-hold circuit.

14. A main amplifier including the analog circuit of claim 12 and a differential amplifier, the differential amplifier receiving the first and second voltage output signals from said analog circuit and generating a differential pair of amplified voltage output signals.

15. An optical signal receiving circuit having a cascaded series of n main amplifiers, n being a positive integer, at least one of the n main amplifiers being the main amplifier of claim 14, comprising:
- a receiving element for receiving an optical signal and converting the optical signal to a current signal;
- a preamplifier for converting the current signal from the receiving element to a differential pair of input signals for input to the cascaded series of n main amplifiers; and
- a level discrimination circuit for comparing a final differential pair of amplified voltage output signals output from the cascaded series of n main amplifiers and generating a logic signal.

16. An analog circuit for receiving a differential pair of input signals and compensating for a direct-current offset therein, the differential pair of input signals including a first input signal and a second input signal with mutually opposite phases, the analog circuit comprising:
- a first peak-hold circuit receiving the first input signal and generating a first peak signal indicating a peak value of the first input signal, the first peak-hold circuit including a first capacitor for holding the peak value of the first input signal and a first discharging circuit for discharging the first capacitor;
- a second peak-hold circuit receiving the second input signal and generating a second peak signal indicating a peak value of the second input signal, the second peak-hold circuit including a second capacitor for holding the peak value of the second input signal and a second input discharging circuit for discharging the second capacitor; and
- an analog summing and differencing circuit for additively combining the first input signal, the second input signal, the first peak signal, and the second peak signal to generate an offset-compensated differential pair of voltage output signals.

17. The analog circuit of claim 16, wherein the first discharging circuit and the second discharging circuit comprise respective discharge paths with respective resistors inserted therein.

18. The analog circuit of claim 16, wherein the first discharging circuit and the second discharging circuit comprise respective constant-current sources.

19. The analog circuit of claim 16, wherein the analog summing and differencing circuit comprises:

a first amplifier receiving the first and second input signals as differential voltage inputs and having a first output terminal and a second output terminal for differential current output;

a second amplifier receiving the first and second peak signals as differential voltage inputs and having a first output terminal and a second output terminal for differential current output;

a first resistor having one terminal coupled to the first output terminals of the first and second amplifiers, for generating a first voltage output signal; and a second resistor having one terminal coupled to the second output terminals of the first and second amplifiers, for generating a second voltage output signal opposite in phase to the first voltage output signal, the first voltage output signal and the second voltage output signal constituting said offset-compensated differential pair of voltage output signals.

20. The analog circuit of claim 16, wherein the analog summing and differencing circuit comprises:

a first amplifier receiving the first input signal and the first peak signal as differential voltage inputs and having a first output terminal and a second output terminal for differential current output;

a second amplifier receiving the second input signal and the second peak signal as differential voltage inputs and having a first output terminal and a second output terminal for differential current output;

a first resistor having one terminal coupled to the first output terminals of the first and second amplifiers, for generating a first voltage output signal; and a second resistor having one terminal coupled to the second output terminals of the first and second amplifiers, for generating a second voltage output signal opposite in phase to the first voltage output signal.

21. The analog circuit of claim 16, wherein the first and second input signals have a maximum run duration of identical information, the first and second input signals have a first time constant of direct-current level variation, and the first and second discharging circuits have a second time constant for discharging the first and second capacitors, the second time constant being greater than the maximum run duration and less than the first time constant.

* * * * *